United States Patent
Noda et al.

(10) Patent No.: US 6,807,077 B2
(45) Date of Patent: Oct. 19, 2004

(54) CONTENT ADDRESSABLE MEMORY CAPABLE OF STABLY STORING TERNARY DATA

(75) Inventors: Hideyuki Noda, Hyogo (JP); Hiroki Shimano, Hyogo (JP)

(73) Assignee: Renesas Technology Corp., Tokyo (JP)

(*) Notice: Subject to any disclaimer, the term of this patent is extended or adjusted under 35 U.S.C. 154(b) by 0 days.

(21) Appl. No.: 10/442,986

(22) Filed: May 22, 2003

(65) Prior Publication Data

US 2004/0114411 A1 Jun. 17, 2004

(30) Foreign Application Priority Data

Dec. 13, 2002 (JP) ........................................ 2002-362627

(51) Int. Cl.[7] .............................................. G11C 15/00
(52) U.S. Cl. ........................................ 365/49; 365/129
(58) Field of Search ................................... 365/49, 129

(56) References Cited

U.S. PATENT DOCUMENTS

| 5,319,589 A | 6/1994 | Yamagata et al. ............. 365/49 |
| 6,320,777 B1 | 11/2001 | Lines et al. ................... 365/49 |
| 6,704,216 B1 * | 3/2004 | Cheng et al. ................. 365/49 |

* cited by examiner

*Primary Examiner*—M. Tran
(74) *Attorney, Agent, or Firm*—McDermott Will & Emery LLP

(57) ABSTRACT

A data storage unit of a ternary content addressable memory (TCAM) cell is constructed by two twin cells each having DRAM cells of two bits, and complementary data are stored in each of the twin cells. One of storage nodes is selected from each of the twin cells. A comparing circuit compares complementary search data on a search data line pair with the selected stored data. In a DRAM cell, a planar metal-insulator-semiconductor (MIS) transistor is used. According to such configuration, the chip area and cost of a ternary content addressable memory are reduced and high-speed writing is achieved.

10 Claims, 25 Drawing Sheets

| TCAM CELL STORAGE DATA BIT | SN1 | SN2 | SN3 | SN4 |
|---|---|---|---|---|
| 1 | L | H | L | H |
| 0 | H | L | H | L |
| X | H | L | L | H |

| TCAM CELL STORAGE DATA BIT | SN1 | SN2 | SN3 | SN4 |
|---|---|---|---|---|
| 1 | H | L | H | L |
| 0 | L | H | L | H |
| X | H | L | L | H |

CONTENT ADDRESSABLE MEMORY CAPABLE OF STABLY STORING TERNARY DATA

BACKGROUND OF THE INVENTION

1. Field of the Invention

The present invention relates to a semiconductor memory device, and particularly to a content addressable memory (CAM) for determining whether search data is stored in accordance with the search data. More particularly, the present invention relates to a ternary content addressable memory (TCAM) capable of performing high-speed operation and stably storing ternary data.

2. Description of the Background Art

A content addressable memory (CAM) has functions of writing and reading data and, in addition, capable of addressing stored data in accordance with search data. Specifically, a CAM can detect whether stored data (word) which matches external data (search data), exists. When data matching the search data is stored, a match line is driven and it can be detected that data matching the search data is stored. Therefore, it is unnecessary to compare stored data with search data one by one, so that data search can be performed at high speed.

Such a CAM is used for, for example, address comparison at the time of determination of cache hit/miss for determining whether necessary data is stored or not in accessing a cache in a data processing system.

In a conventional CAM, a memory cell has, as storage states, two states of "1" and "0" and stores binary data. In the case of the CAM for storing binary data, non-ambiguous and meaningful data is stored for each word. In a search operation, when bits of stored data (word) completely match bits of search data, a match line is set to a state indicative of match.

A TCAM (Ternary CAM) for storing ternary data in place of a CAM cell for storing binary data is disclosed in U.S. Pat. No. 6,320,777 B1.

In the TCAM, as storage states, in addition to the two states of "1" and "0", a "don't care (X)" state is stored in a memory cell. In the case of constructing each storage word by a combination of ternary data bits, it is particularly effective in the case of performing a process on an IP (Internet Protocol) packet in a network system. For example, it is now assumed that a destination address of a packet is expressed by four bits, for simplicity. When the destination address of a packet is "1*" (where the head bit is "1" and each of the remaining address bits may be any value), a predetermined process is assumed to be performed on the packet. In addition, to retrieve the destination address when the packet arrives at the system and determine whether the destination address matches the address "1*" or not, the content addressable memory CAM or the ternary CAM is assumed to be used.

In this case, the data "1***" has to be stored in the CAM or TCAM before the packet arrives. When a normal CAM for storing binary data is used, eight states of "1000", "1001", "1010", "1011", "1100", "1101", "1110", and "1111" have to be stored. Therefore, for retrieval of the destination address of the packet, eight words are consumed.

By contrast, since a state "X" can be stored in the TCAM, TCAM is only required to store one word of "1XXX". When the number of bits of the destination address further increases, the difference in the number of words to be used further increases. Therefore, in the case of using the TCAM, various data can be stored with a reduced number of words. In practice, an IP packet includes, in addition to the destination address, various information such as an IP address of a transmission source, information indicative of communication quality, and version number of an IP protocol. It is therefore understood that the TCAM is very useful in the case of performing a search process on the information.

As described above, the TCAM is a content addressable memory capable of storing ternary information and is useful as an LSI used for packet search information in an information network system.

In the prior art document as described previously, a DRAM (Dynamic Random Access Memory) cells of two bits are used to store 1-bit data, thereby achieving storage of ternary data. Specifically, data of "HL", "LH" and "LL" is stored in two separate storage nodes of the DRAM cells, and a comparing circuit detects whether the data matches search data supplied via a search data line or not.

As described above, in the prior art document, a DRAM cell is used as a memory element. As a capacitive element for storing data in the DRAM cell, a three-dimensional capacitor of a stacked structure is used. If such stacked capacitor is used in the DRAM cell, it is excepted that the area of a TCAM cell can be reduced and the chip area is accordingly reduced. It is also expected that a capacitor, which occupies a small area but has a large capacitance value, can be implemented and a soft error immunity can be improved.

In the case of using such a stacked capacitor for a TCAM, however, in order to make the operation stable, it is necessary to form a capacitor of as large a capacitance value as possible. Consequently, the structure of a capacitor portion is complicated and a memory cell structure becomes a complicated three-dimensional structure. Accordingly, the number of processes and the number of masks increase, and complicated patterning has to be made, so that it becomes difficult to decrease the chip cost. Consequently, even when the stacked capacitor of the three-dimensional structure is used to reduce the TCAM cell area to reduce the chip area accordingly, it is difficult to dramatically decrease the manufacturing cost.

As for electric characteristics, usually, a DRAM cell capacitor can have a large capacitance value. On the other hand, it takes long time to charge the capacitor and it causes such a problem that write cycle time is increased. In the TCAM, when it is necessary to write data to an array, the data has to be written while interrupting a normal search operation. Therefore, in the case in which the write time is long, the interruption time against the search operation is correspondingly increased, and it causes such a problem that the search process efficiency deteriorates.

In the case of using the capacitor of a DRAM cell for storing data, in order to prevent stored data from being lost by leakage of charges, a refresh operation for restoring data has to be performed periodically. In performing the refresh operation, memory cell information is internally read, amplified and rewritten. Therefore, the refresh operation has to be performed also while interrupting the search operation. Since the interruption by the refresh operation to the search operation occurs in a major time portion, the search process efficiency deteriorates.

In the configuration of the TCAM cell shown in the prior art document 1, an open bit line structure for amplifying potentials of bit lines that are provided on the right and left sides of a sense amplifier is employed inevitably for the following reason. A sense amplifier is used to read and refresh data of the TCAM cell. A bit line is connected to a transistor in the DRAM cell in the TCAM cell and transmits write/read data.

The potentials of the storage nodes of the two capacitors in the TCAM cell are "H, L", "L, H" or "L, L" in accordance with a storage state. Therefore, complementary voltages are not always stored in the two storage nodes. When data stored in the two capacitors of TCAM cell are read to first and second bit lines, voltages of the first and second bit lines cannot be differentially amplified by a sense amplifier. Thus, a normal folded bit line structure used in a DRAM cannot be used.

In the case of the folded bit line configuration, complementary data are always transmitted to a pair of bit lines, and a sense amplifier amplifies the difference of the potentials on the bit line pair. The bit line pair is disposed in parallel on one side of the sense amplifier. Even if noise occurs, common phase noises also occur on the bit line pair. Different from the open bit line configuration, the folded bit line configuration has an advantage that influences of noise are cancelled out and a very small potential difference can be stably amplified. In the case of the TCAM cell in the prior art document, bit lines are disposed in the open bit line configuration, so that the TCAM cell is vulnerable to noise and a problem arises that it is difficult to perform a sensing operation stably.

In place of the configuration of using the 2-bit DRAM cells as the TCAM cell, it is also possible to use an SRAM (Static Random Access Memory) cell constructed by an inverter latch for a 2-bit data storage element. In the case of using an SRAM cell, the refresh operation is unnecessary, and the search process efficiency can be improved as compared with the DRAM cell. In the case in which an MIS transistor (insulated gate field effect transistor) is used for an SRAM cell, the capacitance of a storage node of the SRAM cell is a gate capacitance of the MIS transistor. As the capacitance value is smaller as compared with the DRAM cell capacitor, the storage node can be charged at high speed, and data can be written at high speed.

However, since a parasitic capacitance of the storage node is small, due to an impact ionization phenomenon that occurs in a substrate region when an alpha ray is irradiated, a soft error that charges of the storage node disappear through recombination and the stored data changes tends to occur. A problem arises that immunity against a soft error caused by alpha ray is very low.

Since the SRAM cell is constructed by an inverter latch, in the case of using the SRAM cells of two bits in order to store data of one bit, for a full CMOS (complementary MIS) cell, eight MIS transistors in total are required. The area occupied by the cell increases and it causes a problem that the chip area cannot be reduced

SUMMARY OF THE INVENTION

An object of the present invention is to provide a semiconductor memory device having a TCAM cell capable of storing data stably with a reduced area.

Another object of the present invention is to provide a semiconductor memory device having a TCAM cell capable of writing data at high speed.

Still another object of the present invention is to provide a large-storage-capacity, high-speed, and low-cost semiconductor memory device.

In a semiconductor memory device according to the present invention, a data storage section of a TCAM cell for storing 1-bit data is constructed by first and second twin cells each including two DRAM cells.

The TCAM cell according to the present invention further includes a comparing circuit for comparing data stored in a storage node in the first twin cell with data transmitted via a first search data line in a search data line pair, comparing data stored in a storage node in the second twin cell with search data transmitted via a second search data line in the search data line pair, and selectively driving a match line in accordance with result of the comparison. To the search data line pair, complementary data are transferred.

The TCAM cell is constructed by two DRAM twin cells in which complementary data are normally stored. The difference between the complementary data in the twin cell can be amplified by a sense amplifier. A sensing operation can be performed in the folded bit line configuration.

Since complementary data are stored in the twin cell and a voltage difference always exists between the storage nodes, a voltage difference can be caused between the bit line pair at the time of internally reading data. Consequently, a refresh interval can be increased, deterioration in search efficiency is suppressed, and current consumption required for refresh is reduced.

Since the DRAM cells are used as components of the twin cells, as compared with the configuration of using an SRAM cell, the occupying area can be reduced, and a TCAM cell of a reduced occupying area can be implemented.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
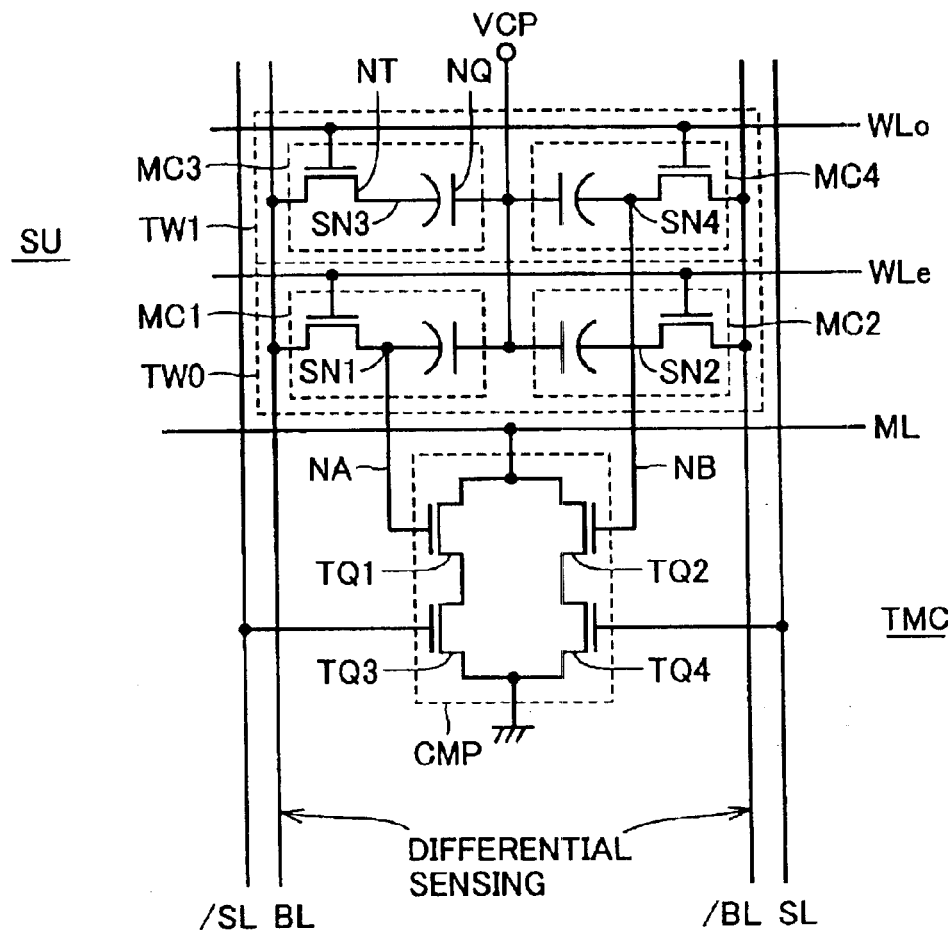
FIG. 1 is a diagram showing the configuration of a TCAM cell according to a first embodiment of the present invention.

FIG. 1 is a diagram showing an electric circuit of a TCAM cell according to a first embodiment of the present invention. In FIG. 1, the TCAM cell includes a storage unit SU for storing data of one bit and a comparing circuit CMP for comparing the data stored in storage unit SU with search data bits transmitted via search lines SL and /SL.

Storage unit SU includes a twin cell TW0 for storing complementary write data transmitted onto bit lines BL and /BL in response to a signal on a word line (select line) WLe in a data writing operation, and a twin cell TW1 for storing complementary data transmitted onto bit lines BL and /BL in a data writing operation in response to a signal potential on a word line WLo. To bit lines BL and /BL, complementary data are always transmitted.

To search lines SL and /SL as well, complementary data corresponding to a search data bit are transferred.

In the following description, "1-bit data" indicates a unit of a word of search data or stored data, and "data" indicates information transferred to and stored in a TCAM cell. For example, one bit of a word is expressed by two complementary storage data of twin cells TW0 and TW1.

Twin cell TW0 includes a dynamic cell MC1 disposed at a crossing of word line WLe and bit line BL, and a dynamic cell MC2 disposed at a crossing of word line WLe and bit line /BL. Twin cell TW1 includes a dynamic cell MC3 disposed at a crossing of word line WLo and bit line BL and a dynamic cell MC4 disposed at a crossing of word line WLo and bit line /BL.

Each of dynamic cells MC1 to MC4 includes a capacitor NQ for storing data in the form of charges and an access transistor NT for coupling a corresponding capacitor to a bit line (BL or /BL) in response to a signal on a corresponding word line. Each of dynamic cells MC1 to MC4 has a configuration similar to that of a DRAM (Dynamic Random Access Memory) cell of 1-transistor and 1-capacitor type. Although a sectional structure of capacitor NQ will be described in detail later, capacitor NQ is a planar MIS capacitor constructed by an N-channel MIS transistor (insulated gate field effect transistor). Specifically, capacitor NQ is a parallel electrode capacitor using a gate electrode as one electrode (cell plate electrode) and using a semiconductor substrate region (impurity region) as the other electrode (storage node electrode).

One electrode (cell plate electrode) of capacitor NQ of each of dynamic cells MC1 to MC4 is constructed by the gate electrode of the MIS transistor. To the cell plate electrode, a cell plate voltage VCP is commonly applied. The respective other electrode nodes of capacitors NQ of dynamic cells MC1 to MC4 are used as storage nodes SN1 to SN4, at each of which charges corresponding to storage data are accumulated.

Storage unit SU is therefore constructed by dynamic cells of four bits. Twin cells TW0 and TW1 store complementary data. In the dynamic cells of four bits, data corresponding to search data of one bit is stored.

Comparing circuit CMP includes N-channel MIS transistors TQ3 and TQ4 receiving signals on search lines /SL and SL at their gates, and N-channel MIS transistors TQ1 and TQ2 connected in series between MIS transistors TQ3 and TQ4 and a match line ML and having their gates coupled to storage nodes SN1 and SN4, respectively.

Comparing circuit CMP is constructed by the N-channel MIS transistors. Therefore, the TCAM cell can be constructed by the N-channel MIS transistors formed in a common P-well. Consequently, as compared with the configuration including both P-channel MIS transistors and N-channel MIS transistors, it is unnecessary to isolate the wells and the layout area can be reduced.

Although the configuration of the memory capacitor will be described in detail later, since memory capacitor NQ takes the form of a planar MIS capacitor, memory capacitor NQ is the same, in terms of fabricating process, as the MIS transistor, and can be fabricated through fabricating process steps similar to those of a TCAM cell using a conventional SRAM cell. As compared with the fabricating process of the TCAM cell using the SRAM cell, the number of masks and the number of process steps do not increase. Although the wafer fabricating cost is substantially the same, the chip area as well as the chip unit price can be reduced, as compared with a static TCAM cell using an SRAM cell.

Since memory capacitor NQ is used, as compared with the SRAM cell, the capacitance value is larger. As compared with the TCAM cell using the SRAM cell, therefore, soft error immunity can be improved.

In each of twin cells TW0 and TW1, complementary data are stored. As compared with the configuration of a dynamic TCAM cell using a DRAM cell in the prior art document, the data retention characteristic can be further improved. Accordingly, even if the capacitor area is smaller than the dynamic TCAM cell, data can be held stably.

Since the planar MIS capacitor is used, as compared with a stacked capacitor, the capacitance value is smaller, charging can be made at high speed and accordingly, data write time can be shortened.

Figure 2:
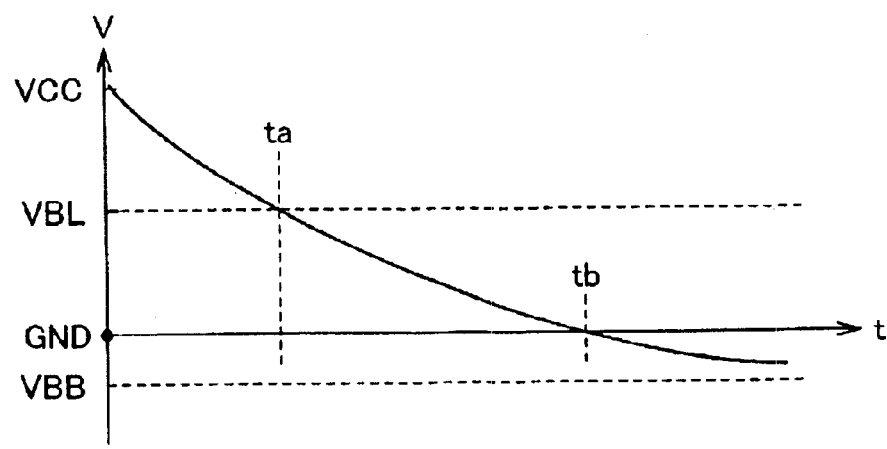
FIG. 2 is a diagram showing a potential change of a storage node of a dynamic cell shown in FIG. 1.

FIG. 2 is a diagram schematically showing a change over time of a potential of the storage node in each of dynamic cells MC1 to MC4 shown in FIG. 1. In FIG. 2, a voltage of the storage node for storing H-level data is shown. In a capacitor, due to a junction leakage current, a leakage of a current to an interlayer insulating film and other, the voltage level decreases exponentially. A state where bit lines BL and /BL are precharged to a voltage VBL at an intermediate voltage level will be considered.

In a conventional dynamic TCAM cell, the state of data "L, L" is permitted as a storage state. Therefore, the voltage of each of bit lines BL and /BL is compared with precharge voltage VBL by a corresponding sense amplifier individually and is differentially amplified. At time ta when the voltage of the storage node for storing H-level data becomes equal to bit line precharge voltage VBL, the sense amplifier cannot perform a sensing operation. Therefore, in consideration of a sense margin of the sense amplifier, it is necessary to read memory cell data and perform a refresh at a certain time before time ta.

However, as shown in FIG. 1, when complementary data are stored in each of twin cells TW0 and TW1 and read onto bit lines BL and /BL, H-level data and L-level data are always read onto bit lines BL and /BL. Therefore, at any time before time tb at which a voltage VCC in the storage node decreases down to a ground voltage VSS level, a voltage difference is present between bit lines BL and /BL, and the sensing operation by the sense amplifier can be performed.

If a negative well bias voltage VBB is applied to the well, the voltage of the storage node for storing H-level data lowers below ground voltage VSS and to a negative voltage VBB level. At this time, the voltage of the storage node for storing L-level data also exponentially decreases from ground voltage VSS toward well bias voltage VBB. Therefore, between the storage node storing H-level data and the storage node storing L-level data, a potential difference is always present, the refresh interval can be made longer than time tb, and an substantially refresh-free state can be set in theory.

Therefore, the refresh interval can be made long and the number of times of refresh is accordingly decreased. It becomes unnecessary to interrupt a compare and search operation for performing a refresh, and therefore, the search efficiency is improved. In addition, current consumption required for refresh can be also saved.

Figure 3:
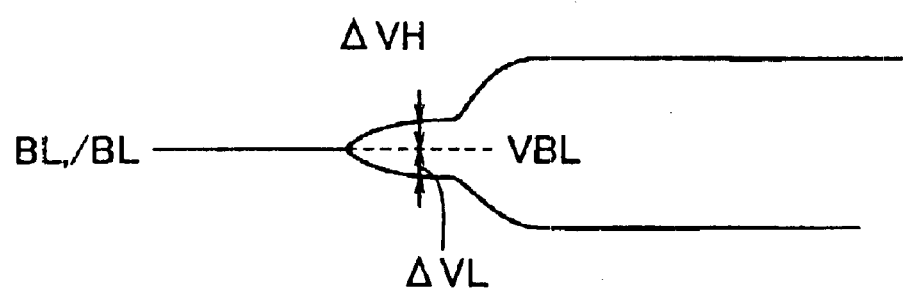
FIG. 3 is a diagram showing a voltage waveform of a bit line at the time of reading data of a twin cell shown in FIG. 1.

FIG. 3 is a diagram showing voltage waveforms in an operation of refreshing bit lines BL and /BL. The voltage waveforms in the case of precharging bit lines BL and /BL to intermediate voltage VBL is shown as an example.

As shown in FIG. 3, in refresh operation or data reading operation, a voltage change is always accompanied with a read voltage $\Delta VH$ corresponding to H-level data and a read voltage $\Delta VL$ corresponding to L-level data on bit lines BL and /BL. The sense amplifier amplifies the difference $\Delta VH + \Delta VL$ between the bit lines and drives bit lines BL and /BL to the power supply voltage VCC level and the ground voltage VSS level in accordance with the storage data.

In the conventional dynamic TCAM cell, H-level data or L-level data is read to one bit line, and the other bit line maintains the voltage level of precharge voltage VBL. Therefore, only a voltage change of voltage $\Delta VH$ or $\Delta VL$ generates between the bit line pair. The read voltage for the sense amplifier can be increased greatly as compared with the configuration of the conventional dynamic TCAM cell, so that the sensing operation can be performed with reliability.

Consequently, also in the case in which the planar MIS capacitor is used as memory cell capacitor NQ and the capacitance value is smaller than that of a stacked capacitor, an adequate voltage difference can be generated between the bit line pair.

Since the capacitance value of memory cell capacitor NQ is smaller than that of a stacked capacitor, in a data writing operation, the storage node can be charged to write H-level data at high speed, and write time can be therefore shortened.

In the TCAM cell shown in FIG. 1, twin cell TW0 is used for assuring the potential of a comparison node NA of comparing circuit CMP, twin cell TW1 is used for assuring the potential of a comparison node NB, and data supplied to nodes NA and NB are stored in twin cells TW0 and TW1 each including the two dynamic cells.

In the present invention, for bit lines BL and /BL, precharge voltage VBL is set to the intermediate voltage level between power supply voltage VCC and ground voltage VSS. However, even if the precharge voltage of bit lines BL and /BL is power supply voltage VCC, a voltage difference between the bit line pair can be increased. Specifically, usually, in the case of a VCC precharge scheme, the voltage level of the precharge voltage of the bit line is the same as that of the H-level data stored in the dynamic cell. Therefore, in order to read data in one dynamic cell, a dummy cell has to be used. A voltage of an intermediate value of bit line voltages generated when the H-level data and L-level data are read is generated by using the dummy cell on a reference bit line and used as a reference voltage in a sensing operation. In this case, the sense reference voltage (corresponding to VBL) generated by the dummy cell and the bit line voltage at the time of reading the H-level data or the bit line voltage at the time of reading the L-level data are compared with each other, thereby reading the memory cell data.

As shown in FIG. 3, in the VCC precharge scheme, in the case of reading complementary data of the dynamic cells to the bit lines by using the twin cell in the first embodiment, the difference between the bit line voltage onto which the L-level data is read and the power supply voltage is used for the sense amplifier. However, in the case of the TCAM cell shown in FIG. 1, the complementary voltage relative to the reference voltage (corresponding to the VBL) generated by the dummy cell are read onto bit lines BL and /BL. Consequently, even in the VCC precharge scheme, the sum of read voltages ΔVH and ΔVL is generated with respect to the reference voltage generated by the conventional dummy cell and therefore, can be sensed by the sense amplifier.

Therefore, as compared with the configuration using the dummy cell, the voltage difference between the bit line pair can be made larger. Irrespective of the bit line precharge scheme, an accurate sensing operation, stable storage of data, and reduction in the number of refresh cycles can be realized. The basic operation of the TCAM cell shown in FIG. 1 will now be described.

Data Write and Search Operation

In the TCAM cell, when L-level and H-level data are stored in nodes SN1 and SN4, respectively, the bit "0" is stored. When H-level and L-level data are stored in nodes SN1 and SN4, respectively, the bit "1" is stored. When L-level data is stored in each of nodes SN1 and SN4, the TCAM cell stores the bit "X".

Before performing a search operation, data has to be stored in each word of the TCAM in advance. The writing of data to the TCAM cell is performed as follows. First, word line WLe is driven to a high potential level of a selection state, and complementary potentials are applied to bit lines BL and /BL so that a desired potential is written in node NA (SN1). Subsequently, by driving word line WLe to a low potential of an inactive state in this state, the writing of data to twin cell TW0 is completed.

Next, word line WLo is driven to a high potential level, and potentials on bit lines BL and /BL are written into storage nodes SN3 and SN4, respectively. By driving word line WLo to the L level of a non-selected state, the writing of the data bit to the TCAM cell is completed. Cell plate potential VCP is set to the power supply voltage VCC level so that an inversion layer is formed sufficiently in the substrate region surface of an MIS capacitor formation region, to allow the MIS transistor to operate as capacitor NQ.

Precharge voltage VBL of bit lines BL and /BL is set to an intermediate voltage VCC/2. The data write and search operation to the TCAM cell shown in FIG. 1 will be specifically described with reference to FIG. 4.

In the case of writing the data bit "0" to the TCAM cell, first, bit lines BL and /BL are set to the ground voltage GND level and the power supply voltage VCC level, respectively. When word line WLe is driven to a selected state, in twin cell TW0 shown in FIG. 1, access transistor NT is made conductive, storage nodes SN1 and SN2 are coupled to bit lines BL and /BL, respectively, and ground voltage GND and power supply voltage VCC are transmitted to storage nodes SN1 and SN2, respectively. At this time, word line WLo is not selected.

By driving word line WLe to a non-selected state, complementary data (complementary potentials) of ground voltage GND and power supply voltage VCC are stored in storage nodes SN1 and SN2 of twin cell TW0.

By driving word line WLo to a selected state in such a state, in twin cell TW1, the access transistors in memory cells MC3 and MC4 are made conductive, and storage nodes SN3 and SN4 are coupled to bit lines BL and /BL, respectively. Accordingly, storage nodes SN3 and SN4 are set to ground voltage GND and power supply voltage VCC, respectively. By driving word line WLo to a non-selected state, writing of the bit "0" to the TCAM cell is completed. At the time of writing the bit, memory capacitor NQ is a planar MIS capacitor having a capacitance value smaller than that of a stacked capacitor, charging time of storage nodes SN1 to SN4 is sufficiently short, data writing can be completed in short time, and interruption time due to writing to the search operation can be shortened.

In the search operation on the TCAM in which the bit "0" is stored, word lines WLe and WLo are maintained at the ground voltage GND level in a non-selected state. A search data bit is applied to search lines SL and /SL. When the search data bit is "0", ground voltage GND and power supply voltage VCC are supplied to search lines SL and /SL, respectively.

Comparing circuit CMP detects match/mismatch between the signal potential on search line SL and the potential on node NB coupled to storage node SN4 or match/mismatch between the potential of node NA (storage node SN1) and the signal potential on search line /SL. When the search data bit is "0", in comparing circuit CMP, all of MIS transistors TQ1 to TQ4 are in the non-conductive state, and match line ML maintains the precharge voltage VCC level. When match line ML maintains the precharge voltage level, match is detected.

When the search data bit is "1", power supply voltage VCC is transmitted to search line SL, and ground voltage GND is transmitted to search line /SL. In this case, the potentials of both storage node SN1 and search line /SL are at the L level, and MIS transistors TQ1 and TQ3 are in the non-conductive state. On the other hand, both the potentials on search line SL and the potential on storage node SN4 are at the H level, MIS transistors TQ2 and TQ4 are made conductive, and match line ML is discharged to the ground voltage level. When match line ML is discharged to the ground voltage level, mismatch is detected.

The search/compare operation is executed on each of bits of search data, and match line ML is commonly connected to the TCAM cells of bits constructing a word. Therefore, when match is detected in all of bits of a search word (data), match line ML maintains the precharge voltage level (VCC level).

At the time of writing the bit "1" to the TCAM cell, bit lines BL and /BL are set to the power supply voltage VCC level and the ground voltage GND level, respectively. Word lines WLe and WLo are sequentially driven to a selected state. When word line WLe is selected, in twin cell TW0, the power supply voltage and the ground voltage are stored in storage nodes SN1 and SN2, respectively, via the associated access transistors. When word line WLo is selected, in twin cell TW1, storage node SN3 is connected to a bit line BL3 and charged to power supply voltage VCC, and storage node SN4 is discharged to the ground voltage GND level. When both word lines WLe and WLo attain the non-selected state, writing of the bit "1" to the TCAM cell is completed.

In the search operation on the TCAM cell storing the bit "1", when the search data bit is "0", ground voltage GND and power supply voltage VCC are transmitted to search lines SL and /SL, respectively. Both word lines WLe and WLo are in a non-selected state. In this state, both the voltage level of storage node SN1 and the voltage level of search line /SL are at H level. In comparing circuit CMP, MIS transistors TQ1 and TQ3 are made conductive. Therefore, even when both MIS transistors TQ2 and TQ4 are non-conductive, match line ML is discharged to the ground voltage level by MIS transistors TQ1 and TQ3.

In the case in which the search data bit is "1", a mismatch occurs between the potential on storage node SN1 and the potential on search line /SL, and a mismatch occurs also between the potential on storage node SN4 and the potential on search line SL. MIS transistors TQ3 and TQ2 in comparing circuit CMP are non-conductive, and match line ML maintains the precharge voltage level.

Also in the case of writing the bit "X" to the TCAM cell, word lines WLe and WLo are sequentially driven to the selected state. When word line WLe is selected, ground voltage GND and power supply voltage VCC are transmitted to bit lines BL and /BL, respectively. Accordingly, in twin cell TW0, ground voltage GND and power supply voltage VCC are transmitted and stored into storage nodes SN1 and SN2, respectively. When word line WLo is selected, on the contrary, power supply voltage VCC and ground voltage GND are transmitted to bit lines BL and /BL, respectively. In this state, in twin cell TW1, storage node SN3 is set to the power supply voltage VCC level, and storage node SN4 is set to the ground voltage GND level. That is, in the case of storing a "don't care" state, reverse data are stored in twin cells TW0 and TW1. Both storage nodes SN1 and SN4 store L-level data and, in comparing circuit CMP, MIS transistors TQ1 and TQ2 become non-conductive.

In a search operation on the TCAM cell storing the "don't care" state, when the search data bit "0" is supplied, a mismatch occurs between the potential on storage node SN1 and the potential on search line /SL, and a discharge path of MIS transistors TQ1 and TQ2 is cut off. The potential on storage node SN4 and the gate potential on search line SL are both at the L level, and a discharge path of MIS transistors TQ2 and TQ4 is cut off. Therefore, match line ML maintains a precharge state, and a match state is detected.

Where the search data bit "1" is supplied, both the potential on storage node SN1 and the potential on search line /SL are at the ground potential level, and MIS transistors TQ1 and TQ3 are in the non-conductive state. Although the voltage on search line SL is at the H level, storage node SN1 is at the ground voltage GND level, and MIS transistor TQ1 is in the non-conductive state. Therefore, all of discharge paths in comparing circuit CMP are cut off and match line ML maintains the precharged state.

That is, in the case of storing the "don't care" state, both storage nodes SN1 and SN4 are maintained at the ground voltage level and, in comparing circuit CMP, MIS transistors TQ1 and TQ2 are set in the non-conductive state. In this state, even when the search data bit is any of "1" and "0", match line ML maintains the precharged state, and a match is detected.

Therefore, by storing the data "H, L", "L, H" and "L, L" in storage nodes SN1 and SN4 in the TCAM cell, a ternary state of the bits "1", "0" and "X" can be stored.

In the TCAM cell shown in FIG. 1, storage nodes SN1 and SN4 are coupled to comparison nodes NA and NB, respectively, in comparing circuit CMP. Alternately, the potentials stored in storage nodes SN3 and SN2 may be applied to comparison nodes NA and NB in comparing circuit CMP. A set of storage nodes SN1 and SN3 or a set of storage nodes SN2 and SN4 may be used.

It is sufficient to use one of storage nodes SN1 and SN2 in twin cell TW0 and one of storage nodes SN3 and SN4 in twin cell TW1 as search data bit storage nodes for comparing circuit CMP. Word lines WLe and WLo may be selected in order of word lines WLo and WLe.

Refresh Operation

Figure 5:
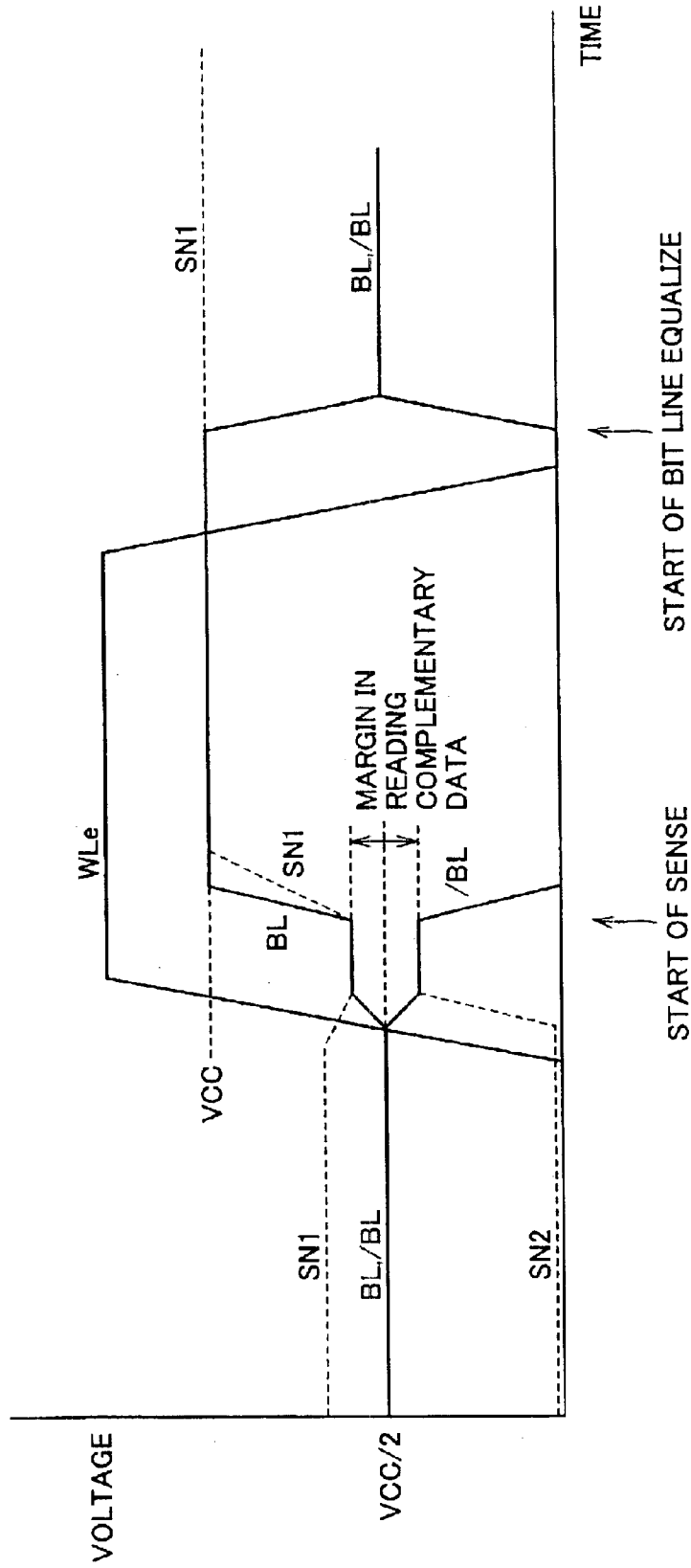
FIG. 5 is a signal waveform chart representing a sensing operation of the TCAM cell shown in FIG. 1.

FIG. 5 is a signal waveform diagram representing an operation of refreshing storage data in the TCAM cell shown in FIG. 1. Referring to FIG. 5, the operation of refreshing storage data in the TCAM cell shown in FIG. 1 will be described below. In FIG. 5, the vertical axis indicates voltage and the horizontal axis indicates time. With reference to FIG. 5, a refresh operation performed on twin cell TW0 in a state where L-level data and H-level data are stored in storage nodes SN1 and SN2, respectively, in twin cell TW0 will be described.

In a standby state, bit lines BL and /BL are precharged and equalized to intermediate voltage VCC/2. The voltage level of H-level data of storage node SN1 lowers from power supply voltage VCC due to leakage of a load. When the well is biased to negative voltage VBB, the voltage level of storage node SN2 decreases from the ground voltage level toward the negative voltage. When the well region is maintained at the ground voltage level, due to an influence of noise or the like, the voltage level of storage node SN2 rises higher than the ground voltage level because of hole injection or the like. FIG. 5 shows a state where the voltage level of storage node SN2 storing the L-level data rises higher than the ground voltage level due to a leakage current.

Since twin cells TW0 and TW1 share bit lines BL and /BL, a refresh operation is performed individually for each of twin cells TW0 and TW1. At the start of the refresh operation, first, an operation of precharging bit lines BL and /BL is stopped to set bit lines BL and /BL to an electrically floating state.

Subsequently, word line WLe is driven to a selected state. In order to suppress decrease in voltage level of storage data due to a threshold voltage loss of access transistor NT, selected word line WLe is driven to a voltage level higher than power supply voltage VCC. When word line WLe is driven to a selected state (high voltage level), in twin cell TW0 shown in FIG. 1, access transistor NT is made conductive, storage nodes SN1 and SN2 are coupled to bit lines BL and /BL, respectively, the voltage level of bit line BL increases and the voltage level of complementary bit line /BL decreases. In this case, even if the voltage level of storage node SN1 lowers due to leakage of charges, complementary data are read to bit lines BL and /BL, so that a sufficiently large voltage difference can be generated.

When a sufficient voltage difference is developed between bit lines BL and /BL, a not-shown sense amplifier is activated to amplify the difference between the voltage on bit line BL and the voltage on bit line /BL. Bit line BL is driven to the power supply voltage VCC level and bit line /BL is driven to the ground voltage level. Storage node SN1 is charged by the sense amplifier via bit line BL and has its voltage level increased to the power supply voltage VCC level at speed slower than the increase in voltage level of bit line BL in accordance with the capacitance value. Storage node SN2 is discharged at higher speed as compared with charging and, at substantially the same speed as the discharge speed of bit line /BL, the voltage level of storage node SN2 drops to the ground voltage level. At the time of writing the H-level data, since the memory cell capacitor is constructed by planar MIS transistors and its capacitance value is smaller than that of a stacked capacitor, storage node SN1 is charged at high speed. Consequently, refresh time can be shortened as compared with a conventional dynamic TCAM.

When the voltage levels of storage nodes SN1 and SN2 are stabilized at the power supply voltage VCC level and the ground voltage GND level, respectively, word line WLe is driven to a non-selected state, the memory transistors of twin cell TW0 turn non-conductive, and rewriting of storage data of twin cell TW0 is completed.

After word line WLe is driven to the non-selected state, the sense amplifier is made inactive. Subsequently, a precharge/equalize operation is performed on bit lines BL and /BL to drive bit lines BL and /BL to the original precharge voltage VCC/2 level.

At the time of refreshing data stored in twin cell TW1, word line WLo is driven to the selected state. An operation similar to that performed on twin cell TW0 is executed and rewriting of storage data is executed.

On completion of the refresh operation, therefore, storage nodes SN1 and SN2 of twin cell TW0 are restored to the power supply voltage VCC level and the ground voltage level, respectively, and the original voltage level of the storage data is recovered with reliability.

Since complementary data are always read to bit lines BL and /BL irrespective of the logic value of the stored data bit in the TCAM cell, a large voltage difference can be always created on bit lines BL and /BL at the time of reading data, and a sufficient sense margin can be assured.

Figure 6:
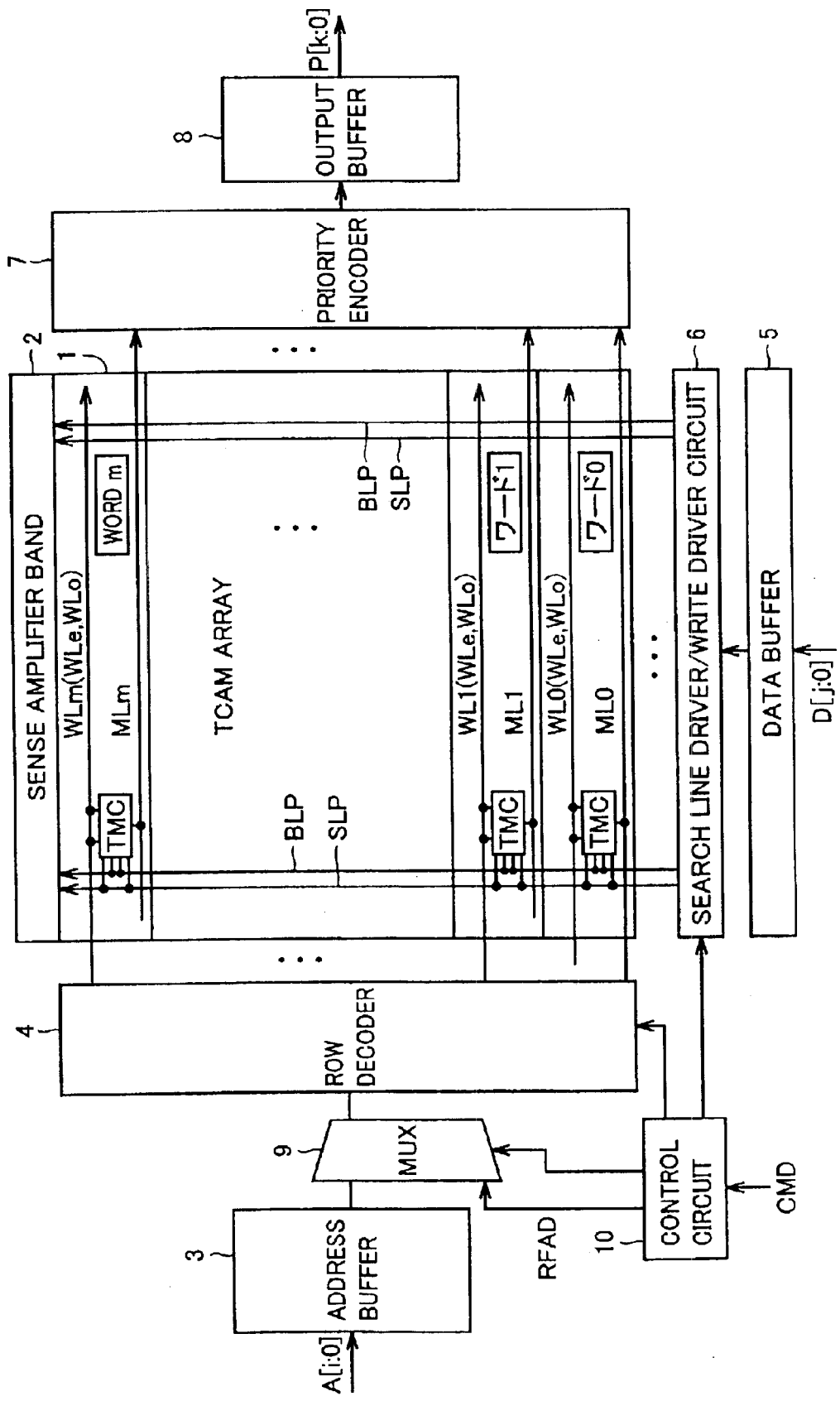
FIG. 6 is a diagram schematically showing a general configuration of the TCAM according to the first embodiment of the present invention.

FIG. 6 is a diagram schematically showing the general configuration of a TCAM including the TCAM cell according to the first embodiment of the present invention. In FIG. 6, the TCAM includes word lines WL0 to WLm arranged in a plurality of rows, and match lines ML0 to MLm disposed in correspondence to word lines WL0 to WLm, respectively. As shown in FIG. 1, each of word lines WL0 to WLm includes an even-numbered word line WLe and an odd-numbered word line WLo. To each of word lines WL0 to WLm, TCAM cells for storing data of one word are connected. Therefore, as shown in FIG. 6, words 0 to m are stored in a TCAM array 1. The number of bits of one word is determined by the number of TCAM cells TMC driven to a selected state at the time of selection of one word line. In FIG. 6, one TCAM cell TMC disposed for each of word lines WL0 to WLm is representatively shown.

In TCAM array 1, a bit line pair BLP and a search line pair SLP are disposed in correspondence to each of columns of TCAM cells TMC. Bit line pair BLP includes bit lines BL and /BL shown in FIG. 1 and search line pair SLP includes search lines SL and /SL shown in FIG. 1.

Match lines ML0 to MLm are provided in correspondence to word lines WL0 to WLm, respectively. To match line ML, TCAM cells TMC included in a corresponding word are commonly coupled. In a search operation, match line ML is selectively driven by TCAM cells TMC included in a corresponding word.

The TCAM further includes an address buffer 3 receiving an address signal A[i:0], a multiplexer (MUX) 9 for selecting one of a refresh address RFAD and an address signal from address buffer 3, and a row decoder 4 for decoding the address signal supplied via multiplexer 9 and driving a corresponding word line to a selected state.

Address signal A[i:0] is an address signal of (i+1) bits. By address signal A[i:0], a word line is specified in a unit of even-numbered word line WLe and odd-numbered word line WLo. Alternately, such a configuration may b employed that address signal A[i:0] specifies a word line on the word line WL basis, an address bit specifying an even-numbered word line and an odd-numbered word line is internally generated each time a data write instruction is supplied, and even-numbered word line WLe and odd-numbered word line WLo are finally driven to the selected state. In this case, at the time of writing data, an instruction of writing 2-bit data to the same address is sequentially supplied externally and, according to whether the write instruction is the first time or the second time, an even-numbered or odd-numbered word line is designated.

In a refresh mode, multiplexer 9 selects refresh address RFAD supplied from a control circuit 10 and supplies it to row decoder 4. Row decoder 4 includes a row decoding circuit provided for each of word lines WL0 to WLm and drives a word line corresponding to an addressed word to the selected state. In this case, each of word lines WL0 to WLm includes even-numbered word line WLe and odd-numbered word line WLo. In row decoder 4 as well, a row decoding circuit is provided for each of even-numbered word line WLe and odd-numbered word line WLo. In a data writing operation and a refresh operation, the even-numbered row decoding circuit and the odd-numbered row decoding circuit are driven to an activate state at different timings.

The number of bits of refresh address RFAD is determined according to the configuration of row decoder 4. Specifically, when address signal A[i:0] specifies word lines WL0 to WLm and corresponding even-numbered and odd-numbered word lines WLe and WLo are simultaneously designated, the activation timings of even-numbered and odd-numbered word lines WLe and WLo are internally adjusted. When refresh address RFAD designates a word line in a unit of the even-numbered word line and odd-numbered word line, the number of bits of refresh address RFAD is made greater than that in the case where address signal A[i:0] designates a word line on the word line WL basis.

Alternately, in the case where refresh address signal RFAD designates a refresh word address on the word line WL basis, even-numbered word line WLe and odd-numbered word line WLo have the activation timings internally adjusted and sequentially driven to the selected state and a refresh is performed. In this case, the number of bits of address signal A[i:0] designating a word address in a word line unit and that of refresh address signal RFAD become equal to each other. Consequently, the number of bits of refresh address signal RFAD is not shown in FIG. 6.

The TCAM further includes: a sense amplifier band 2 including sense amplifiers disposed corresponding to bit line pairs BLP in TCAM array 1 and, when activated, amplifying voltage differences of corresponding bit line pairs BLP; a data buffer 5 for receiving external data D[j:0]; a search line driver/write driver circuit 6 including a search line driver and a write driver for receiving data from data buffer 5 and driving search line pairs SLP and bit line pairs BLP, respectively, under control of control circuit 10; a priority encoder 7 for receiving voltages on match lines ML0 to MLm, detecting a match line of the highest priority, and generating an address signal specifying the match line of the highest priority; and an output buffer 8 for outputting an address signal P[k:0] from priority encoder 7 externally.

According to address signal P[k:0] from output buffer 8, reading of storage data from another memory device, determination of a process to be executed next, or other is executed. The manner of using address signal P[k:0] from output buffer 8 is appropriately determined according to the configuration of the system using the TCAM.

In search line driver/write driver circuit 6, in a search operation, search data is generated according to data D[j:0] supplied from data buffer 5, and complementary data of a corresponding search data bit are transmitted to each search line pair SLP. In a data write operation, in search line driver/write driver circuit 6, the write driver circuit transmits write data to bit line pairs BLP in accordance with write data D[j:0] supplied from data buffer 5.

When a plurality of match lines indicate a match in match lines ML0 to MLm, priority encoder 7 selects the highest address, for example, as an address of the highest priority and generates a corresponding address.

In the configuration of FIG. 6, a search operation, a data write operation, and a refresh operation are executed under control of control circuit 10 receiving command CMD. Reading of data stored in TCAM array 1 may be executed via a not-shown output buffer circuit under control of control circuit 10. An operation mode to be executed by control circuit 10 is determined by command CMD.

In FIG. 6, a control signal of control circuit 10 is not supplied to data buffer 5 and address buffer 3 since a state in which address buffer 3 and data buffer 5 operate statically is assumed. Address buffer 3 and data buffer 5 may, however, selectively operate under control of control circuit 10.

A sense amplifier included in sense amplifier band 2 is activated under control of control circuit 10 in a data write operation and a refresh operation.

Figure 7:
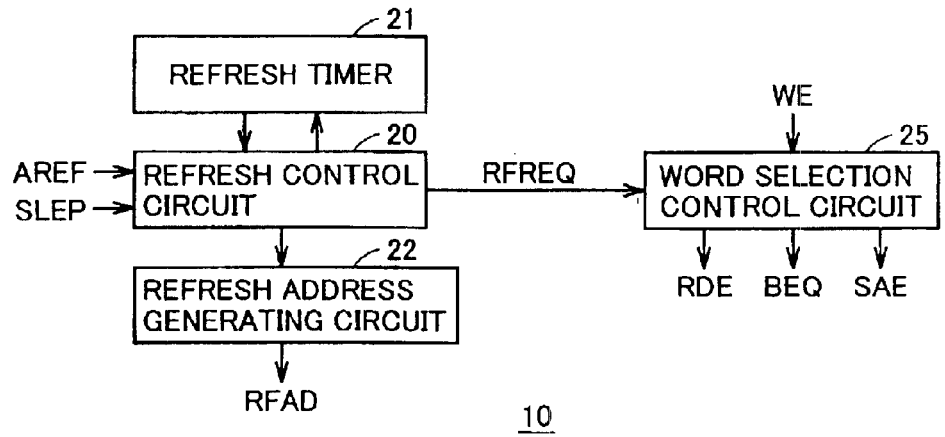
FIG. 7 is a diagram schematically showing the configuration of a control circuit 10 shown in FIG. 6.

FIG. 7 is a diagram schematically showing the configuration of a part related to word line selection of control circuit 10 in FIG. 6. In FIG. 7, control circuit 10 includes: a refresh control circuit 20 for issuing a refresh request RFREQ in accordance with a refresh instruction AREF or a sleep mode instruction SLEP externally applied; a refresh timer 21 activated by refresh control circuit 20 to generate a time-up signal at predetermined time intervals; a refresh address generating circuit 22 for setting an address value and generating refresh address RFAD under control of refresh control circuit 20; and a word selection control circuit 25 for generating various control signals related to word line selection in accordance with refresh request RFREQ and an externally applied write instruction WE.

When refresh instruction AREF is externally supplied, refresh control circuit 20 activates refresh request RFREQ. When sleep mode instruction SLEP is supplied, refresh control circuit 20 activates refresh timer 21 and generates refresh request RFREQ in accordance with a time-up signal from refresh timer 21. When activated, refresh timer 21 generates the time-up signal at predetermined time intervals.

Refresh address generating circuit 22 is constructed by, for example, a count circuit and updates the address value of refresh address RFAD in accordance with an address update instruction from refresh control circuit 20. As described above, as refresh address RFAD, a refresh address may be designated on the word line WL basis, or a refresh word line may be designated in the even-numbered/odd-numbered word line unit or in the WLe/WLo unit.

Sleep mode instruction SLEP is activated when the TCAM is not accessed over a long time. Sleep mode instruction SLEP may be internally generated on the basis of a sleep mode entry signal indicative of entry to the sleep mode and a sleep mode exit signal for releasing the sleep mode.

Write instruction WE is activated in writing data. Refresh instruction AREF, sleep mode instruction SLEP, and write instruction WE are included in a command CMD shown in FIG. 6.

When write instruction WE is activated, word selection control circuit 25 activates a row decoder enable signal RDE for activating the row decoding circuit included in row decoder 4 shown in FIG. 6, deactivates a bit line equalize control signal BEQ for controlling an equalize operation on a bit line pair, and activates a sense amplifier enable signal SAE for controlling activation of the sense amplifier in a predetermined sequence.

Row decoder enable signal RDE enables a decoding circuit provided for even-numbered word line WLe and a row decoder provided for odd-numbered word line WLo. A configuration that address signal A[i:0] specifies a word line in the even-numbered word line/odd-numbered word line unit is assumed here.

In accordance with activation of row decoder enable signal RDE, even-numbered or odd-numbered word line WLe or WLo, which is addressed, is driven to an activate state (selected state).

Figure 8:
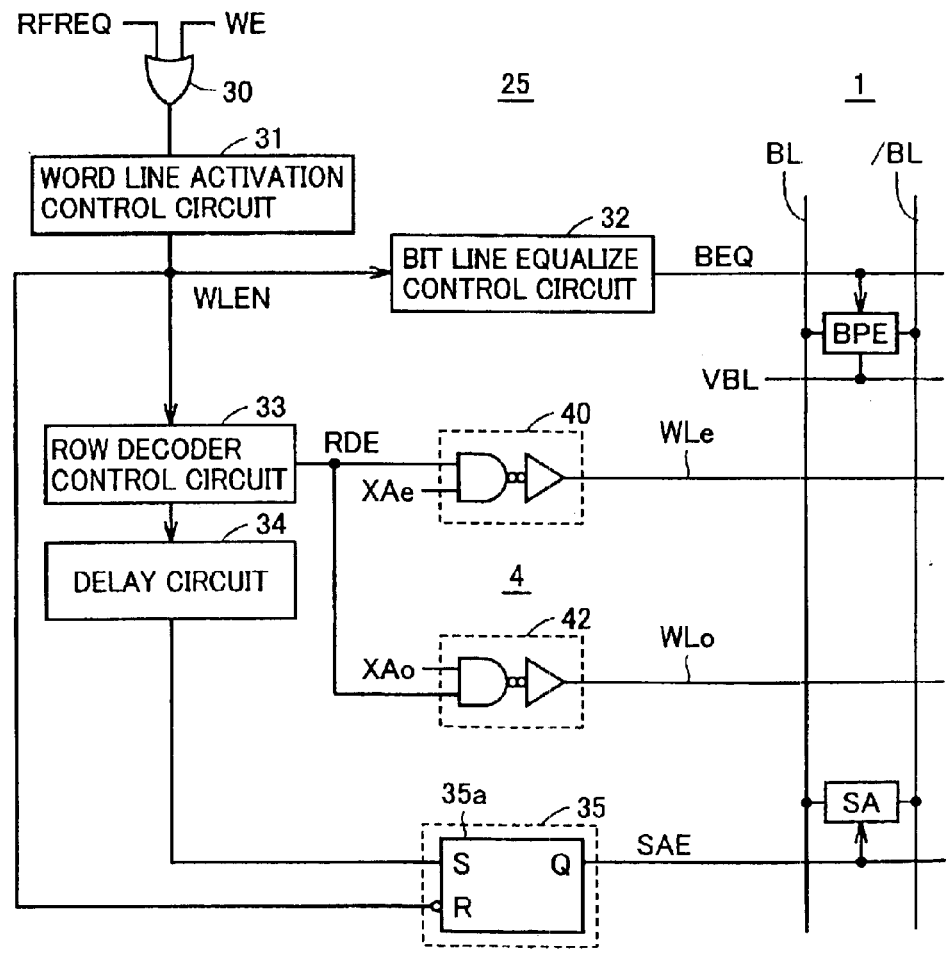
FIG. 8 is a diagram schematically showing the configuration of a word selection control circuit shown in FIG. 7.

FIG. 8 is a diagram schematically showing the configuration of word selection control circuit 25 shown in FIG. 7. In FIG. 8, word selection control circuit 25 includes: an OR circuit 30 receiving refresh request RFREQ and write instruction WE; a word line activation control circuit 31 for generating a word line enable signal WLEN having a predetermined time width in response to the rising edge of an output signal of OR circuit 30; a bit line equalize control circuit 32 for generating a bit line equalize instruction signal BEQ in accordance with word line enable signal WLEN; a row decoder control circuit 33 for activating row decoder enable signal RDE in accordance with word line enable signal WLEN; a delay circuit 34 for delaying an output signal of row decoder control circuit 33 by predetermined time; and a sense control circuit 35 for generating sense amplifier enable signal SAE in accordance with an output signal of delay circuit 34 and word line enable signal WLEN.

Sense control circuit 35 is constructed by, as an example, a set/reset flip flop 35a that is set in response to the rising of an output signal of delay circuit 34 and is reset in response to the falling of word line enable signal WLEN and generates sense amplifier enable signal SAE from its output Q.

Word line activate control circuit 31 is constructed by, for example, a one-shot pulse generating circuit and maintains word line enable signal WLEN in an active state of the H level for a predetermined period of time in response to the rising of the output signal of OR circuit 30.

Bit line equalize control circuit 32 generates bit line equalize signal BEQ on the basis of an inversion signal of word line enable signal WLEN. Bit line equalize control circuit 32 may have a level shifting function and generate bit line equalize control signal BEQ higher than the power supply voltage level. By the level shifting, even if the difference between the power supply voltage and the bit line precharge voltage is close to a threshold voltage of an MIS transistor, the bit line precharge voltage can be transmitted to the bit lines with reliability.

Row decoder control circuit 33 maintains row decoder enable signal RDE in an active state for the period in which word line enable signal WLEN is active. Sense amplifier control circuit 35 drives sense amplifier enable signal SAE to an active state after lapse of a predetermined period of time since row decoder enable signal RDE is activated, and drives sense amplifier enable signal SAE to an inactive state in response to inactivation of word line enable signal WLEN.

In row decoder 4 shown in FIG. 6, an even-numbered row decoding circuit 40 is provided for even-numbered word line WLe, and an odd-numbered row decoding circuit 42 is provided for odd-numbered word line WLo. A set of row decoding circuits 40 and 42 is disposed in correspondence to each of word lines WL0 to WLm shown in FIG. 6. A word line is specified in the odd-numbered/even-numbered word line unit. Sets of different internal address signals (predecode signals) XAe and XAo are supplied to row decoding circuits 40 and 42.

For bit lines BL and /BL, a bit line precharge/equalize circuit BPE for supplying precharge voltage VBL to bit lines BL and /BL to equalize bit lines BL and /BL when bit line equalize instruction signal BEQ is activated, and a sense amplifier SA for amplifying and latching the voltage difference between bit lines BL and /BL and when sense amplifier enable signal SAE is activated are provided.

Bit line precharge/equalize circuit BPE has a configuration similar to that used in a normal DRAM, and includes a precharging transistor and an equalizing transistor.

Sense amplifier SA is constructed by cross-coupled P-channel MIS transistors and cross-coupled N-channel MIS transistors.

Figure 9:
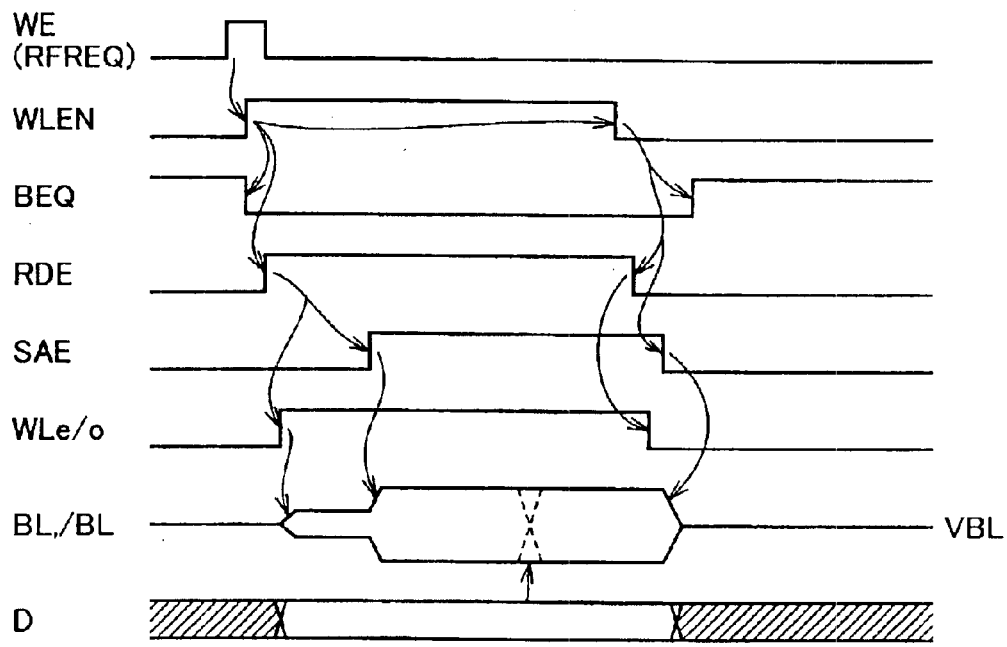
FIG. 9 is a signal waveform diagram representing an operation of the word selection control circuit shown in FIG. 8.

FIG. 9 is a signal waveform diagram representing an operation of word selection control circuit 25 shown in FIG. 8. In FIG. 9, potentials of word lines WLe and WLo and bit lines BL and /BL are also shown. Referring to FIG. 9, the operation of word selection control circuit 25 shown in FIG. 8 will now be described.

When write instruction WE is supplied, the output signal of OR circuit 30 is activated, and word line activate control circuit 31 maintains word line enable signal WLEN in an active state for a predetermined period. In accordance with the activation of word line activate signal WLEN, bit line equalize instruction signal BEQ is made inactive, and a precharge operation of bit lines BL and /BL to precharge voltage VBL by bit line precharge/equalize circuit BPE is completed. In this state, bit lines BL and /BL are in an electrically floating state at the precharge voltage level.

Row decoder control circuit 33 activates row decoder enable signal RDE in accordance with activation of word line enable signal WLEN. Each of row decoding circuits 40 and 42 performs a decoding operation and, if a corresponding word line is designated, drives the corresponding word line to a selected state. In FIG. 9, as word lines WLe/o, a selected word line is shown. In response to driving of even-numbered or odd-numbered word line WLe/o to the selected state, data stored in a twin cell connected to selected word line WLe/o is read, and voltage levels of bit lines BL and /BL change from precharge voltage VBL. In internal data reading, complementary data stored in the corresponding twin cell are read onto both bit lines BL and /BL.

After lapse of the delay time of delay circuit 34, sense amplifier control circuit 35 is set, sense amplifier enable signal SAE is activated, and sense amplifier SA performs a sensing operation. By the sensing operation, the voltage levels of bit lines BL and /BL are driven to the H level and the L level, respectively, in accordance with the read data.

Subsequently, according to the write circuit (write driver), each of bit lines BL and /BL is set to the voltage level according to write data, and writing of data to the selected twin cell is executed.

When word line enable signal WLEN from word line activate control circuit 31 is made inactive after lapse of a predetermined time, row decoder enable signal RDE is made inactive, an output signal of the selected row decoding circuit goes low, and the voltage level of selected word line WLe/o falls to the L level (ground voltage level).

Subsequently, sense amplifier activate signal SAE is made inactive in response to inactivation of word line enable signal WLEN, and sense amplifier SA is made inactive. After sense amplifier SA is made inactive, bit line equalize instruction signal BEQ from bit line equalize control circuit 32 is driven to an active state (H level), bit line precharge/equalize circuit BPE is activated, and bit lines BL and /BL are precharged and equalized to the precharge voltage VBL level.

Thus, data can be written into twin cell TW0 or TW1 in accordance with an address signal externally applied. By executing the write operation twice, data can be stored in a word unit.

In the data write operation, after the sensing operation of sense amplifier SA, write data is transferred to bit lines BL and /BL and is written. Alternately, after setting the bit lines to the voltage levels according to write data, selection of a word line and activation of the sense amplifier may be performed. In this case, row decoder enable signal RDE is activated after the write driver is activated. Different from a normal DRAM, it is not particularly required to execute a column selecting operation after completion of a row selecting operation, and data can be written at such a faster timing.

In the refresh operation, refresh request RFREQ is driven to an active state and an operation similar to the data write operation is performed. In the refresh operation, driving according to write data of bit lines BL and /BL is not performed, so that data read from a twin cell is rewritten into the original twin cell.

Modification of Word Selection Control Circuit 25

Figure 10:
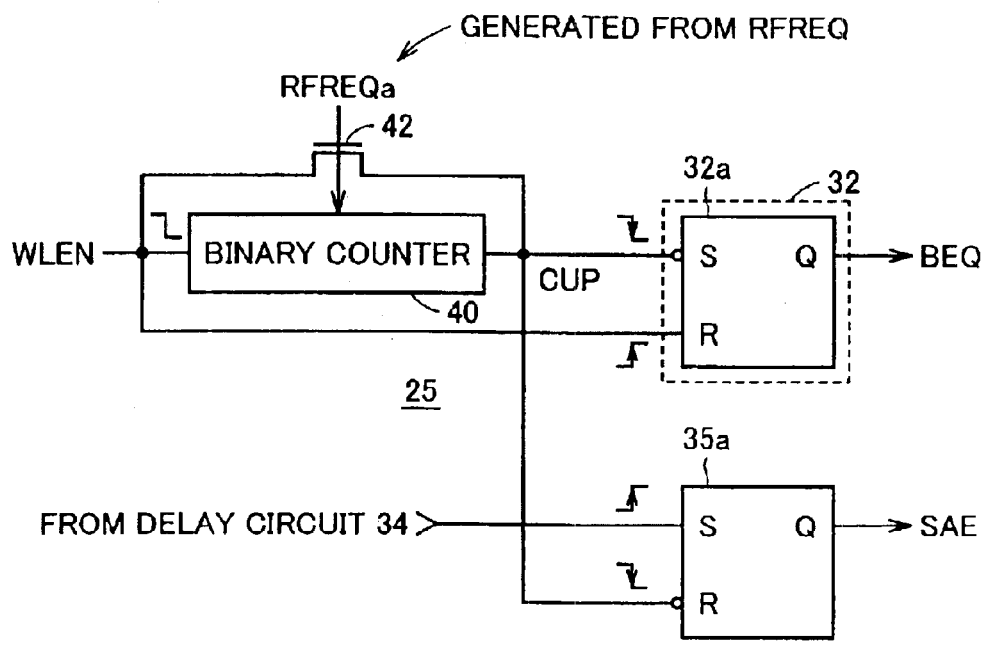
FIG. 10 is a diagram showing a modification of the word selection control circuit shown in FIG. 7.

FIG. 10 is a diagram showing the configuration of a modification of word selection control circuit 25 shown in FIG. 7. FIG. 10 shows a part of circuitry for generating bit line equalize instruction signal BQE and sense amplifier enable signal SAE. The configuration of the other circuit part is the same as that in FIG. 8.

In FIG. 10, word selection control circuit 25 includes: a binary counter 40 for counting the falling of word line enable signal WLEN when activated and generating a count-up signal in a one-shot pulse form when the count value reaches 2; a transfer gate 42 for passing word line enable signal WLEN on in response to a refresh enable signal RFREQa; bit line equalize control circuit 32 for activating bit line equalize instruction signal BEQ in response to a signal CUP from binary counter 40 or transfer gate 42 and inactivating bit line equalize instruction signal BEQ in response to activation of word line enable signal WLEN; and sense amplifier control circuit 35a for inactivating sense amplifier enable signal SAE in response to the falling of output signal CUP of binary counter 40 or transfer gate 42 and activating sense amplifier enable signal SAE in response to the rising edge of an output signal of delay circuit 34 shown in FIG. 8.

Refresh enable signal RFREQa is generated in the form of a one-shot pulse wider in time width than word line enable signal WLEN in accordance with refresh request RFREQ. The counting operation of binary counter 40 is stopped when refresh enable signal RFREQa is activated, and the count value is maintained at the initial value. After completion of the count-up operation, the count value of binary counter 40 is reset to the initial value.

Figure 11:
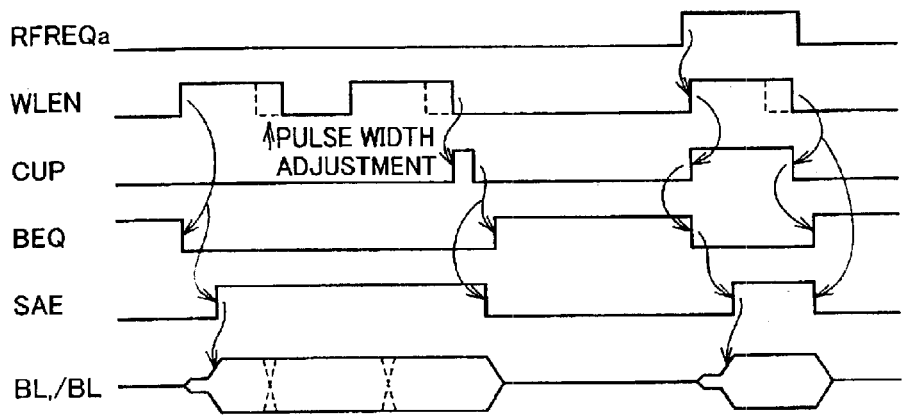
FIG. 11 is a signal waveform diagram representing an operation of the word selection control circuit shown in FIG. 10.

Bit line equalize control circuit 32 includes a set/reset flip flop 32a which is set in response to the falling of output signal CUP of binary counter 40 or transfer gate 42 and is reset in response to the rising of word line enable signal WLEN. From output Q of set/reset flip flop 32a, bit line equalize instruction signal BEQ is outputted. The activation level of bit line equalize instruction signal BEQ may be set to a voltage level higher than the power supply voltage by a level shifting circuit. The operation of word selection control circuit 25 shown in FIG. 10 will be described by referring to the timing chart shown in FIG. 11.

In the case of writing data, not-shown write instruction WE is driven to the active state and word line enable signal WLEN is accordingly driven to the activate state. In response to the activation of word line enable signal WLEN, set/reset flip flop 32a is reset, bit line equalize instruction signal BEQ accordingly goes low, and the bit line precharging operation is completed.

Subsequently, a word line (even-numbered word line) is driven to a selected state in accordance with an address signal, and each bit in a selected word is read onto corresponding bit lines BL and /BL. Then, set/reset flip flop 35a in sense amplifier control circuit 35 is set in response to the output signal of delay circuit 34 shown in FIG. 8, and sense amplifier activate signal SE is activated.

The potentials of bit lines BL and /BL are sensed and amplified by the sense amplifier and change to the power supply voltage and ground voltage levels. In this state, the first data writing operation is performed and the potentials of bit lines BL and /BL are set to the levels according to the write data. The driving power of the sense amplifier (SA) is smaller than that of the write driver for writing data, and latch data in the sense amplifier changes according to the write data (when reverse data is written).

After completion of the first data writing operation, even when word line enable signal WLEN is driven to the inactive state, count-up signal CUP of binary counter 40 is at the L level and unchanged. Consequently, set/reset flip flops 32a and 35a maintain the reset state and the set state, respectively, bit line equalize instruction signal BEQ maintains the inactive state, and sense amplifier enable signal SAE maintains the activate state.

In this state, again, according to an externally applied write instruction, word line enable signal WLEN is activated, a word line selecting operation is performed according to an external address signal, and data is written to a twin cell connected to an odd-numbered word line.

Even when an output signal of delay circuit 34 rises, set/reset flip flop 35a in control circuit 35 is in the set state, and sense amplifier enable signal SAE maintains the active state. The latched data of the sense amplifier is set to the voltage level according to a write data bit, and data is written to a selected twin cell TW1.

After completion of writing of the write data bits, in response to the falling of word line enable signal WLEN, output signal CUP of binary counter 40 is generated in a one-shot pulse form. In response to the falling of count-up instruction signal CUP, set/reset flip flop 32a is set and bit line equalize signal BEQ is activated. In response to the falling of count-up signal CUP, set/reset flip flop 35a is reset, and sense amplifier enable signal SAE is made inactive, thereby completing the data bit writing.

In a refresh operation, refresh request RFREQ is generated and accordingly, refresh enable signal RFREQa is maintained at the H level for a predetermined period. In this case, transfer gate 42 is made conductive to transfer word line enable signal WLEN as count-up signal CUP. The count value of binary counter 40 is maintained at the initial value and binary counter 40 maintains a reset state. Therefore, in the refresh operation, in response to the rising of word line enable signal WLEN, bit line equalize instruction signal BEQ is made inactive. Subsequently, according to the output signal of delay circuit 34, set/reset flip flop 35a is set and 'sense amplifier enable signal SAE is made active.

When word line enable signal WLEN is made inactive, set/reset flip flop 35a is reset in response to the falling edge (inactivation) of word line enable signal WLEN, and sense amplifier enable signal SAE is made inactive. Set/reset flip flop 32a is set and bit line equalize instruction signal BEQ is made active.

Timings to make sense amplifier enable signal SAE inactive and to make bit line equalize instruction signal BEQ active are appropriately adjusted by using a not-shown delay circuit. After inactivating the sense amplifier, a bit line equalize operation is executed.

In the refresh operation, the sense amplifier and the bit line precharge/equalize circuit are made active/inactive for each twin cell, thereby preventing collision of storage data. Thus, storage data can be refreshed accurately.

Figure 4:
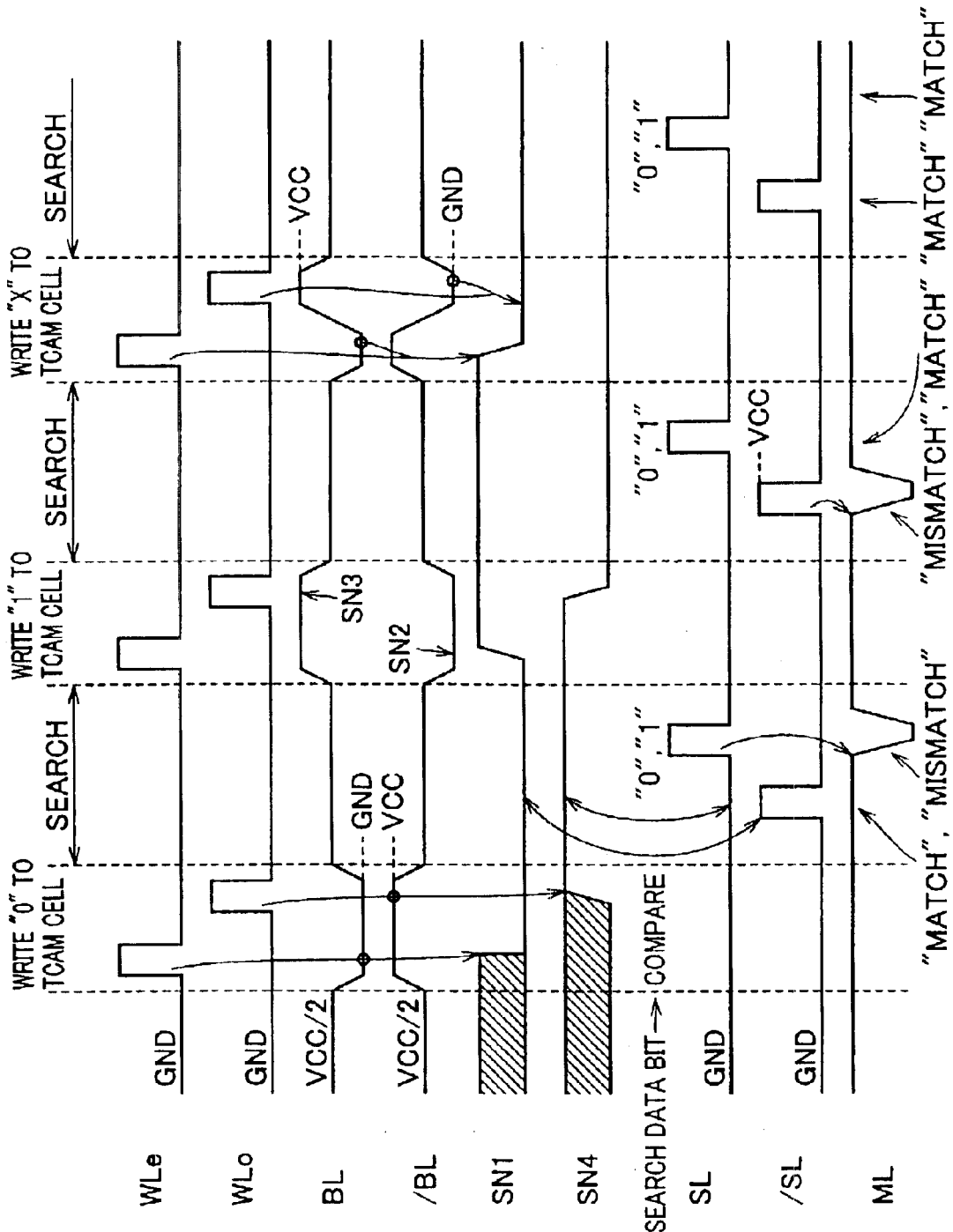
FIG. 4 is a timing chart representing operations of writing and retrieving data of the TCAM cell shown in FIG. 1.

In the case of using the configuration shown in FIG. 10, in writing a data bit, as shown in the timing chart of FIG. 4, data can be written by statically driving the bit line in accordance with write data. When a condition that an even-numbered word line and an odd-numbered word line are not selected overlappingly is satisfied, time required for data writing can be shortened, as compared with the case of performing bit line precharging.

In the configuration shown in FIG. 10, in the refresh operation, activation/inactivation of bit line equalize instruction signal BEQ and sense amplifier enable signal SAE is adjusted by using word line enable signal WLEN. In this case, in writing data, activation/inactivation of bit line equalize instruction signal BEQ and sense amplifier enable signal is controlled by utilizing the falling of count-up signal CUP from binary counter 40. Consequently, the pulse width of word line enable signal WLEN supplied to binary counter 40 may be set to be shorter than that of the word line enable signal supplied to row decoder control circuit 33 in FIG. 8. In the refresh operation, data is not written. Consequently, even if the sell selection period is shortened, no problem occurs. In the case of assuring the refresh period with reliability, the activation period of word line enable signal WLEN supplied to binary counter 40 in refreshing and that in data writing are made different from each other.

In the date write operation, with respect to external address signal A[i:0], the following alternative configuration may be employed: an address signal designating the address of a word is applied and an address bit specifying an even-numbered/odd-numbered word line is generated by using, for example, a binary counter as shown in FIG. 10 in the TCAM and added at the least significant bit position of the word address signal, to generate an internal address. In this case, it is sufficient for an external memory controller to transfer ternary data in two bit notation to the same address. The address does not have to be changed for each write cycle. Thus, control is facilitated and, moreover, the width of an external address bus can be narrowed.

Modification of Refresh

In the configuration of the refresh control unit shown in FIG. 7, refresh control circuit 20 generates refresh request RFREQ in accordance with refresh instruction AREF externally applied. In this case, it is desirable to refresh storage data in four dynamic cells of one TCAM cell concurrently in accordance with refresh instruction AREF, thereby making the data storage states in the TCAM cell the same in each refresh cycle. In a modification of the refresh control, in generating a refresh instruction or refresh request, refresh is executed in a word unit.

Figure 12:
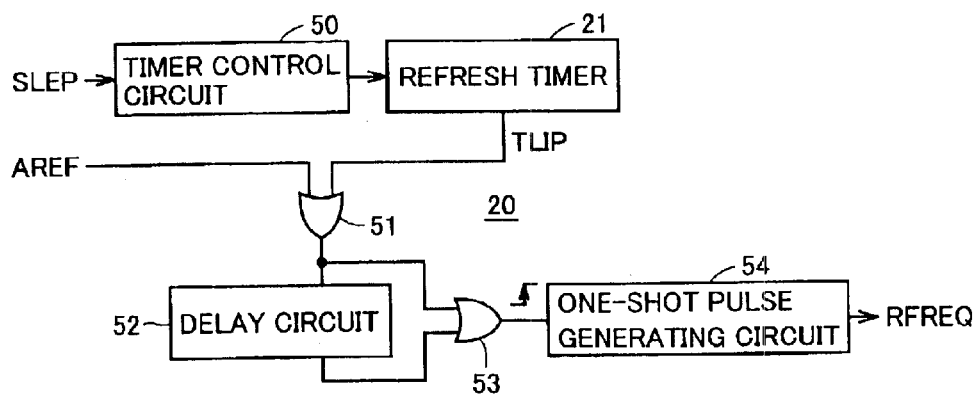
FIG. 12 is a diagram showing a modification of a refresh control circuit shown in FIG. 7.

FIG. 12 is a diagram schematically showing the configuration of a modification of refresh control circuit 20 shown in FIG. 7. In FIG. 12, refresh control circuit 20 includes: a timer control circuit 50 for controlling activation/inactivation of refresh timer 21 in accordance with sleep mode instruction SLEP; an OR circuit 51 receiving refresh instruction AREF and a time-up signal TUP from refresh timer 21; a delay circuit 52 for delaying an output signal of OR circuit 51 by a predetermined time; an OR circuit 53 receiving an output signal of OR circuit 51 and an output signal of delay circuit 52; and a one-shot pulse generating circuit 54 for generating refresh request RFREQ in the form of a one-shot pulse signal in response to the rising of an output signal of OR circuit 53.

Timer control circuit 50 maintains refresh timer 21 in an active state when sleep mode instruction SLEP is active. When activated, refresh timer 21 performs a count operation. When the count value achieves predetermined count, refresh timer 21 generates time-up signal TUP.

Figure 13:
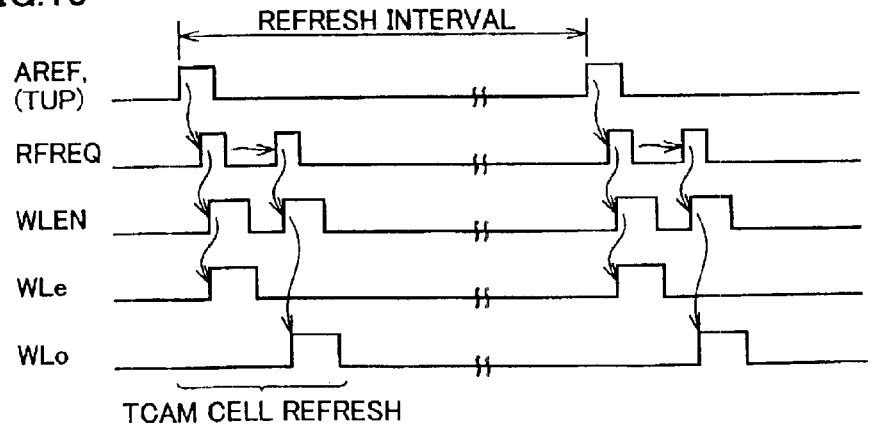
FIG. 13 is a timing chart representing an operation of the refresh control circuit shown in FIG. 12.

Delay circuit 52 has a delay time required to performing rewriting of data for one twin cell, that is, delay time which is equal to or longer than a sum of an active period of word line enable signal WLEN and a period required for bit line precharge. The operation of refresh control circuit 20 shown in FIG. 12 will be described, referring to the timing chart of FIG. 13.

When refresh instruction AREF (or time-up signal TUP) is activated, the output signal of OR circuit 51 rises H level and, accordingly, in response to the rising of an output signal of OR circuit 53, one-shot pulse generating circuit 54 activates refresh request RFREQ. According to refresh request RFREQ of the first time, word line enable signal WLEN is activated in the word selection control circuit shown in FIG. 8, even-numbered word line WLe designated by the refresh address is responsively driven to the active state, and data stored in twin cells (TW0) in TCAM cells connected to selected even-numbered word line WLe is refreshed.

When word line enable signal WLEN is made inactive after a predetermined time, even-numbered word line WLe is responsively made inactive, to complete refreshing of data stored in twin cells connected to even-numbered word line WLe.

After a predetermined time since the refresh operation on the memory cells connected to even-numbered word line WLe is completed, that is, after completion of the bit line precharge, the output signal of delay circuit 52 rises to H level and, responsively, the output signal of OR circuit 53 rises to H level (is activated). Responsively, one-shot pulse generating circuit 54 activates refresh request RFREQ again. According to refresh request RFREQ, word line enable signal WLEN is activated again. In response to activation of word line enable signal WLEN of the second time, even-numbered word line WLo is driven to the selected state in accordance with a refresh address, and data stored in the twin cells connected to the selected odd-numbered word line WLo is refreshed. After lapse of a predetermined time, word line enable signal WLEN is made inactive and, responsively, selected odd-numbered word line WLo is driven to a not-selected state, thereby completing the refresh of the data stored in the TCAM cells.

Subsequently, at predetermined time intervals (refresh intervals), refresh instruction AREF or time-up signal TUP is activated and data stored in the TCAM cells are refreshed.

Therefore, in the case of the configuration shown in FIG. 12, in the TCAM cell, data stored in two twin cells TW0 and TW1 is refreshed in the same refresh cycle, and the storage states of the internal twin cells can be made substantially the same, so that an accurate compare and search operation can be ensured.

A burst refresh mode of successively refreshing a plurality of words when refresh instruction AREF is supplied once externally may be also used. In the burst refresh mode, simply, an oscillation circuit such as a ring oscillator is used and refresh request RFREQ is generated a plurality of times internally at predetermined time intervals. After a predetermined number of refresh requests are generated, the oscillating operation of the oscillating circuit is stopped. By using such configuration, the burst refresh mode can be easily implemented.

Figure 14:
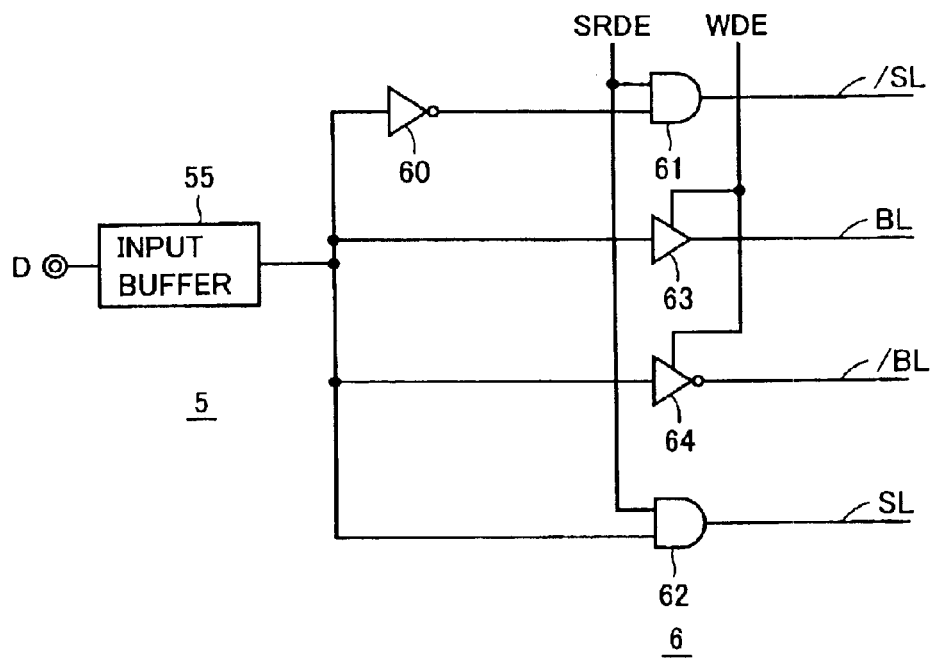
FIG. 14 is a diagram showing the configuration of a search line driver/write driver circuit shown in FIG. 6.

FIG. 14 is a diagram schematically showing the configuration of search line driver/write driver circuit 6 shown in FIG. 6. FIG. 14 shows the configuration of a part related to one-bit storage and search data.

In FIG. 14, search line driver/write driver circuit 6 includes: an inverter 60 for inverting data supplied from an input buffer 55; an AND circuit 61 for driving search line /SL in accordance with an output signal of inverter 60 when a search driver enable signal SRDE is activated; an AND circuit 62 for driving search line SL in accordance with data from input buffer 55 when search driver enable signal SRDE is activated; a tri-state buffer 63 for driving bit line BL in accordance with internal data from input buffer 55 when write driver enable signal WDE is activated; and a tri-state inverter buffer 64 for driving bit line /BL in accordance with data from input buffer 55 when write driver enable signal WDE is activated.

Input buffer 55 is included in data buffer 5 shown in FIG. 6, buffers data D externally applied and generates internal data. Input buffer 55 is provided commonly for search data and write data. The operation of the circuit shown in FIG. 14 will now be described, referring to the timing chart of FIG. 15.

In writing data, write instruction WE is supplied. In response to activation of write instruction WE, address signal A[i:0] and data D supplied externally are taken in and an internal process is executed. In the data write operation, first, an address E and write data De for an even-numbered word line are supplied. In accordance with write instruction WE, write driver enable signal WDE is kept to an active state for a predetermined period, and bit lines BL and /BL are driven in accordance with write data De. According to address E and write data De, data is written to twin cell TW0 in the selected TCAM cell.

After lapse of the predetermined period, write instruction WE is applied again and, according to an address O and write data Do currently applied, an internal address and internal write data are generated. Write instruction WE of the second time is a write instruction to an odd-numbered word line. In response to write instruction WE, write driver enable signal WDE is activated again and tri-state buffer 63 and tri-state inverter buffer 64 drive bit lines BL and /BL in accordance with data Do supplied from input buffer 55. Then, the writing of data to twin cell TW1 of the TCAM cell connected to bit lines BL and /BL is completed. When write driver enable signal WDE attains an inactive state, tri-state buffer 63 and tri-state inverter buffer 64 enter an output high impedance state, and bit lines BL and /BL are precharged and equalized to the intermediate voltage VBL level by the bit line precharge/equalize circuit.

In data writing, bit lines BL and /BL are statically driven according to write data. Therefore, for the configuration of the word selection control circuit, the configuration shown in FIG. 10 is used. When the word selection control circuit shown in FIG. 8 is used, bit lines BL and /BL are dynamically driven, and after completion of writing data De, they are once reset to the precharge voltage level. The sense amplifier is also once made inactive.

In the data write operation, search driver enable signal SRDE is in an inactive state and both search lines /SL and SL are maintained at the ground voltage level. By fixing search data lines SL and /SL to the ground voltage level at the time of writing data, capacitive coupling between bit lines of adjacent columns can be prevented and data can be accurately written. Also in the refresh operation, capacitive coupling between bit lines is suppressed by search lines SL and /SL, and fluctuations in the bit line potentials caused by capacitive coupling between the bit lines at the time of a sensing operation can be suppressed. Thus, storage data can be refreshed accurately.

In a search operation, a search instruction SRCH is applied. In this case, address signal A[i:0] is not applied. According to search data Ds, a search operation is executed in the TCAM array. In response to search instruction SRCH, search driver enable signal SRDE is held at an active state for a predetermined period, and AND circuits 61 and 62 drive search lines /SL and SL in accordance with data supplied from inverter 60 and input buffer 55. According to the potentials on search lines SL and /SL, a compare and search operation is performed on each TCAM cell, and a not-shown match line is charged or discharged. After completion of the search operation, search driver enable signal SRDE is made inactive, and search lines /SL and SL are again fixed to the ground voltage level by AND circuits 61 and 62.

In the search operation, bit lines BL and /BL are maintained at the intermediate voltage VBL level by a not-shown bit line precharge/equalize circuit. Therefore, bit lines BL and /BL function as a shield layer for search lines SL and /SL in the search operation, so that capacitive coupling between the search lines can be prevented, and the compare and search operation can be performed accurately in accordance with search data.

Figure 15:
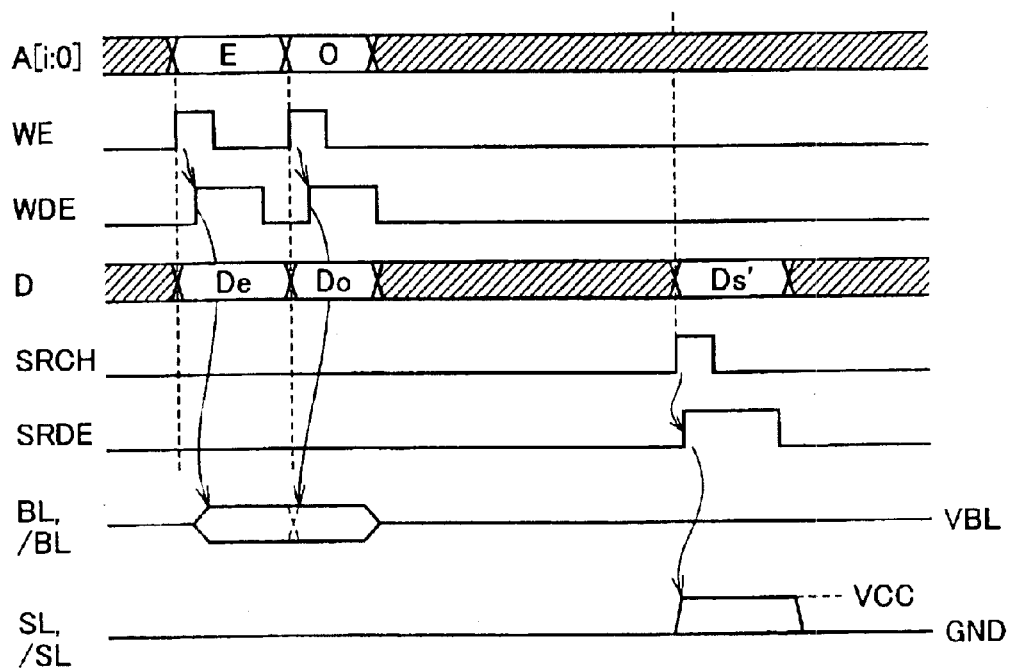
FIG. 15 is a timing chart representing an operation of the search line driver/write driver circuit shown in FIG. 14.

In the timing chart of FIG. 15, address signal A[i:0] is generated and supplied as an address signal specifying an even-numbered word line or an odd-numbered word line. However, address signal A[i:0] may specify a word and an even-numbered/odd-numbered word line may be specified internally, for example, in accordance with a count of a counter for counting the number of write instructions WE. In this case, a configuration of using the count of a binary counter as the least significant address bit to designate an even-numbered/odd-numbered word line may be also employed. In this case, address signal A[i:0] externally applied is set to the same address (word address) during the period in which write instruction WE is supplied twice in a data write cycle.

Layout of TCAM Cell

Figure 16:
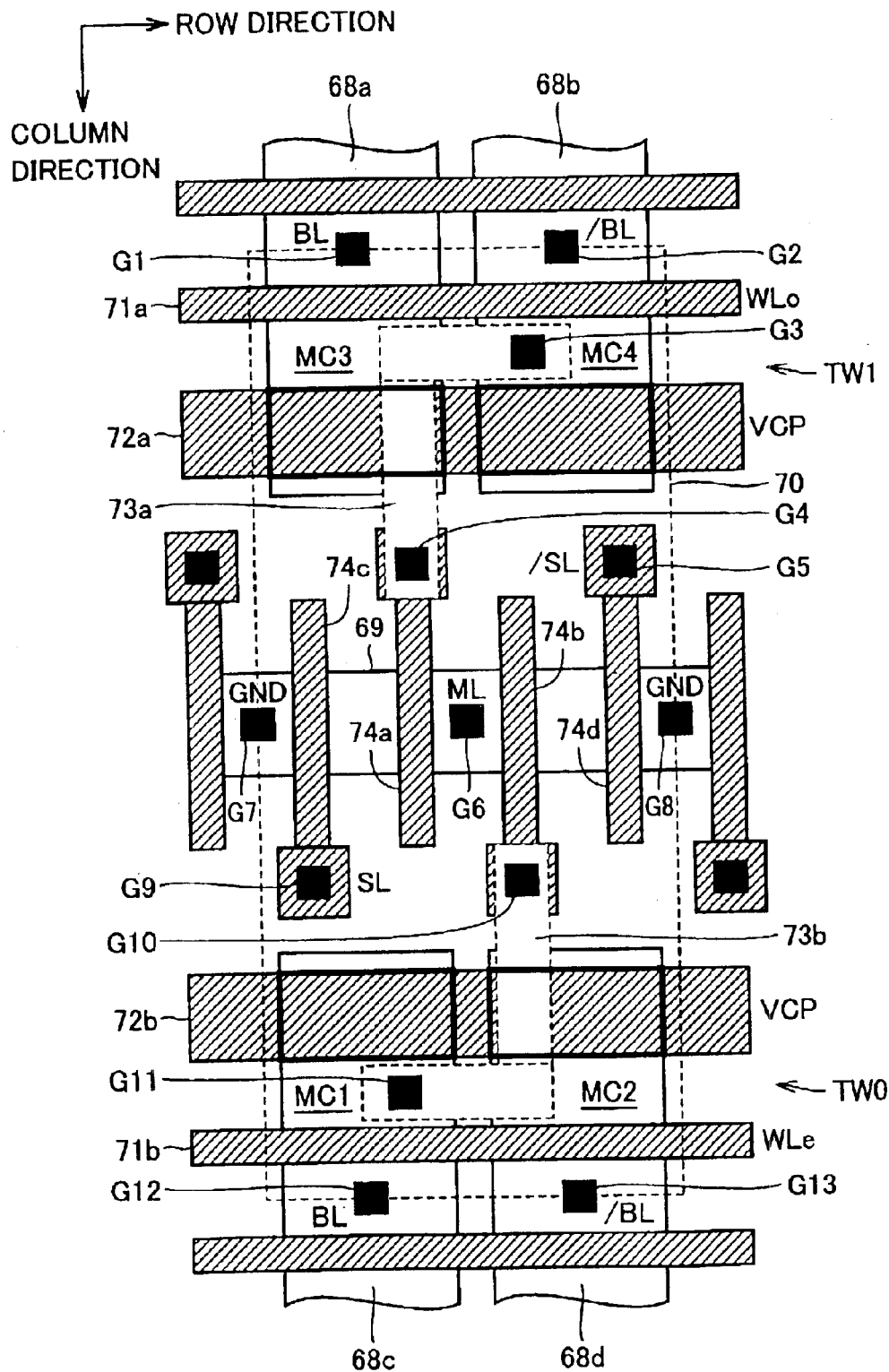
FIG. 16 is a diagram schematically showing a planar layout of the TCAM cell shown in FIG. 1.

FIG. 16 is a diagram schematically showing a plane layout of the TCAM cell according to the first embodiment of the present invention. In FIG. 16, N-type active regions 68a and 68b are disposed on one of short sides of a rectangular region 70 indicated by a broken line, and N-type active regions 68c and 68d are formed on the other short side of rectangular region 70. By rectangular region 70, the region of one TCAM cell is defined, and the layout of rectangular region 70 is repeatedly disposed in the row and column directions. The TCAM cell is formed in a P-well region, which is disposed commonly to the TCAM cells of the TCAM array. Therefore, the rectangular region only is repeatedly disposed and a well isolation region does not exist, so that the area occupied by the TCAM array can be reduced.

The "active region" includes an impurity region and a substrate region under a gate electrode, and specifies a region in which charges move at the surface of the substrate region.

In N-type active regions 68a and 68b, dynamic cells MC3 and MC4 are formed, respectively. In N-type active regions 68c and 68d, dynamic cells MC1 and MC2 are formed, respectively. Each of N-type active regions 68a to 68d includes an N-type impurity region and a channel region for an access transistor. N-type active regions 68a and 68b are connected to not-shown bit lines BL and /BL via contacts G1 and G2, respectively. Bit line contacts G1 and G2 are shared by adjacent dynamic cells formed in active regions. Only the layout of word lines disposed for dynamic cells adjacent in the column direction is shown in FIG. 16.

Bit lines BL and /BL are formed of, for example, first metal lines and linearly extend in the column direction in FIG. 16. A gate electrode line 71a formed of, for example, polysilicon (polycrystalline silicon) is formed extending in the row direction over N-type active regions 68a and 68b. In parallel with gate electrode line 71a, a cell plate electrode line 72a formed of polysilicon is formed extending in the row direction over N-type active regions 68a and 68b. To cell plate electrode line 72a, cell plate voltage VCP is transmitted. The width of cell plate electrode line 72a is made wider than gate electrode line 71a, so as to make the capacitance value of the memory cell capacitor sufficiently large.

Gate electrode line 71a is used as word line WLo. In an area where cell plate electrode line 72a and N-type active regions 68a and 68b face each other, memory cell capacitors are formed.

In N-type active region 68b, an impurity region between lines 71a and 72a is electrically connected to a first metal line 73a via a contact G3. First metal line 73a has a reversed L shape and transmits a voltage of storage node (SN4) to a comparing circuit which will be described later.

A gate electrode line 71b is formed traversing N-type active regions 68c and 68d. In parallel with gate electrode line 71b, a cell plate electrode line 72b is disposed extending in the row direction. Gate electrode line 71b is used as word line WLe, and cell plate electrode line 72b transmits cell plate electrode VCP.

In an area where N-type active regions 68c and 68d and cell plate electrode line 72b face each other, capacitors of memory cells MC1 and MC2 are formed. The width of cell plate electrode line 72b is the same as that of cell plate electrode line 72a, so that planar MIS capacitors having the same capacitance value are formed in dynamic cells.

In N-type active region 68c of dynamic cell MC1, at an area between the lines 71b and 72b, the impurity region is electrically connected to a first metal line 73b having a reversed L shape via a contact G11. First metal line 73b is used to transmit the potential on storage node SN1 in twin cell TW0 to the comparing circuit.

In a center region of rectangular region 70, an N-type active region 69 is continuously formed in the row direction. N-type active region 69 extends continuously in the row direction and is disposed commonly to TCAM cells of a word. In this region, even if the comparing circuit is disposed, comparing circuits adjacent in the row direction are isolated from each other in a logic operation by an impurity region connected to a ground line (GND) which will be described later. Even when an active region is continuously disposed common to the comparing circuits, each of the comparing circuits can perform a compare and search operation individually and separately.

Gate electrode lines 74a to 74d are formed traversing N-type active region 69. Gate electrode lines 74a to 74d each construct a gate of an MIS transistor in a comparing circuit and are disposed extending in the row direction only in the vicinity of active region 69.

Gate electrode line 74a is electrically connected to first metal line 73a via contact G4, and gate electrode line 74b is electrically elected to first metal line 73b via a contact G10. In a region between gate electrode lines 74a and 74b, a contact G6 to match line ML is formed. Match line ML is constructed by a first or second metal line in an upper layer, extends continuously in the row direction, and is connected commonly to a word of a corresponding row.

Gate electrode line 74c is electrically connected to search line SL via contact 69, and gate electrode line 74d is electrically connected to search line /SL via a contact G5.

In a manner similar to bit lines BL and /BL, search lines SL and /SL linearly extend in the column direction and are disposed commonly to TCAM cells arranged in the column direction. Search lines SL and /SL and bit lines BL and /BL may be interconnection lines (for example, second metal lines) of the same interconnection layer or the lines of different interconnection layers.

On the outsides of gate electrode lines 74c and 74d, contacts G7 and G8 are formed, through which an impurity region corresponding to N-type active region 69 is electrically connected to ground lines for transmitting ground voltage GND. The ground lines for transmitting ground voltage GND may be also arranged extending in the column direction or extending linearly in the row direction by using the second metal lines.

In active regions 68a to 68d and active region 69, when gate electrode lines 71a and 71b and gate electrode lines 74a to 74d are in the not-selected state, a channel region is not formed at the substrate region surface immediately below the gate electrode lines, so that the impurity regions are electrically isolated from each other.

In the configuration of the TCAM cell shown in FIG. 16, a layout is disposed symmetrically with respect to contact G6 for match line ML. Therefore, as a layout pattern, rectangular region 70 is repeatedly disposed, so that a regular layout pattern is formed and patterning of the TCAM cell is facilitated.

By disposing N-type active region 69 for constructing the comparing circuit in a region between the N-type active regions 68a and 68b forming memory cells MC3 and MC4 and the N-type active regions 68c and 68d forming memory cells MC1 and MC2, the lengths of first metal lines 73a and 73b for transmitting storage data of twin cells TW0 and TW1 can be made the same, and comparison data can be transmitted with the same line resistance to comparison nodes (NA and NB) of the comparing circuit.

Each of N-type active regions 68a to 68d is shared by the TCAM cells adjacent in the column direction. Consequently, contacts G1, G2, G12 and G13 for connecting TCAM cells to bit lines BL and /BL can be shared by adjacent TCAM cells, and the layout area of the TCAM cells can be reduced.

In active region 69, contacts G7 and G8 to the ground lines are shared by adjacent TCAM cells, so that the layout area of the comparing circuit can be similarly reduced. Thus, the layout area of the TCAM cell can be reduced.

In the comparing circuit, it is sufficient to simply arrange N-type active region 69 so as to linearly extend in the row direction, to arrange the gate electrode for forming each transistor of the comparing circuit, extending in the column direction in the TCAM cell region. The layout of the comparing circuit is simplified and accordingly, the layout of the TCAM cell is facilitated.

In the layout shown in FIG. 16, bit lines BL and /BL and search lines SL and /SL and match line ML are formed in different interconnection layers, for the reason that bit lines BL and /BL and search lines SL and /SL extend linearly in the column direction, whereas match line ML extends continuously in the row direction.

The ground line for transmitting ground voltage GND may be disposed extending in the row direction in parallel with match line ML. Bit lines BL and /BL and search lines SL and /SL do not have to be disposed to linearly extend in the column direction, but may be formed having their positions displaced from each other so as to be disposed at sufficient pitches in the TCAM cell array region, for example, in a zigzag shape in the column direction.

The layout of bit lines BL and /BL, search lines SL and /SL, match line ML, and the ground line in the upper layer of the TCAM cells may be appropriately determined in accordance with the pitch of the lines and the number of available metal lines.

Figure 17:
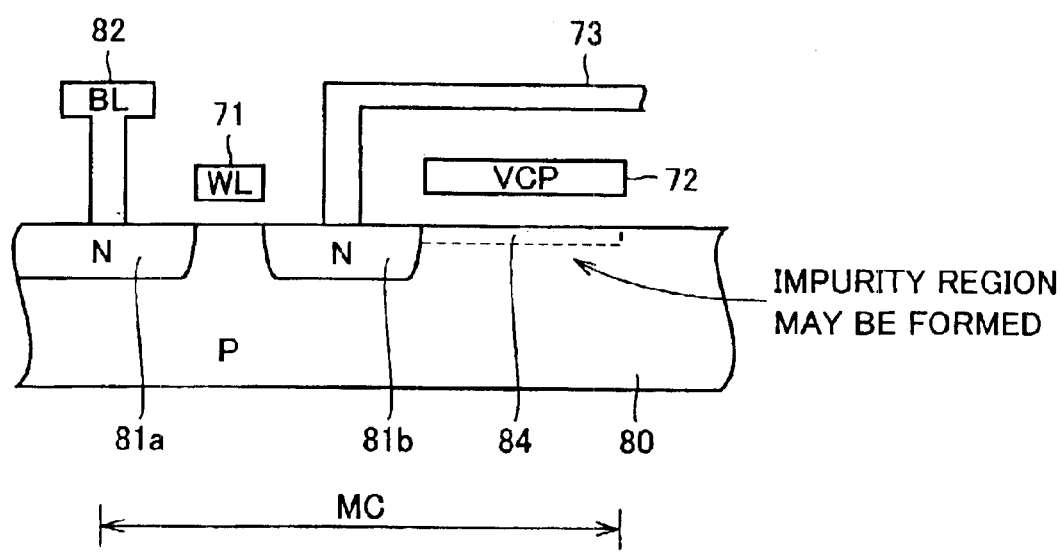
FIG. 17 is a diagram schematically showing a sectional structure of a dynamic cell of the TCAM cell shown in FIG. 1.

FIG. 17 is a diagram schematically showing a sectional structure of one dynamic cell in the layout shown in FIG. 16. In FIG. 17, dynamic cell MC includes: N-type impurity regions 81a and 81b formed with a spacing at the surface of a P-well 80; a gate electrode line 71 formed between impurity regions 81a and 81b with a not-shown gate insulating film laid thereunder; and a cell plate electrode line 72 formed above the surface of P-well 80 adjacent to impurity region 81b.

Impurity region 81a is electrically connected to a bit line 82, and impurity region 81b is electrically connected to node (NA or NB) of the comparing circuit via a first metal line 73.

Gate electrode line 71 and cell plate electrode line 72 may be constructed by the interconnection lines in the same interconnection layer or formed in different interconnection layers. At the surface of P-well 80 facing capacitor electrode line 72, an inversion layer 84 is formed when cell plate voltage VCP (=VCC) is applied, and functions as a storage node of the capacitor.

Therefore, the memory cell capacitor is formed of a planar capacitor constructed by inversion layer 84 at the surface of P-well 80, cell plate electrode line 72, and the capacitor insulating film between inversion layer 84 and cell plate electrode line 72. Cell plate electrode line 72 is in a lower layer region than first metal line 73 for transferring storage data, and dynamic cell MC can be formed using a general CMOS process.

Conductive line 82 constructing bit line BL and first metal line 73 may be formed in the same interconnection layer or in different interconnection layers.

In the sectional structure of memory cell MC shown in FIG. 17, inversion layer 84 is formed in the region adjacent to impurity region 81b. However, impurity region 81b may be formed extending to a region facing cell plate electrode line 72. That is, an N-type impurity layer may be formed also at the surface of the well region facing cell plate electrode line 72.

The gate insulating film formed immediately below gate electrode line 71 and the capacitor insulating film formed under cell plate electrode line 72 may be formed of the same material or of different materials.

According to the first embodiment of the present invention as described above, one bit of storage data is stored by using two twin cells, complementary data are normally transmitted to bit lines, and a planar MIS capacitor can be used as a memory cell capacitor. Therefore, as compared with the case of using an SRAM cell, the chip area can be reduced, and a TCAM having higher immunity against a soft error can be implemented. As compared with a dynamic TCAM using a conventional dynamic cell, it is unnecessary to form a stacked capacitor, the number of process steps and the number of masks can be reduced, the capacitance value of the memory cell capacitor can be also reduced, and write speed can be significantly increased.

Second Embodiment

Figure 18:
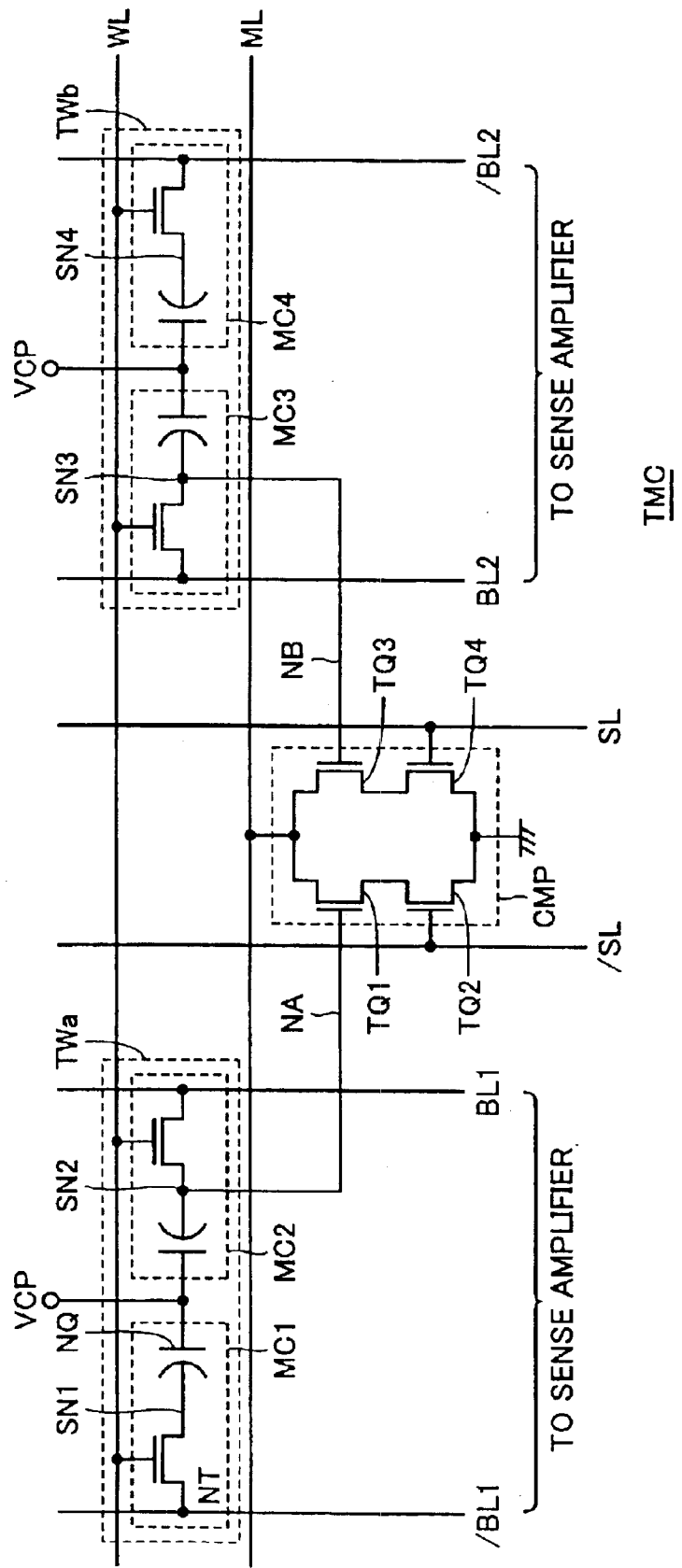
FIG. 18 is a diagram showing the configuration of a TCAM cell according to a second embodiment of the present invention.

FIG. 18 is a diagram showing the configuration of a TCAM cell according to a second embodiment of the present invention. In the configuration of the TCAM cell shown in FIG. 18, two twin cells TWa and TWb are used. Word line WL is disposed so as to be shared by twin cells TWa and TWb.

Twin cell TWa includes dynamic cells MC1 and MC2, and twin cell TWb includes dynamic cells MC3 and MC4. The configurations of memory cells MC1 to MC4 included in twin cells TWa and TWb are the same as those of dynamic cells MC1 to MC4 of twin cells TW0 and TW1 in the first embodiment. Specifically, each of memory cells MC1 to MC4 includes a planar MIS capacitor NQ, and access transistor NT constructed by an N-channel MIS transistor for connecting memory capacitor NQ to a corresponding bit line in response to a signal potential on word line WL.

Bit lines /BL1 and BL1 are provided for twin cell TWa, and bit lines BL2 and /BL2 are provided for twin cell TWb. To bit lines BL1 and /BL1 and bit lines BL2 and /BL2, at the time of writing data, write data are transmitted in parallel and at the time of refresh, a refresh operation is executed in parallel.

Comparing circuit CMP includes N-channel MIS transistors TQ1 and TQ2 connected in series between match line ML and the ground node, and MIS transistors TQ3 and TQ4 connected in series between match line ML and the ground node. The gates of MIS transistors TQ1 and TQ3 are connected to storage nodes SN2 and SN3 of dynamic cells MC2 and MC3, respectively. The gates of MIS transistors TQ2 and TQ4 are connected to search lines /SL and SL, respectively.

The TCAM cell shown in FIG. 18 has a "double twin cell type" TCAM cell structure constructed by two twin cells in a manner similar to the first embodiment. However, word line WL is disposed commonly to two twin cells TWa and TWb, and the pair of bit lines BL1 and /BL1 and the pair of bit lines BL2 and /BL2 are provided for twin cells TWa and TWb, respectively. Therefore, by selecting word line WL once, data can be written and the number of write cycles can be reduced.

Figures 19, 20:
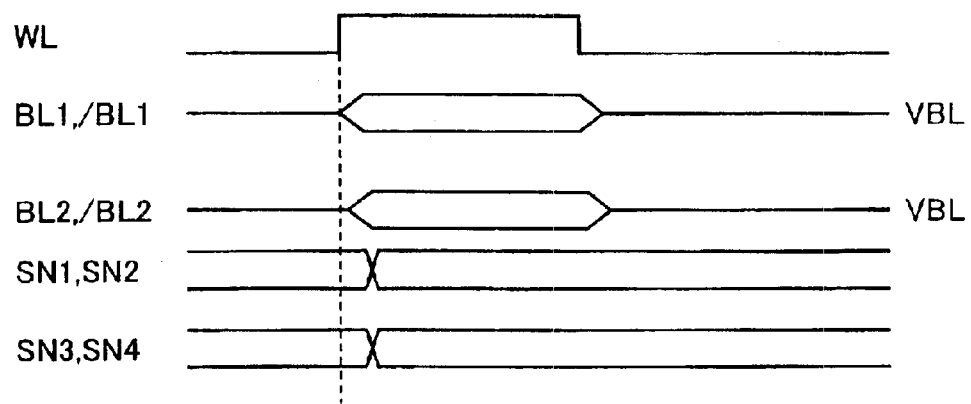
FIG. 19 is a diagram representing, in a table form, the relationship between storage data bits of the TCAM cell shown in FIG. 18 and voltages of storage nodes.
FIG. 20 is a signal waveform diagram representing a data write operation of the TCAM cell shown in FIG. 18.

FIG. 19 is a diagram showing a table of the relations between storage data bits of the TCAM cell shown in FIG. 18 and potentials of storage nodes SN1 to SN4. With reference to FIG. 19, the relationship between storage data bits of the TCAM cell shown in FIG. 18 and the voltages of the storage nodes will be briefly described.

In the case of storing the bit "1" in the TCAM cell, L-level data and H-level data are stored in storage nodes SN1 and SN2, respectively, and L-level data and H-level data are stored in storage nodes SN3 and SN4, respectively.

In the case of storing the data bit "0" in the TCAM cell, H-level data and L-level data is stored in storage nodes SN1 and SN2, respectively, and H-level data and L-level data are stored in storage nodes SN3 and SN4, respectively.

In the case of storing the "don't care" state, that is, the "X" state, H-level data is stored in storage nodes SN1 and SN4, and L-level data is written in storage nodes SN2 and SN3.

In a search operation, data corresponding to a search data bit is transmitted to search line SL.

When "1" is transmitted as a search data bit, the voltage of search line SL rises to H level and the voltage of search line /SL falls to L level. When storage node SN3 stores H-level data, match line ML is discharged to the ground voltage level via MIS transistors TQ3 and TQ4, and a mismatch is detected. When storage node SN3 stores L-level data, match line ML maintains the precharge voltage level and a match is detected.

When the search data bit is "0", search line SL is set to the L level, and search line /SL is set to the H level. Therefore, when storage node SN2 stores L-level data, MIS transistor TQ1 is in a non-conductive state, MIS transistor TQ4 is also in a non-conductive state in accordance with the L-level voltage on search line SL4, match line ML maintains a precharge state, and a match is detected. On the other hand, when H-level data is stored in storage node SN2, both MIS transistors TQ1 and TQ2 are made conductive, match line ML is discharged to the ground voltage level, and a mismatch is detected.

Where both storage nodes SN2 and SN3 store L-level data, in comparing circuit CMP, both MIS transistors TQ1 and TQ3 are in a non-conductive state. Irrespective of the logic value of a search data bit, match line ML maintains the precharge state, and a match is detected.

FIG. 20 is a waveform diagram representing an operation in writing to the TCAM cell shown in FIG. 18. With reference to FIG. 20, the write operation of the TCAM cell shown in FIG. 18 will be briefly described below.

At the time of writing data, word line WL is driven to a selected state, and storage nodes SN1 to SN4 of twin cells TWa and TWb shown in FIG. 18 are electrically coupled to corresponding bit lines /BL1, BL1, BL2 and /BL2, respectively. At a predetermined timing, according to write data, complementary data are transmitted to the pair of bit lines BL1 and /BL1 and to the pair of bit lines BL2 and /BL2 by a not-shown write driver. Data is written into storage nodes SN1 and SN2 in accordance with the complementary data on bit lines BL1 and /BL1. Data is written into storage nodes SN3 and SN4 in accordance with the complementary data on bit lines BL2 and /BL2.

After lapse of a predetermined period, word line WL is driven to a not-selected state and bit lines BL1, /BL1, BL2 and /BL2 are precharged to the predetermined precharge voltage VBL level. In this state, data according to the write data are stored in storage nodes SN1 to SN4, and complementary data are stored in twin cells TWa and TWb, so that data can be stably stored. In the "double twin cell type" TCAM cell constructed by two twin cells, word data of one bit is stored.

A refresh operation is also simultaneously executed on twin cells TW0 and TW1. By disposing a sense amplifier for each bit line pair, twin cells TW0 and TW1 can be simultaneously refreshed. As compared with the configuration of the first embodiment, although the number of sense amplifiers to operate increases, by making operation timings of the sense amplifiers vary between twin cells TW0 and TW1, a leakage current in the sensing operation can be reduced, and the sensing operation can be executed accurately.

A refresh of one word can be completed by performing a refresh operation once, time required for refresh can be shortened, interruption by the refresh to the search operation can be reduced, and a process efficiency can be improved.

In the case of the TCAM cell shown in FIG. 18, the data refresh, data write, and search operations are performed in a manner similar to the first embodiment. As for the configuration for the data refresh, data write, and word selection controls, by simply providing the circuit, which is provided for each of the even-numbered word line and the odd-numbered word line in the first embodiment, for a single word line, the configuration of the word selection control circuit and data write circuit is implemented. As the circuit configuration for a search operation, a configuration similar to that in the first embodiment can be used.

As described above, according to the second embodiment of the present invention, in the double twin cell type TCAM cell, two twin cells are connected to a common word line, and a bit line pair is disposed separately for each of the two twin cells. Therefore, only by one write cycle, a word data bit can be stored, time required for writing a word can be shortened, and interruption time due to data writing to the search operation can be shortened.

Also in the refresh operation, it is unnecessary to drive the even-numbered word line and the odd-numbered word line separately for performing a refresh, so that the control of the refresh is facilitated. In the case of performing the refresh in a word unit, only by driving the word line to the selected state once, a refresh word can be refreshed and time required for the refresh can be shortened.

Third Embodiment

Figures 21, 22:
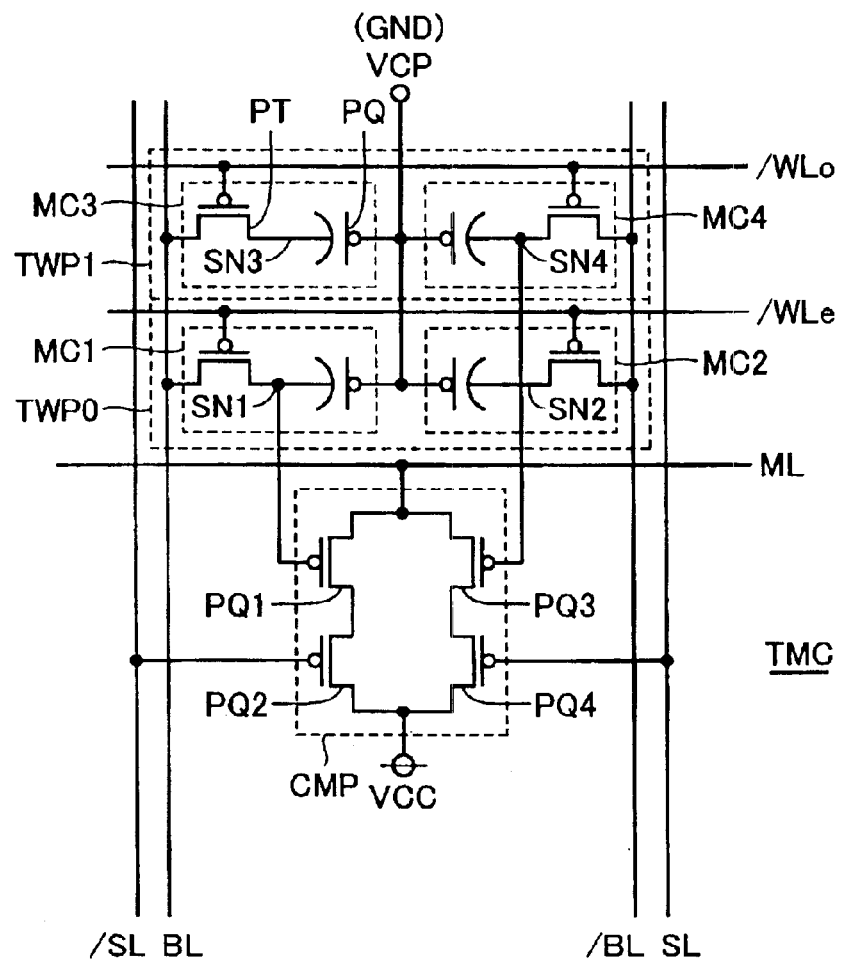
FIG. 21 is a diagram showing the configuration of a TCAM cell according to a third embodiment of the present invention.
FIG. 22 is a diagram representing, in a table form, the relationship between storage data bits of the TCAM cell shown in FIG. 21 and voltages of storage nodes.

FIG. 21 is a diagram showing the configuration of a TCAM cell according to a third embodiment of the present invention. In the TCAM cell shown in FIG. 21, in a manner similar to the first embodiment, two twin cells TWP0 and TWP1 are used as storage elements. Twin cell TWP0 includes dynamic cells MC1 and MC2, and twin cell TWP1 includes dynamic cells MC3 and MC4. The configuration of each of dynamic cells MC1 to MC4 includes a memory capacitor PQ constructed by a P-channel MIS transistor, and an access transistor PT constructed by a P-channel MIS transistor for connecting, when made conductive, corresponding memory capacitor PQ to corresponding bit line BL or /BL. Word line /WLe is disposed for twin cell TWP0, and word line /WLo is disposed for twin cell TWP1.

Comparing circuit CMP includes P-channel MIS transistors PQ1 and PQ2 connected in series between match line /ML and the power supply node, and P-channel MIS transistors PQ3 and PQ4 connected in series between match line /ML and the power supply node. The gates of P-channel MIS transistors PQ1 and PQ3 are connected to storage nodes SN1 and SN4, respectively. The gates of P-channel MIS transistors PQ2 and PQ4 are electrically connected to search lines /SL and SL, respectively. Dynamic cells MC1 and MC3 are connected to bit line BL, and dynamic cells MC2 and MC4 are connected to bit line /BL.

To the cell plate electrode of memory cell capacitor PQ, cell plate voltage VCP at the ground voltage GND level is applied.

The TCAM cell shown in FIG. 21 is equivalent to the TCAM cell shown in FIG. 1 with the N-channel MIS transistors replaced with P-channel MIS transistors. Therefore, word lines /WLe and /WLo rise to H level when not selected, and falls to L level when selected. The voltage level of match line ML attains the ground voltage level at the time of a match and attains the power supply voltage VCC level at the time of a mismatch. Match line /ML is precharged to the ground voltage level.

FIG. 22 is a diagram showing a table of the relationship between storage data bits of the TCAM cell shown in FIG. 21 and voltages of storage nodes SN1 to SN4.

In the case of storing the data bit "1" in the TCAM cell, H-level data and L-level data are stored in storage nodes SN1 and SN2, respectively, and H-level data and L-level data are stored in storage nodes SN3 and SN4, respectively.

In the case of storing the data bit "0", L-level data and H-level data are stored in storage nodes SN1 and SN2, respectively, and L-level data and H-level data are stored in storage nodes SN3 and SN4, respectively.

In the case of storing the "don't care" state, that is, the bit "X", H-level data is stored in storage nodes SN1 and SN4, and L-level data is stored in storage nodes SN2 and SN3.

The data write operation and a search operation are similar to those of the first embodiment except that the selection/non-selection voltage levels of word lines WLe and WLo are reversed and the voltage levels of storage nodes SN1 to SN4 in the "X" state are different.

Therefore, by inverting the logic levels in the configuration of each control circuit in the first embodiment, the control circuit for the TCAM cell in the third embodiment can be implemented.

In the configuration of the TCAM cell shown in FIG. 21, all of components are P-channel MIS transistors and formed at the surface of an N-well. As the layout, a layout similar to that shown in FIG. 16 can be used, except that a power supply line for transmitting a power supply voltage is electrically connected to an active region of a comparing circuit instead of the ground line.

In a CMOS transistor having a gate insulating film made thin, a current which tunnels the gate insulating film increases significantly, and the gate tunnel leakage current is a main component of a leakage current. However, the gate tunnel leakage current in the P-channel MIS transistor is smaller than that in the N-channel MIS transistor, so that refresh time (interval) can be further increased. In memory capacitor PQ, charges for storing data are holes, the minority carriers generated at the time of irradiation with α rays are holes, and the mobility thereof is small and a soft error immunity is high as compared with the N-channel MIS transistor and, therefore, data can be held stably.

A refresh operation, a data write operation, and a search operation are performed in a manner similar to the first embodiment.

As described above, according to the third embodiment of the present invention, as the components of the "double twin cell type" TCAM cell, P-channel MIS transistors are used. In addition to the effects of the first embodiment, refresh time (interval) can be increased, and a soft error immunity can be made higher.

Fourth Embodiment

Figure 23:
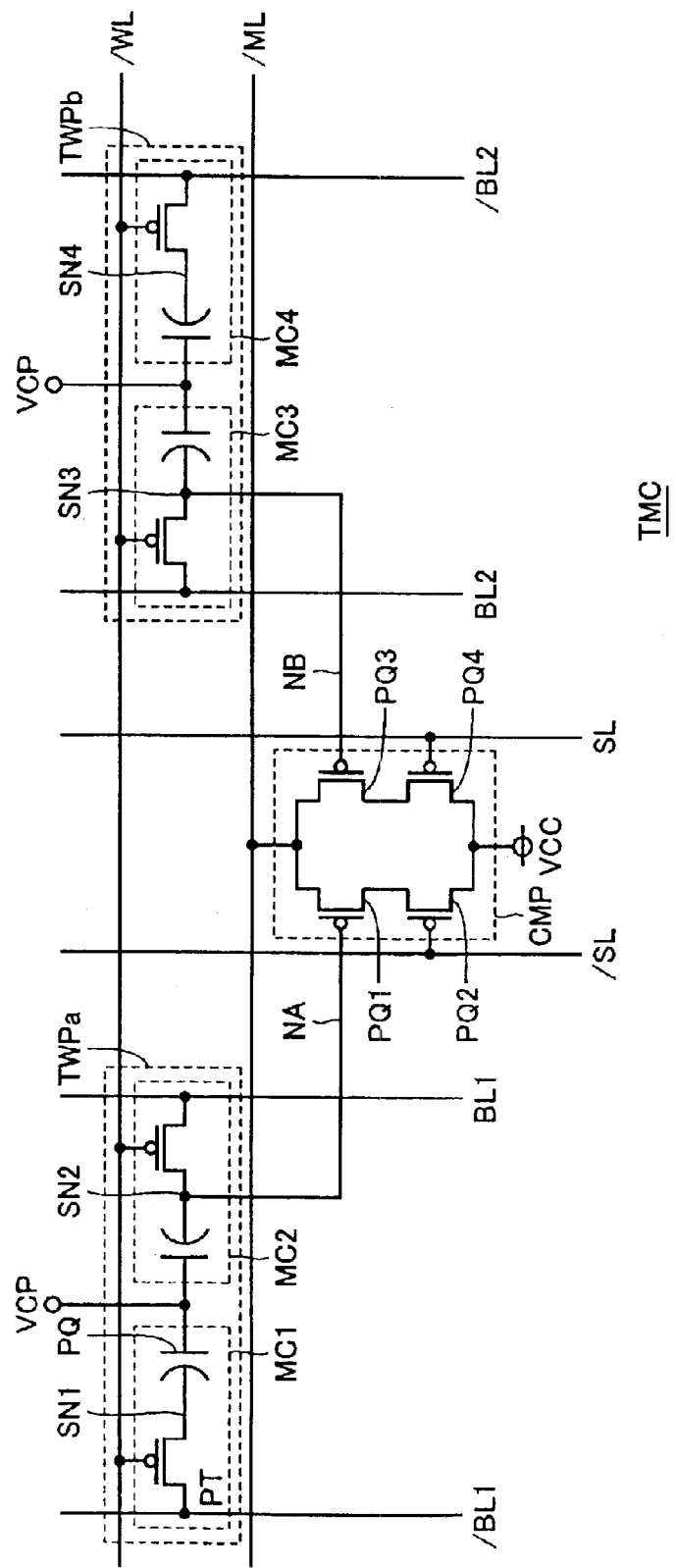
FIG. 23 is a diagram showing the configuration of a TCAM cell according to a fourth embodiment of the present invention.

FIG. 23 is a diagram showing the configuration of a TCAM cell according to a fourth embodiment of the present invention. The TCAM cell shown in FIG. 23 is equivalent to the TCAM cell of the second embodiment shown in FIG. 18 with all of the N-channel MIS transistors replaced with P-channel MIS transistors. Specifically, two twin cells TWPa and TWPb are provided and word line /WL is disposed commonly to twin cells TWPa and TWPb.

Twin cell TWPa includes dynamic cells MC1 and MC2 which store complementary data, and twin cell TWPb includes dynamic cells MC3 and MC4. Complementary data are stored in storage nodes SN1 and SN2 and complementary data are stored in storage nodes SN3 and SN4.

Dynamic cells MC1 and MC2 are connected to bit lines /BL1 and BL1, respectively and dynamic cells MC3 and MC4 are connected to bit lines BL2 and /BL2, respectively.

Each of dynamic cells MC1 to MC4 includes a memory capacitor PQ constructed by a P-channel MIS transistor and an access transistor PT constructed by a P-channel MIS transistor. In twin cells TWPa and TWPb, bit lines are disposed in a manner similar to those in the TCAM cell shown in FIG. 18.

Comparing circuit CMP includes P-channel MIS transistors PQ1 and PQ2 connected in series between match line /ML and the power supply node, and P-channel MIS transistors PQ3 and PQ4 connected in series between match line /ML and the power supply node. The gates of MIS transistors PQ1 and PQ3 are connected to storage nodes SN2 and SN3 via nodes NA and NB, respectively. The gates of MIS transistors PQ2 and PQ4 are connected to search lines /SL and SL, respectively.

Search lines /SL and SL are disposed in the same manner as search lines SL and /SL of the TCAM cell shown in FIG. 18.

When the potentials on search line /SL and node NA match or the potentials on search line SL and node NB match, comparing circuit CMP drives match line /ML to the power supply voltage VCC level.

Therefore, since P-channel MIS transistors are used also in the configuration of the TCAM cell shown in FIG. 23, word line /WL rises to H level when selected and falls to L level when not selected. Match line /ML is precharged to the ground voltage level, set to the ground voltage level at the time of a match, and set to the power supply voltage VCC level at the time of a mismatch.

The correspondence relationship between storage data bits of the TCAM cell shown in FIG. 23 and voltage levels of storage nodes SN1 to SN4 are the same as those of the TCAM cell shown in FIG. 18 except for the "X" state. In the case of storing the "X" state, H-level data is stored in storage nodes SN2 and SN3, and L-level data is stored in storage nodes SN1 and SN4.

In the case of the TCAM cell shown in FIG. 23, P-channel MIS transistors are used as components. In a manner similar to the third embodiment, refresh interval can be increased, and a soft error immunity can be made higher.

Word line /WL is provided commonly to twin cells TWPa and TWPb, so that time required for data writing can be shortened in a manner similar to the second embodiment.

In a manner similar to the second embodiment, word data can be written in one write cycle, so that time required for writing can be shortened. Thus, effects similar to those of the second embodiment can be provided.

Fifth Embodiment

Figure 24:
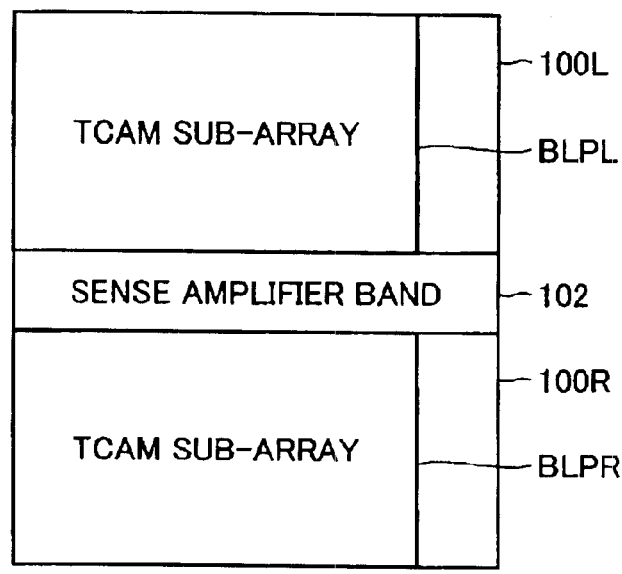
FIG. 24 is a diagram schematically showing the configuration of an array of a TCAM according to a fifth embodiment of the present invention.

FIG. 24 is a diagram schematically showing the configuration of an array of a TCAM according to a fifth embodiment of the present invention. In FIG. 24, the TCAM array is divided into two TCAM sub-arrays 100L and 100R by a sense amplifier band 102. In TCAM sub-arrays 100L and 100R, bit line pairs BLPL and BLPR are disposed, respectively, in correspondence to TCAM cell columns. In TCAM sub-arrays 100L and 100R, the "double twin cell type" TCAM cells described in the first to fourth embodiments are arranged for storing data.

Sense amplifier band 102 is disposed in the center of the TCAM array, to divide the TCAM array into TCAM sub-arrays 100L and 100R. In a sensing operation, one of bit line pairs BLPL and BLPR is connected to a sense amplifier included in sense amplifier band 102. Therefore, the length of the bit line connected to the sense amplifier can be shortened and a voltage difference between a bit line pair in reading the TCAM cell can be increased.

Figure 25:
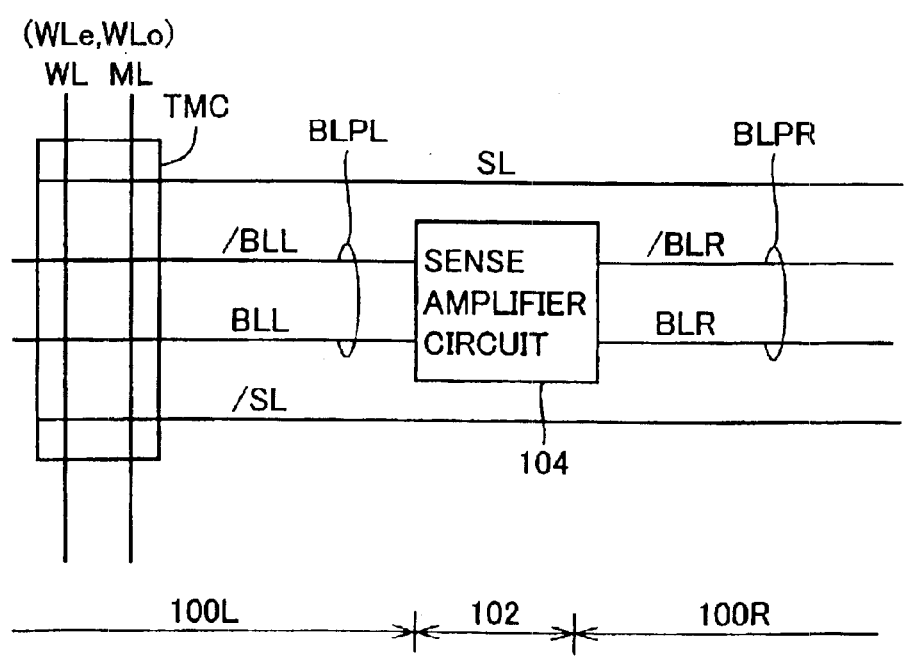
FIG. 25 is a diagram schematically showing the configuration of a part related to one sense amplifier circuit in a sense amplifier band shown in FIG. 24.

FIG. 25 is a diagram schematically showing the configuration of a part related to the sense amplifier included in sense amplifier band 102. In FIG. 25, bit lines /BLL and BLL are disposed in parallel on one side of a sense amplifier circuit 104, and bit lines /BLR and BLR are disposed in parallel on the other side of sense amplifier circuit 104. Bit lines /BLL and BLL construct bit line pair BLPL included in TCAM sub-array 100L, and bit lines /BLR and BLR construct bit line pair BLPR included in TCAM sub-array 100R.

The TCAM cell TMC to be sensed is coupled to sense amplifier circuit 104. For TCAM cell TMC, match line ML and word line WL (or WLe or WLo) are disposed.

In parallel with bit line pairs BLPL and BLPR, search lines SL and /SL are disposed. Search lines SL and /SL are not coupled to sense amplifier circuit 104, but coupled to a search line driver for generating a search data bit in a search operation.

In the configuration shown in FIG. 25, complementary data of TCAM cell TMC are read onto bit lines /BLL and BLL and the voltage difference is amplified by sense amplifier circuit 104. The bit line configuration is referred to as a "folded bit line" configuration. When noise occurs in a bit line in a bit line pair, common phase noises generate, and noise components are canceled out through a differential amplifying operation of sense amplifier circuit 104. Consequently, a very small voltage can be stably sensed.

Figure 26:
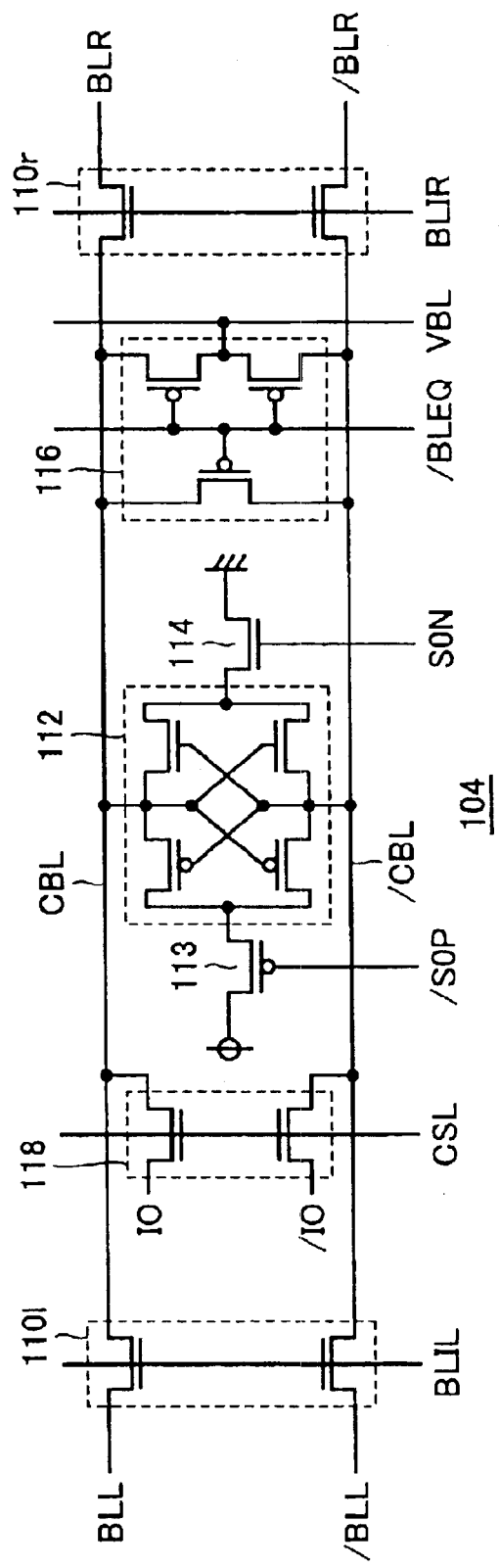
FIG. 26 is a diagram showing the configuration of the sense amplifier circuit shown in FIG. 25.
Figure 27:
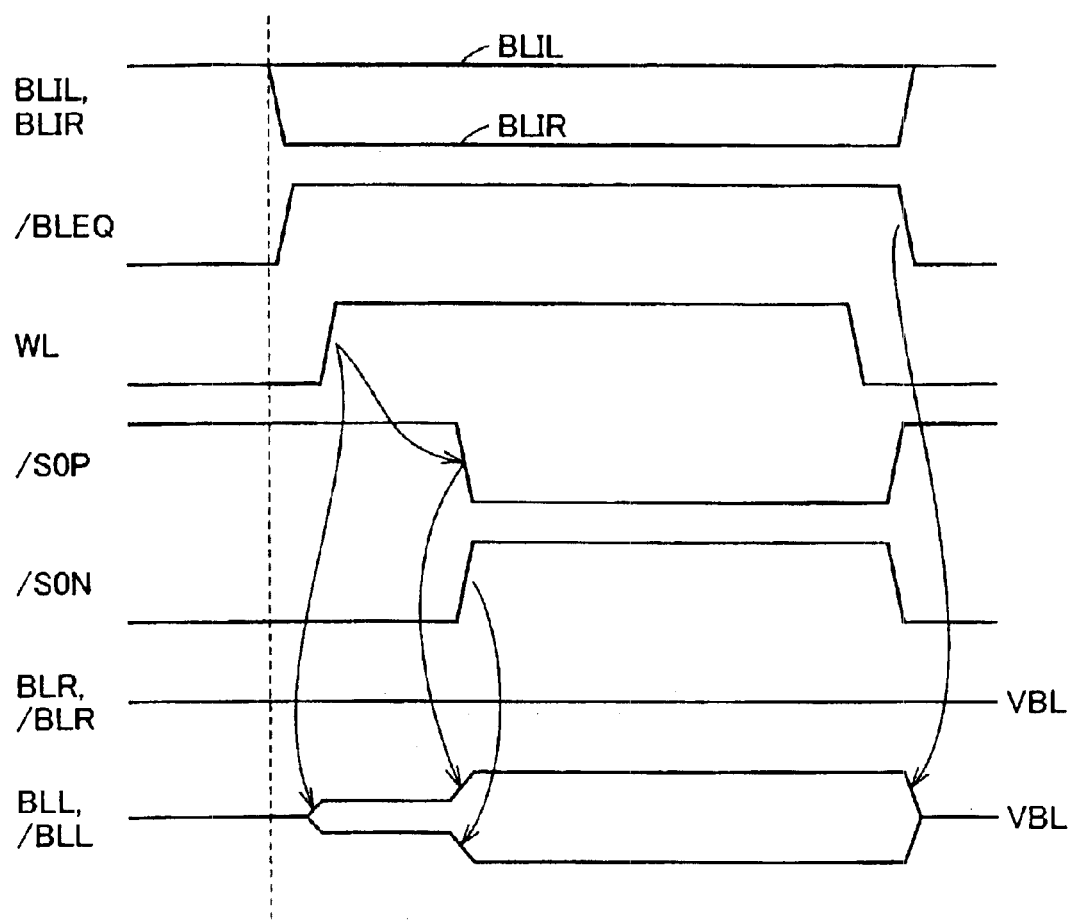
FIG. 27 is a diagram showing signal waveforms in a sensing operation of the sense amplifier circuit shown in FIG. 25.

FIG. 26 is a diagram specifically showing an example of the configuration of sense amplifier circuit 104 shown in FIG. 25. In FIG. 26, sense amplifier circuit 104 includes: a sense amplifier 112 for, when activated, amplifying the voltage difference between common bit lines CBL and /CBL; a P-channel MIS transistor 113 for supplying a power supply voltage to sense amplifier 112 in response to activation of a sense amplifier activating signal /SOP; an N-channel MIS transistor 114 for transmitting the ground voltage to sense amplifier 112 when sense amplifier activating signal SON is made active; a bit line isolation gate 110L for isolating common bit lines CBL and /CBL from bit lines BLL and /BLL when a bit line isolation instruction signal BLIL is at the L level; a bit line isolation gate 110r for isolating common bit lines CBL and /CBL from bit lines BLR and /BLR when a bit line isolation instruction signal BLIR is at the L level; a bit line precharge/equalize circuit 116 which is made active when a bit line equalize instruction signal /BLEQ is at the L level, to supply precharge voltage VBL to bit lines BLL, BLR, /BLL and /BLR via common bit lines CBL and/CBL; and a write select gate 118 for connecting common bit lines CBL and /CBL to internal data lines IO and /IO in accordance with a write activation timing signal CSL.

Sense amplifier 112 includes cross-coupled P-channel MIS transistors and cross-coupled N-channel MIS transistors and, when activated, amplifies and latches the potential difference between common bit lines CBL and /CBL.

Bit line isolation gate 110l includes transfer gates constructed by N-channel MIS transistors provided for bit lines BLL and /BLL and receiving bit line isolation instruction signal BLIL at their gates.

Bit line isolation gate 110r includes transfer gates constructed by N-channel MIS transistors provided for bit lines BLR and /BLR and receiving bit line isolation instruction signal BLIR at their gates.

Bit line precharge/equalize circuit 116 includes precharging P-channel MIS transistors for supplying bit line precharge voltage VBL to common bit lines CBL and /CBL when bit line precharge/equalize instruction signal /BLEQ is made active, and an equalizing P-channel MIS transistor for electrically short-circuiting common bit lines CBL and /CBL when bit line precharge/equalize instruction signal /BLEQ is at the L level.

Bit line precharge voltage VBL is at the intermediate voltage level. To reliably transmit intermediate voltage VBL to common bit lines CBL and /CBL without a threshold voltage loss across the MIS transistor when power supply voltage VCC is low, P-channel MIS transistors are used as components in bit line precharge/equalize circuit 116.

Alternately, bit line precharge voltage VBL may be at the power supply voltage level corresponding to the H level of storage data.

Write select gate 118 is provided to rewrite the data latched by sense amplifier 112 after a sensing operation of sense amplifier 112. Therefore, in writing data, internal data lines IO and /IO are driven by the write driver and write data is transmitted to a selected bit line.

However, write select gate 118 may be used for reading data stored in the TCAM cell externally.

The configuration of the sense amplifier shown in FIG. 26 is called "shared sense amplifier" in the field of a DRAM. A sub memory array in which a selected TCAM cell exists is coupled to sense amplifier 112, while a non-selected TCAM sub-array is isolated from sense amplifier 112. A load on common bit lines CBL and /CBL is mitigated, a sensing operation is performed with reliability, and in addition, a voltage difference between common bit lines CBL and /CBL is increased. The operation of sense amplifier circuit 104 shown in FIG. 26 will be briefly described with reference to a signal waveform diagram shown in FIG. 26.

A sensing operation on data stored in the TCAM cell connected to bit lines BLL and /BLL will be described.

In a standby state, both bit line isolation instruction 'signals BLIL and BLIR are at the H level (voltage level higher than the power supply voltage), and bit lines BLL, /BLL and bit lines BLR and /BLR are coupled to common bit lines CBL and /CBL. Bit line precharge/equalize circuit 116 is in an active state, so that all of bit lines BLL, CBL, BLR, /BLL, /CBL and /BLR are at the precharge voltage VBL level.

When a sense cycle (data write or refresh cycle) starts, first, according to an address signal, a TCAM sub-array including a selected memory cell is detected, bit line isolation instruction signal BLIL maintains the H level, and bit line isolation instruction signal BLIR is driven to the L level. Accordingly, bit line isolation gate 110r is made non-conductive and bit lines BLR and /BLR are isolated from common bit lines CBL and /CBL. Bit lines BLL and /BLL are coupled to common bit lines CBL and /CBL via bit line isolation gate 110l. Subsequently, bit line precharge/equalize instruction signal /BLEQ rises to H level, bit line precharge/equalize circuit 116 is made inactive, and bit lines BLL and /BLL are kept in a floating state at the precharge voltage VBL level. In this case, bit lines BLR and /BLR also are set to a floating state at precharge voltage VBL (since bit line isolation gate 110r is non-conductive).

Subsequently, at a predetermined timing, a word line WL corresponding to an addressed word is driven to a selected state, and data stored in a TCAM cell connected to selected word line WL (or WLe or WLo) is read onto corresponding bit lines BLL and /BLL. Complementary read voltages appeared on bit lines BLL and /BLL are transmitted to common bit lines CBL and /CBL via bit line isolation gate 110l.

When the voltage difference between common bit lines CBL and /CBL is sufficiently developed, sense amplifier activating signal /SOP is driven from the H level to the L level, and sense amplifier activating signal SON is activated to H level from the L level. Accordingly, MIS transistors 113 and 114 are made conductive to supply the power supply voltage and the ground voltage to sense amplifier 112, and sense amplifier 112 is made active. By the sensing operation of sense amplifier 112, a common bit line CBL or /CBL of a higher potential is driven to the power supply voltage level by the cross-coupled P-channel MIS transistors and the other common bit line of a lower potential is discharged to the ground voltage level by the cross-coupled N-channel MIS transistors.

In the refresh operation, latched data by sense amplifier 112 is transmitted again to bit lines BLL and /BLL, H-level data and L-level data are written into storage nodes of the selected TCAM cell, and the refresh is completed.

In the case of writing data, write activating timing signal CSL is made active, write data is transmitted via internal data lines IO and /IO by the write driver and, accordingly, write data is transmitted to common bit lines CBL and /CBL. In this case, the driving power of the write driver is greater than that of sense amplifier 112. Consequently, even if write data and sense/latch data are reverse data, the voltages of common bit lines CBL and /CBL are set to complementary voltage levels according to write data.

On completion of the sensing operation or write operation, first, word line WL is driven to a not-selected state, and the storage nodes in the selected TCAM cell are isolated from bit lines BLL and /BLL. Subsequently, sense amplifier activating signals /SOP and SON are driven to the H level and the L level, respectively, MIS transistors 113 and 114 enter a non-conductive state, and sense amplifier 112 is made inactive. Subsequently, bit line equalize instruction signal /BLEQ falls to L level again, bit line precharge /equalize circuit 116 is made active, common bit lines CBL and /CBL are driven to the intermediate voltage VBL level and, accordingly, bit lines BLL and /BLL are driven to the intermediate voltage VBL level. Then, bit line isolation instruction signal BLIR rises to H level, bit line isolation gate 110r is made conductive, and bit lines BLR and /BLR are coupled to common bit lines CBL and /CBL.

The sensing operation of sense amplifier circuit 104 shown in FIG. 26 is the same as the operation of a shared sense amplifier used in a normal DRAM. Bit line isolation instruction signals BLIL and BLIR are selectively driven to the L level in accordance with a selected TCAM sub-array (when a sensing operation is necessary).

Therefore, as the configuration of the control circuit for controlling operation of sense amplifier circuit 104, the configuration of the sense amplifier control circuit used in a normal DRAM can be used. Specifically, in addition to the configuration of the word selection control circuit in the first embodiment, the control circuit for generating bit line isolation instruction signals BLIL and BLIR is provided. The bit line isolation control circuit simply generates bit line isolation instruction signals BLIL and BLIR on the basis of a sub-array selection signal for specifying a selected TCAM sub-array.

Sense amplifier circuit 104 shown in FIG. 26 is similar to a shared sense amplifier used in a normal DRAM. Therefore, a sensing operation may be performed in a so-called "charge confinement scheme" that a sensing operation is performed in a state where bit line isolation gate 110l is set in a non-conductive state and then, bit line isolation gate 101 is set to a conductive state. Alternately, various sense amplifier circuit control methods can be used.

Bit line precharge/equalize circuit 116 may be disposed in correspondence to a bit line pair of each of TCAM sub-arrays 100l and 100r.

As described above, according to the fifth embodiment of the present invention, bit lines are arranged in the folded bit line configuration, data of a bit line pair are amplified by a shared sense amplifier, and the sensing operation on data in a TCAM cell is performed. Therefore, without being influenced by noise, storage data in the TCAM cell can be sensed and refreshed stably at high speed.

Sixth Embodiment

Figure 28:
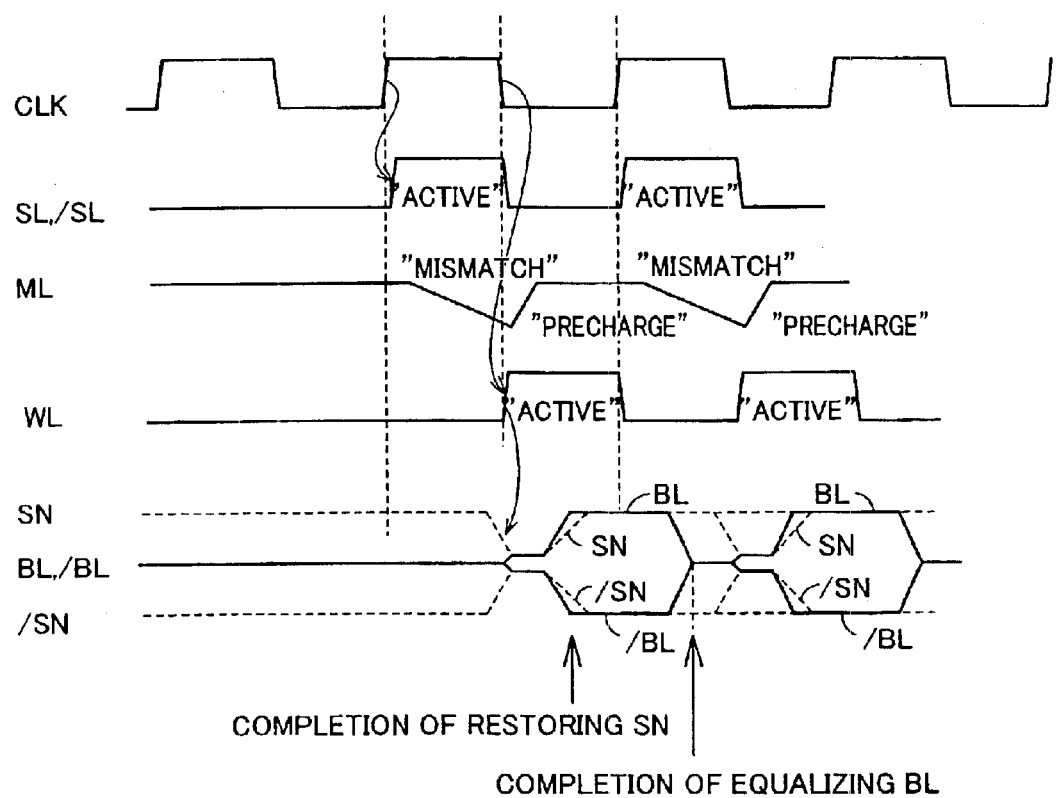
FIG. 28 is a timing chart representing an operation of a semiconductor memory device according to a sixth embodiment of the present invention.

FIG. 28 is a timing chart representing an operation of a TCAM according to a sixth embodiment of the present invention. In FIG. 28, the TCAM operates synchronously with a clock signal CLK and its operation cycle is determined by clock signal CLK. To represent a search operation and a refresh operation, FIG. 28 shows voltage changes in complementary search lines SL and /SLL, match line ML, word line WL, bit lines BL and /BL, and storage nodes SN and /SN. Storage nodes SN and /SN are storage nodes connected to a comparing circuit out of storage nodes in the two twin cells in the TCAM cell and correspond to, for example, storage nodes SN1 and SN4 in TCAM cell TMC shown in FIG. 1.

A search operation is executed synchronously with the rising edge (first edge) of clock signal CLK. In the search operation, search data is transmitted to search lines SL and /SL, and voltage levels of search lines SL and /SL change complementarily. FIG. 28 shows that both search lines SL and /SL are active at H level due to supply of the search data.

A search operation is performed in accordance with the search data and according to a result of the search, the voltage level of match line ML is set to a match or mismatch state. FIG. 28 shows a state that data corresponding to the search data is not stored, this state is a search mismatch, and the precharge voltage level (H level) of match line ML is discharged.

The search operation is completed synchronously with the falling edge (first edge) of clock signal CLK. Specifically, in response to the falling of clock signal CLK, search lines SL and /SL are driven to the initial reset state (L level), and match line ML is driven to the precharge voltage level.

If a refresh request is issued and a refresh instruction is supplied, in response to the falling of clock signal CLK, word line WL corresponding to a refresh address is driven to a selected state. When word line WL is driven to a selected state, storage nodes SN and /SN are connected to corresponding bit lines BL and /BL, and the voltage levels of bit lines BL and /BL change from the precharge voltage level to voltage levels according to the voltage levels of storage nodes SN and /SN.

When the voltage difference between bit lines BL and /BL is sufficiently developed, the sense amplifier is activated to amplify the voltage difference between bit lines BL and /BL. FIG. 28 shows, as an example, a state in which storage nodes SN and /SN store H-level data and L-level data, respectively, and bit lines BL and /BL are driven to the H level and L level, respectively. In the twin cell, a planar capacitor is used as the memory cell capacitor and its capacitance value is small. Consequently, the voltage levels of storage nodes SN and /SA change at high speed so as to follow the change in voltage of bit lines BL and /BL.

When refresh word line WL is driven to a selected state, search lines SL and /SL are driven to the L level of the inactive state, and match line ML is driven to the precharge voltage level of the H level. Therefore, in the refresh operation, even when the voltage levels of storage nodes SN and /SN of the twin cell change, at that time, the search operation has been completed and the operation of precharging match line ML is being performed. Consequently, even if the voltage levels of the storage nodes in the TCAM cell to be refreshed change, no adverse influence is exerted on the search operation.

The voltage levels of bit lines BL and /BL are latched at the H level and the L level, respectively, by a corresponding sense amplifier circuit.

By the driving of bit lines BL and /BL to the H and L levels, respectively, storage nodes SN and /SN of a corresponding twin cell are driven to the H and L levels, respectively, and accordingly, the operation of restoring storage node SN (and /SN) is completed.

The search operation can be basically performed when the voltage levels of storage nodes SN and /SN recover to the original voltage levels. Therefore, even if the search operation is performed synchronously with the rising edge of clock signal CLK in the next cycle, the operation of restoring the storage nodes of the refresh memory cell has been already completed and have the voltage levels thereof made definite by the time. Thus, the search operation can be performed accurately.

In the search operation, bit lines BL and BL/ are precharged. Specifically, word line WL is driven to an inactive state synchronously with the rising of clock signal CLK, the sense amplifier is made inactive and subsequently, bit lines BL and /BL are equalized. At the time of equalizing bit lines BL and /BL, storage nodes SN and /SN are isolated from the bit lines and maintain the recovered voltage levels.

When the refresh request is still active, in this cycle, after completion of the search operation, a word line in a refresh row is similarly driven to a selected state, the sense amplifier is made active again, and complementary storage data in the twin cell are restored.

In the refresh operation, according to the configuration of TCAM cell TMC, a refresh sequence differs. To be specific, where two word lines are provided for one TCAM cell, these two word lines provided for the TCAM cell are sequentially driven to a selected state in a predetermined sequence, and a refresh is executed. When the TCAM cell is associated with one word line, two twin cells in one TCAM cell are simultaneously refreshed in each cycle.

Therefore, in the TCAM according to the present invention, since data is stored in a capacitor in the case of the planar type dynamic TCAM, the refresh operation is necessary. However, since the capacitance value of the planar capacitor is small and high speed writing can be carried out, the refresh operation can be also performed similarly at high speed. Even when a refresh is performed in the case in which the search operation is executed in each clock cycle, at the start of the next search cycle, restore of storage data in the TCAM cell has been completed. Therefore, the TCAM cell can be refreshed without stopping the search operation. Thus, the TCAM of high process efficiency can be achieved.

Figure 29:
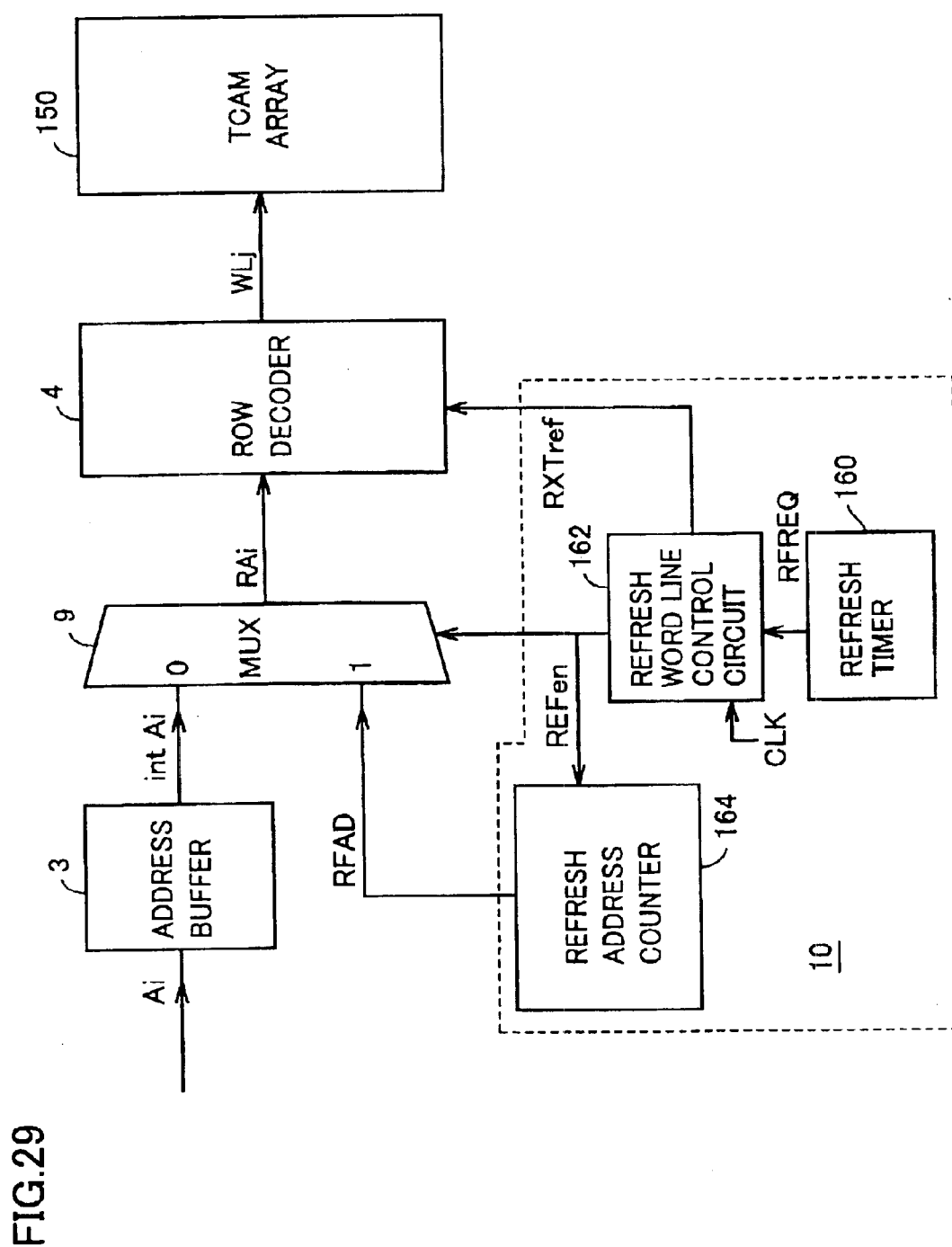
FIG. 29 is a diagram schematically showing the configuration of a part related to a refresh operation of the semiconductor memory device according to the sixth embodiment of the present invention.

FIG. 29 is a diagram schematically showing the configuration of the main part of a semiconductor memory device (TCAM) according to a sixth embodiment of the present invention. In FIG. 29, the semiconductor memory device includes: a TCAM array 150 having a plurality of TCAM cells arranged in rows and columns; address buffer 3 for buffering an address Ai externally applied and generating an internal address signal; address multiplexer (MUX) 9 for selecting one of refresh address RFAD from control circuit 10 and an internal address intAi from address buffer 3; and row decoder 4, when activated, decoding a row address RAi from address multiplexer 9 and driving a corresponding word line to a selected state. In FIG. 29, a word line WLj driven by row decoder 4 is representatively shown.

TCAM array 150 has any of the array configurations of the foregoing first to fifth embodiments. Word lines are disposed in correspondence to TCAM cell rows. Bit line pairs, search line pairs, and sense amplifiers are disposed in correspondence to TCAM cell columns.

Control circuit 10 corresponds to control circuit 10 shown in FIG. 6 and controls internal operations of the semiconductor memory device. FIG. 29 shows the configuration of a part related to the refreshing operation in control circuit 10. The refresh control part of control circuit 10 includes: a refresh timer 160 for issuing refresh request RFREQ at predetermined intervals; and a refresh word line control circuit 162 for, when refresh request RFREQ is issued, generating a refresh word line timing signal RXTref and refresh enable signal REFen synchronously with clock signal CLK. Refresh word line timing signal RXTref is supplied to row decoder 4, and refresh enable signal REFen is supplied to a refresh address counter 164 and address multiplexer 9. Refresh word line timing signal RXTref determines an active period of a word line in the refresh operation. Refresh enable signal REFen designates a clock cycle in which a refresh is executed.

When refresh request RFREQ is issued, in response to the rising of clock signal, refresh word line control circuit 162 maintains refresh enable signal REFen in an active state for the period of one clock cycle. In response to either activation or inactivation of refresh enable signal REFen, refresh address counter 164 updates refresh address RFAD by increasing or decreasing the count. When refresh enable signal REFen is made active, address multiplexer 9 selects refresh address RFAD and generates row address RAi. When refresh enable signal REFen is made inactive, address multiplexer 9 selects internal address signal intAi from address buffer 3 and generates row address RAi.

Refresh word line control circuit 162 drives refresh word line timing signal RXTref to an active state synchronously with the falling of clock signal CLK and when clock signal CLK goes high, it drives refresh word line timing signal RXTref to an inactive state. Therefore, refresh enable signal REFen is maintained in an active state for the period of one clock cycle of clock signal CLK. By contrast, refresh word line timing signal RXTref is maintained in an active state for the period of the latter half cycle of clock signal CLK.

In the refresh operation, row decoder 4 drives a word line (WLj) designated by refresh address RFAD to a selected state in accordance with refresh word line timing signal RXTref.

When refresh request RFREQ is issued, the search operation is executed in the first half cycle of clock signal CLK. In the second half cycle of the clock cycle, according to refresh word line timing signal RXTref, a word line corresponding to refresh address RFAD is maintained in an active state, and a TCAM cell designated by refresh address AFAD is refreshed. Thus, the search operation can be executed in the first half cycle of one clock cycle and refresh can be performed in the second half cycle of the one cycle. By utilizing refresh enable signal REFen, an external data writing operation can be prevented from being performed in the refresh executing cycle.

Figure 30:
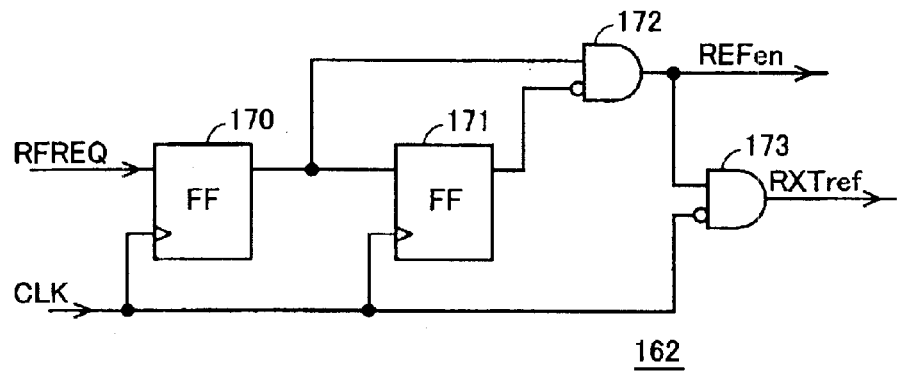
FIG. 30 is a diagram showing an example of the configuration of a refresh word line control circuit shown in FIG. 29.

FIG. 30 is a diagram showing an example of the configuration of refresh word line control circuit 162 shown in FIG. 29. In FIG. 30, refresh word line control circuit 162 includes: a flip flop (FF) 170 for capturing and outputting refresh request RFREQ synchronously with the rising of clock signal CLK; a flip flop (FF) 171 for capturing and outputting an output signal of flip flop 170 synchronously with the rising of clock signal CLK; a gate circuit 172 for receiving output signals of flip flops 170 and 171 and outputting refresh enable signal REFen; and a gate circuit 173 for receiving refresh enable signal REFen outputted from gate circuit 172 and clock signal CLK and outputting refresh word line timing signal RXTref.

Gate circuit 172 sets refresh enable signal REFen to the H level when an output signal of flip flop 171 is at the L level and an output signal of flip flop 170 is at the H level. Gate circuit 173 sets refresh word line timing signal RXTref to the H level when clock signal CLK is at the H level and refresh enable signal REFen is at the H level. Therefore, refresh word line timing signal RXTref is maintained at the L level when clock signal CLK is at the H level. When refresh enable signal REFen is at the H level, refresh word line timing signal RXTref is made active in response to the falling of clock signal CLK.

Figure 31:
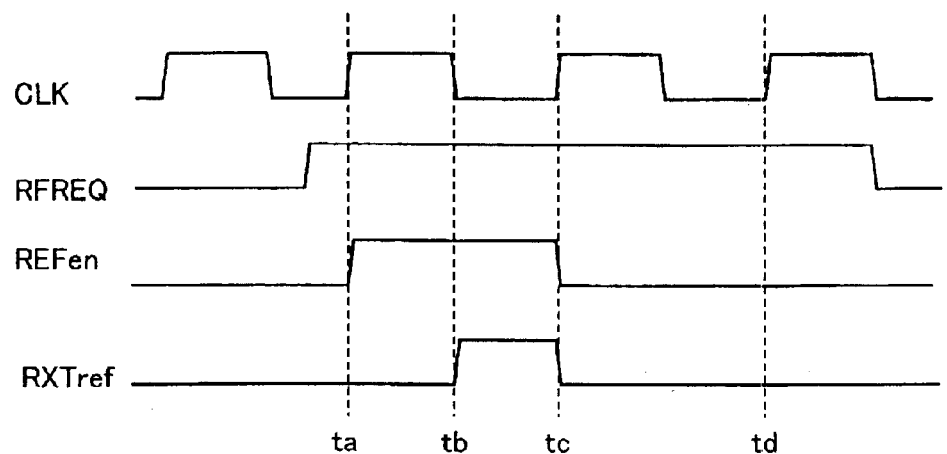
FIG. 31 is a timing chart representing an operation of the refresh word line control circuit shown in FIG. 30.

FIG. 31 is a timing chart representing an operation of refresh word line control circuit 162 shown in FIG. 30. Referring to FIG. 31, the operation of refresh word line control circuit 162 shown in FIG. 30 will be described below.

When refresh request RFREQ is at the L level, output signals of flip flops 170 and 171 are at the L level, and both refresh enable signal REFen and refresh word line timing signal RXTref are at the L level.

Refresh timer 160 shown in FIG. 29 performs time-measuring operation asynchronously with clock signal CLK, and therefore, refresh request RFREQ is made active asynchronously with clock signal CLK. Even when refresh request RFREQ is made active, flip flop 170 is in a latch state, the state of an output signal of flip flop 170 is unchanged and is maintained at the L level. Therefore, refresh enable signal REFen from gate circuit 172 maintains the L level and accordingly, refresh word line timing signal RXTref from gate circuit 173 maintains the L level.

When clock signal CLK rises to H level at time ta, flip flop 170 takes in refresh request RFREQ and raises its output signal to the H level. Since flip flop 171 takes in and outputs the signal just before rising of the output signal of flip flop 170 synchronously with the rising of clock signal CLK, its output signal is at the L level. Therefore, refresh enable signal REFen from gate circuit 172 rises to H level. Since clock signal CLK is at the H level, refresh word line timing signal RXTref from gate circuit 173 is at the L level.

At time tb, although clock signal CLK falls to the L level, flip flop 170 is still in a latching state and its output signal maintains the H level. An output signal of flip flop 171 similarly maintains the L level. Therefore, refresh enable signal REFen maintains the H level even when clock signal CLK goes low at time tb. When clock signal CLK goes low at time tb, refresh word line timing signal RXTref from gate circuit 173 responsively rises to the H level.

When clock signal CLK rises to the H level at time tc, refresh request RFREQ is still at the H level and an output signal of flip flop 170 maintains the H level. On the other hand, flip flop 171 takes in and outputs the output signal of flip flop 170 synchronously with the rising of clock signal CLK at time tc. Responsively, the output of flip flop 171 rises to the H level and accordingly, refresh enable signal REFen from gate circuit 172 falls to the L level. Since clock signal CLK turns H level and refresh enable signal REFen turns L level, gate circuit 173 sets refresh word line timing signal RXTref to the L level.

At time td, clock signal CLK rises. If refresh request RFREQ is at the H level at this time point, an output signal of flip flop 170 is at the H level. However, the output signal of flip flop 171 is at the H level yet and refresh enable signal REFen from gate circuit 172 maintains the L level. Then, when refresh request RFREQ goes low, in the subsequent clock cycles, refresh enable signal REFen and refresh word line timing signal RXTref are maintained at the L level.

In the configuration of refresh word line control circuit 162 shown in FIG. 30, when refresh request RFREQ is issued (activated), during the L level period of clock signal CLK, refresh word line timing signal RXTref is made active and the refresh operation is executed. As the configuration of TCAM cell TMC, in any of the case where two word lines are provided and the case where one word line is provided, one word line is selected according to refresh request RFREQ and data stored in a twin cell connected to the selected word line is refreshed.

Modification of Refresh Word Line Control-Circuit

Figure 32:
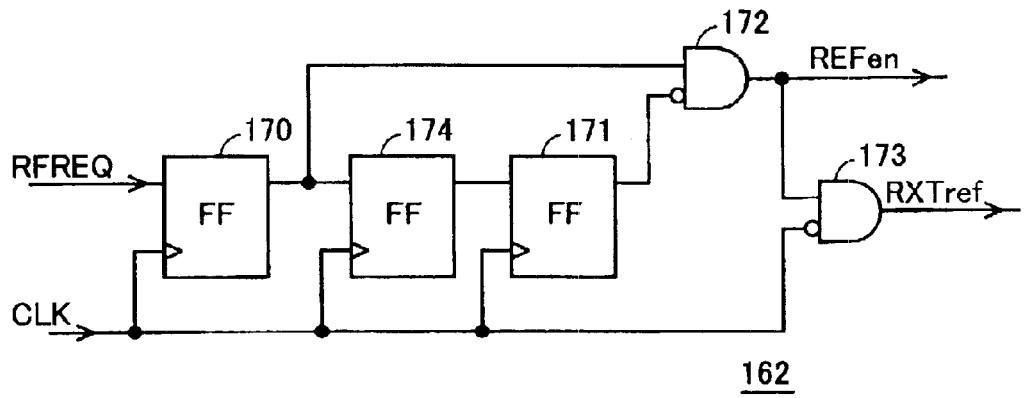
FIG. 32 is a diagram showing a modification of the refresh word line control circuit shown in FIG. 29.

FIG. 32 is a diagram showing a modification of refresh word line control circuit 162 shown in FIG. 29. The configuration of refresh word line control circuit 162 shown in FIG. 32 is different from that of the refresh word line control circuit shown in FIG. 30 in the following point. Between flip flops 170 and 171, a flip flop (FF) 174 for taking in and outputting an output signal of flip flop 170 synchronously with clock signal CLK and transferring its output signal to flip flop 171 is provided. The other configuration of the refresh word line control circuit show in FIG. 32 is the same as that of the refresh word line control circuit shown in FIG. 30. Corresponding parts are designated by the same reference numerals and their detailed description will not be repeated.

Figure 33:
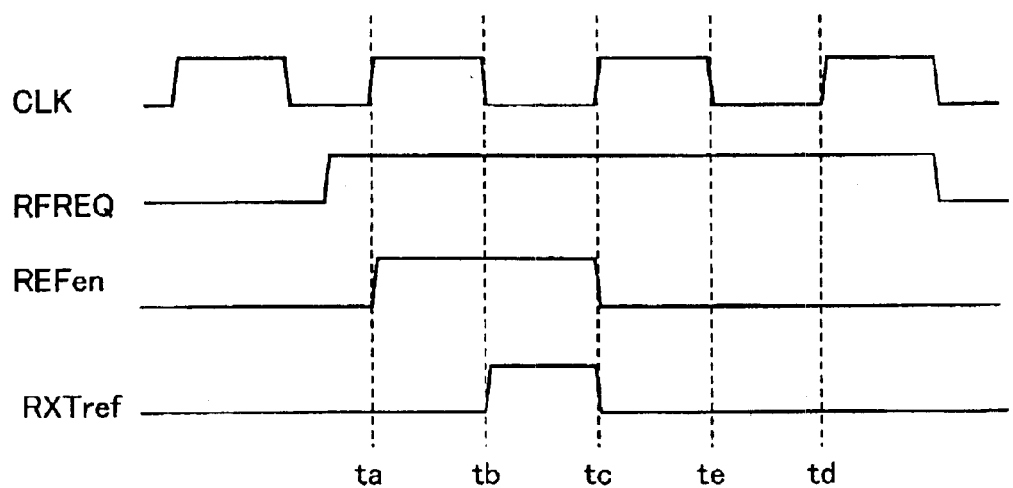
FIG. 33 is a timing chart representing an operation of the refresh word line control circuit shown in FIG. 32.

FIG. 33 is a timing chart representing an operation of refresh word line control circuit 162 shown in FIG. 32. Referring to FIG. 33, the operation of refresh word line control circuit 162 shown in FIG. 32 will be described below.

Before time ta, refresh request RFREQ is issued, and clock signal CLK rises to the H level at time ta. Responsively, an output signal of flip flop 170 attains the H level. In the current cycle, the output signal of flip flop 171 is at the L level, and refresh enable signal REFen from gate circuit 172 goes high. Clock signal CLK is at the H level and at this time, refresh word line timing signal RXTref from gate circuit 173 is still at the L level.

At time tb, when clock signal CLK falls to the L level, refresh word line timing signal RXTref from gate circuit 173 rises to the H level.

At time tc, when clock signal CLK rises to the H level again, the output signal of flip flop 174 attains the H level. The output signal of flip flop 171 is still at the L level and refresh enable signal REFen maintains the H level. Synchronously with the rising of clock signal CLK, refresh word line timing signal RXTref from gate circuit 173 attains the L level.

When clock signal CLK falls to the L level at time te, since refresh enable signal REFen is at the H level, refresh word line timing signal RXTref from gate circuit 173 attains the H level again.

At time td, when clock signal CLK rises to the H level, the output signal of flip flop 171 attains the H level in accordance with the output signal of flip flop 174, and refresh enable signal REFen from gate circuit 172 attains the L level. Responsively, refresh word line timing signal RXTref attains the L level. Subsequently, refresh request RFREQ is made inactive. Thereafter, refresh enable signal REFen and refresh word line timing signal RXTref maintain the inactive state.

In the case of the configuration of refresh word line control circuit 162 shown in FIG. 32, therefore, a delay circuit of two clock cycles is constructed by flip flops 174 and 171. For the period of two clock cycles, refresh enable signal REFen maintains the active state, and refresh word line timing signal RXTref can be driven to an active state in the latter half period of each clock cycle. Therefore, in the case of using the configuration of refresh word line control circuit 162 shown in FIG. 32, even when two word lines are provided for one TCAM cell, corresponding two word lines can be sequentially driven to a selected state in response to one refresh request, and refresh can be executed in a unit of a TCAM cell.

In the configuration of refresh word line control circuit 162 shown in FIG. 30, a set/reset flip flop may be employed to replace the flip flop 170 as in the following manner. The set/reset flip flop is set by an output signal of an AND gate receiving clock signal CLK and refresh request RFREQ, and is reset by a count-up signal of a counter which is started in response to an output signal of the AND gate to count a predetermined number of clock cycles. An output signal of such set/reset flip flop is applied to gate circuit 172 shown in FIG. 30. According to such configuration, refresh is executed in each of clock cycles during the time period of the clock cycles counted by the counter. Thus, so-called burst refresh can be implemented.

Figure 34:
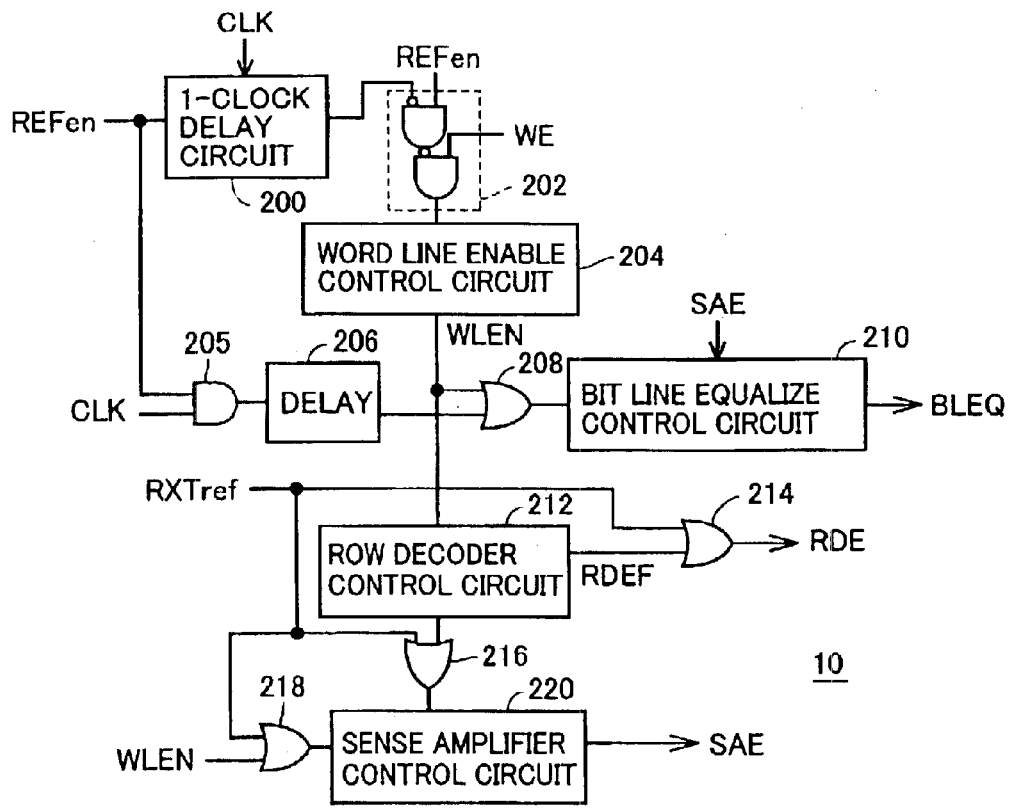
FIG. 34 is a diagram schematically showing the configuration of a word line selection control unit according to the sixth embodiment of the present invention.

FIG. 34 is a diagram schematically showing the configuration of a row selection control part in the sixth embodiment of the present invention. The row selection control part shown in FIG. 34 is provided separately from the refresh control part in control circuit 10 shown in FIG. 6. The configuration of row-related circuits of the TCAM array, that is, a bit line precharge/equalize circuit and a sense amplifier circuit is the same as, for example, the configuration shown in FIG. 8. However, the sense amplifier circuit may be a shared sense amplifier circuit and a bit line isolation circuit may be further disposed. However, a part for generating a bit line isolation instruction signal is not shown in FIG. 34.

In FIG. 34, the row selection control part in control circuit 10 includes: a 1-clock delay circuit 200 for delaying refresh enable signal REFen by the time period of one clock cycle of clock signal CLK; a composite gate 202 receiving an output signal of 1-clock delay circuit 200, refresh enable signal REFen, and write instruction signal WE; a word line enable control circuit 204 for activating word line enable signal WLEN for a predetermined period in response to the activation of an output signal of composite gate 202; a delay circuit 206 for delaying refresh enable signal REFen by a predetermined time; an OR circuit 208 for receiving an output signal of delay circuit 206 and word line enable signal WLEN; and a bit line equalize control circuit 210 for selectively activating/inactivating bit line equalize instruction signal BLEQ in response to an output signal of OR circuit 208 and sense amplifier enable signal SAE.

Composite gate 202 is equivalently constructed by an NAND gate receiving refresh enable signal REFen and an output signal of 1-clock delay circuit 200 and an AND gate receiving an output signal of the NAND gate and write instruction signal WE. When both an output signal of 1-clock delay circuit 200 and refresh enable signal REFen are active, an output signal of composite gate 202 is maintained in an inactive state irrespective of the state of write instruction signal WE. If write instruction signal WE is applied when both refresh enable signal REFen and an output signal of 1-clock delay circuit 200 are inactive, composite gate 202 drives its output signal to the active state.

Word line enable control signal 204 maintains word line enable signal WLEN in the active state for a predetermined period in response to activation of an output signal of composite gate 202. Therefore, word line enable signal WLEN is enabled when write instruction signal WE is applied in a normal operation mode.

Bit line equalize control circuit 210 drives bit line equalize instruction signal BLEQ to an inactive state in response to activation of an output signal of OR circuit 208 and drives bit line equalize instruction signal BLEQ to an active state in response to inactivation of sense amplifier enable signal SAE.

The row selection control part of control circuit 10 further includes: a row decoder control circuit 212 for activating a row decoder enable fast signal RDEF in response to activation of word line enable signal WLEN; an OR circuit 214 for receiving refresh word line timing signal RXTref and row decoder enable fast signal RDEF and generating row decoder enable signal RDE; an OR circuit 216 for receiving an output signal of row decoder control circuit 212 and refresh word line timing signal RXTref; an OR circuit 218 for receiving refresh word line timing signal RXTref and word line enable signal WLEN; and a sense amplifier control circuit 220 for selectively activating sense amplifier enable signal SAE in accordance with output signals of OR circuits 216 and 218.

Row decoder control circuit 212 activates row decoder enable fast signal RDEF when word line enable signal WLEN is activated, and inactivates row decoder enable fast signal RDEF when word line enable signal WLEN is inactivated.

Sense amplifier control circuit 220 activates sense amplifier enable signal SAE in response to activation of an output signal of OR circuit 216 and inactivates sense amplifier enable signal SAE in response to inactivation (L level) of an output signal of OR circuit 218. Therefore, after lapse of a predetermined period since a word line is selected, sense amplifier control circuit 220 drives sense amplifier enable signal SAE to an active state. When a word line is driven to a non-selected state, sense amplifier control circuit 220 drives sense amplifier enable signal SAE to an inactive state in response to an output signal of OR circuit 218.

Figure 35:
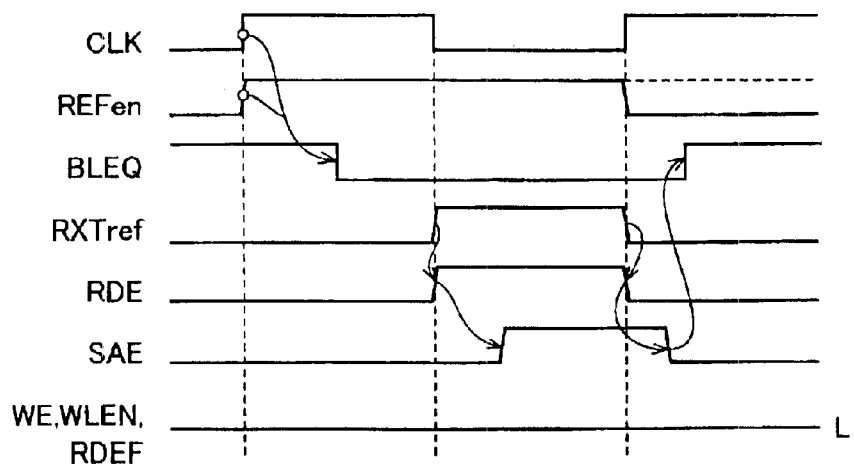
FIG. 35 is a timing chart representing an operation of a control circuit shown in FIG. 34.

FIG. 35 is a timing chart representing the refresh operation of the control circuit shown in FIG. 34. Referring to FIG. 35, the operation of control circuit 10 shown in FIG. 34 will be briefly described below.

When a refresh request is issued, synchronously with the rising of clock signal CLK, refresh enable signal REFen rises to the H level. When refresh enable signal REFen is made active, after lapse of the predetermined time via delay circuit 206 and OR circuit 208, bit line equalize control circuit 210 inactivates bit line equalize instruction signal BLEQ, and completes the bit line precharge/equalize operation.

In the period when clock signal CLK is at the H level, the search operation is performed, refresh word line timing signal RXTref is in an inactive state, and row decoder enable signal RDE and sense amplifier enable signal SAE are also in an inactive state. Since the output signal of composite gate 202 is in the inactive state of the L level, word line enable signal WLEN from word line enable control circuit 204 is also maintained in the inactive state of the L level. Therefore, in the refresh operation, row decoder enable fast signal RDEF from row decoder control circuit 212 is maintained in the inactive state. Since no data writing is performed, write instruction signal WE is maintained at the L level.

When the search operation is under execution, the voltage level of a search line changes according to search data. In this case, after the voltage level of the search line is made definite, the bit line precharge/equalize operation is adapted to be completed, thereby preventing the voltages of the bit lines from being changed due to capacitive coupling and also enabling the bit lines to be utilized as shield lines for the search lines.

When clock signal CLK falls to the L level, refresh word line timing signal RXTref is made active, and row decoder enable signal RDE from OR circuit 214 is activated. In response to the activation of row decoder enable signal RDE, a word line selection is performed, and a word line corresponding to a refresh address is driven to a selected state.

Upon selecting a word line, since the bit line precharge/equalize operation has been completed, a voltage change on the search line at the time of resetting the search line may possibly be transmitted to the bit line through capacitive coupling, to change the voltages of the bit lines from the precharge voltage level. Since complementary data are read onto the bit line upon selecting a word line, even if noise caused by capacitive coupling is transmitted from the search line to the bit line before selection of the word line, a sufficient voltage difference can be assured between bit lines. In this case, if a twisted bit line structure in which a crossing is provided on bit lines to exchange the bit line position is utilized, since the voltage level of one of the pair of search lines is driven to a precharge voltage level, the noise caused by capacitive coupling from the search line can be transmitted as a common phase noise to the bit line pair. Thus, the sensing operation on the twin cell data can be performed accurately.

Subsequently, when an output signal of OR circuit 216 is made active in response to activation of refresh word line timing signal RXTref, sense amplifier control circuit 220 drives sense amplifier enable signal SAE to an active state after lapse of the predetermined time. In response to activation of sense amplifier enable signal SAE, the sense amplifier is activated so that sensing, amplification, and rewriting of data stored in a selected TCAM cell are executed.

When clock signal CLK rises to the H level again, refresh word line timing signal RXTref falls to the L level, row decoder enable signal RDE is inactivated, and a selected word line is driven to a non-selected state. When word line timing enable signal RXTref is inactivated, an output signal of OR circuit 218 is also driven to an inactive state (L level). Accordingly, after lapse of predetermined time, sense amplifier control circuit 220 inactivates sense amplifier enable signal SAE, resulting in completion of the operation of restoring data stored in a memory cell.

When sense amplifier enable signal SAE is inactivated, bit line equalize control circuit 210 activates bit line equalize instruction signal BLEQ and, again, the bit lines are precharged to and equalized at the predetermined voltage level.

In the bit line precharge period after completion of the restoring, the output signal of 1-clock delay circuit 200 is at the H level, an output signal of composite gate 202 is in an inactive state, and writing of data in this clock cycle is prohibited. Thus, the bit lines can be accurately driven to the initial precharge voltage level after the refresh operation, and the internal state can be set to the state of preparing for the next operation (data write or refresh operation).

Refresh enable signal REFen may be maintained in the active state of the H level for the period of a predetermined number of clock cycles as shown by broken lines in FIG. 35. According to refresh word line timing signal RXTref, sense amplifier enable signal SAE is activated/inactivated in each clock cycle.

When refresh enable signal REFen is continuously maintained at the H level during the refresh period, the output signal of AND circuit 205 rises to the H level in response to the rising of clock signal CLK and, after lapse of delay time of delay circuit 206, bit line equalize control circuit 210 drives bit line equalize instruction signal BLEQ to an inactive state. Therefore, in this case, by simply applying a set/reset flip flop that is reset in response to the rising of an output signal of OR circuit 208 and is set in response to inactivation of sense amplifier enable signal SAE as bit line equalize control circuit 210, bit line equalize instruction signal BLEQ can be easily made active/inactive for each refresh operation in a plurality of successive clock cycles.

In the refresh operation, the row decode operation may be performed in response to activation of refresh enable signal REFen or inactivation of bit line equalize instruction signal BLEQ, for driving a selected word line to a selected state in accordance with refresh word line timing signal RXTref. Refresh word line timing signal RXTref is applied to the word line driving circuit in this case. In such a case, a decode operation can be completed during a search operation, driving of a word line to a selected state and activation of the sense amplifier can be performed at faster timings, and a refresh cycle time period can be shortened.

In a normal operation mode, write instruction signal WE is activated and word line enable signal WLEN is driven to the active state for a predetermined period. In this case, row decoder enable fast signal RDEF is outputted from row decoder control circuit 212 and responsively, row decoder enable signal RDE is activated. According to an output signal of OR circuit 216, after lapse of a predetermined time, sense amplifier control circuit 220 inactivates sense amplifier enable signal SAE. Also, in response to inactivation of word line enable signal WLEN from OR circuit 218, sense amplifier control circuit 220 inactivates sense amplifier enable signal SAE. In this case, in response to sense amplifier enable signal SAE, bit line equalize control circuit 210 activates bit line equalize signal BLEQ.

Therefore, by utilizing the configuration of control circuit 10 shown in FIG. 34, such a configuration can be implemented that data is written utilizing the period of one clock cycle of clock signal CLK in a normal data write operation, and refresh operation is started in response to the falling of clock signal CLK while inhibiting data writing in a refresh operation.

In the case of the configuration where data reading is also carried out, a read instruction signal is further supplied to composite gate 202 or an access instruction that is activated when a write instruction or read instruction is issued is applied to composite gate 202.

Modification of Control Circuit

Figure 36:
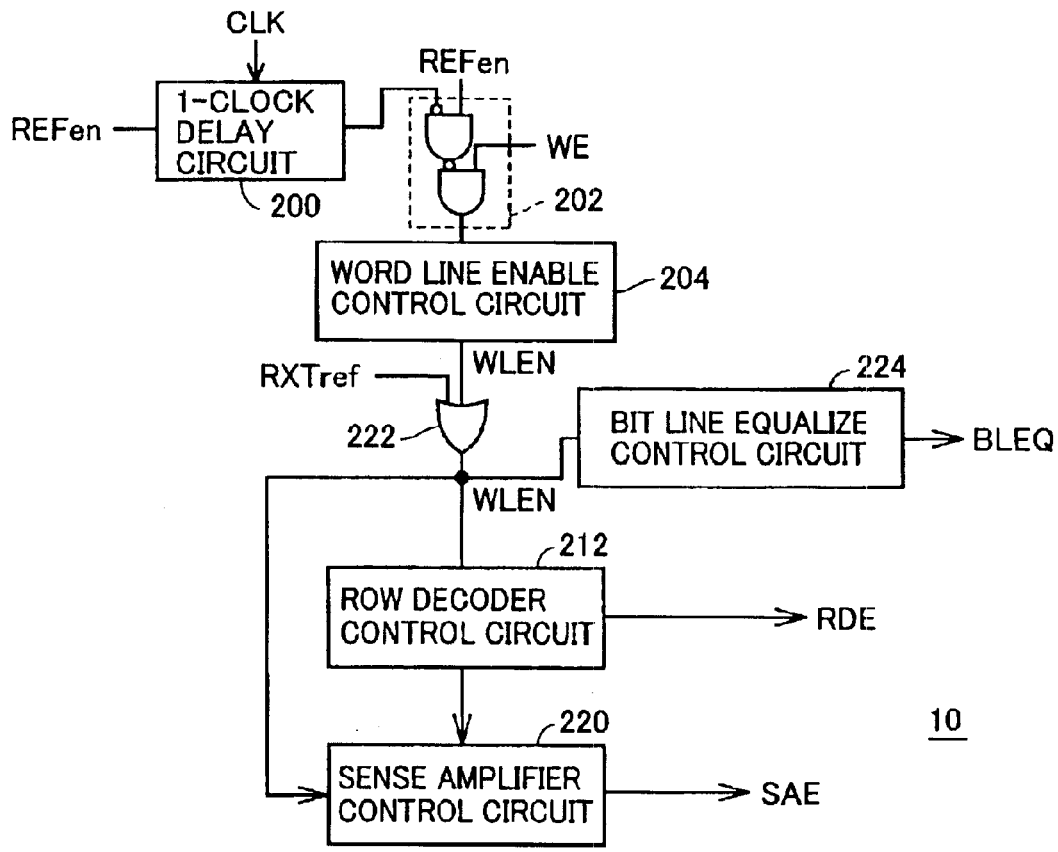
FIG. 36 is a diagram showing a modification of a word line selecting section of the sixth embodiment of the present invention.

FIG. 36 is a diagram showing a modification of the row selection control part of control circuit 10 shown in FIG. 34. In FIG. 36, similarly to control circuit 10 shown in FIG. 34, the row selection control part in control circuit 10 includes: 1-clock delay circuit 200 for delaying refresh enable signal REFen by the time period of one clock cycle of clock signal CLK; composite gate 202 receiving an output signal of 1-clock delay circuit 200, refresh enable signal REFen, and write instruction signal WE; and word line enable control circuit 204 for activating word line enable signal WLEN in response to the activation of an output signal of composite gate 202.

1-clock delay circuit 200, composite gate 202, and word line enable control circuit 204 inhibit external writing of data for a time period of a refresh cycle and the following clock cycle in a refresh operation in a manner similar to the configuration shown in FIG. 34. Word line enable control circuit 204 maintains word line enable fast signal WLENF in the active state for a predetermined period in response to activation of an output signal of composite gate 202.

Control circuit 10 further includes: an OR circuit 222 for receiving refresh word line timing signal RXTref and word line enable fast signal WLENF; a bit line equalize control circuit 224 for activating/inactivating bit line equalize instruction signal BLEQ in accordance with word line enable signal WLEN outputted from OR circuit 222; row decoder control circuit 212 for driving row decoder enable signal RDE to an active state in accordance with word line enable signal WLEN; and sense amplifier control circuit 220 for activating/inactivating sense amplifier enable signal SAE in accordance with an output signal of row decoder control circuit 212 and word line enable signal WLEN.

Bit line equalize control circuit 224 inactivates bit line equalize instruction signal BLEQ in response to activation of word line enable signal WLEN and activates bit line equalize instruction signal BLEQ in response to inactivation of word line enable signal WLEN.

Row decoder control circuit 212 maintains row decoder enable signal RDE in the active state, to maintain the word line in a selected state while word line enable signal WLEN is active.

Sense amplifier control circuit 220 activates sense amplifier enable signal SAE after lapse of a predetermined period since the output signal of row decoder control circuit 212 is activated, and inactivates sense amplifier enable signal SAE after lapse of a predetermined period in response to inactivation of word line enable signal WLEN.

Figure 37:
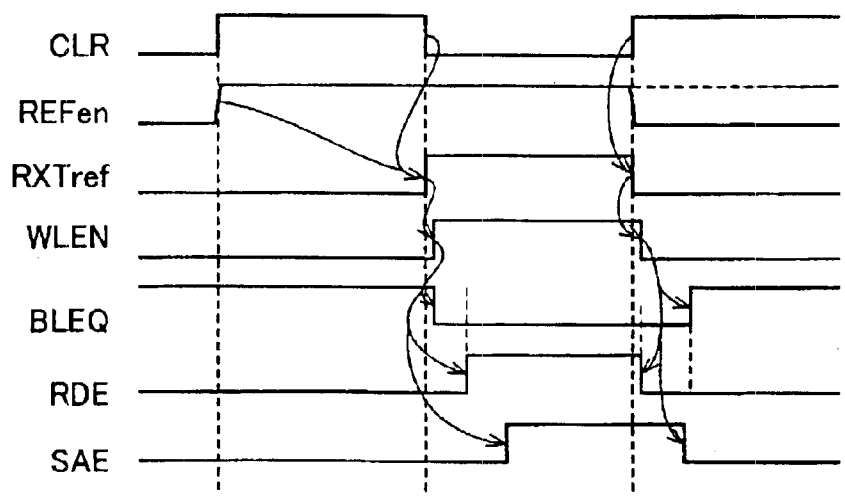
FIG. 37 is a timing chart representing an operation of the circuit shown in FIG. 36.

FIG. 37 is a timing chart representing an operation of the control circuit 10 in FIG. 36 in the refresh operation. Referring to FIG. 37, the refresh operation of control circuit 10 shown in FIG. 36 will be described below.

In the refresh operation, synchronously with the rising of clock signal CLK, refresh enable signal REFen is made active and an output signal of composite gate 202 is maintained in the inactive state for the refresh period and a clock cycle subsequent to completion of the refresh period. Therefore, word line enable fast signal WLENF from word line enable control circuit 204 is maintained at the L level. While clock signal CLK is at the H level, refresh word line timing signal RXTref is in the inactive state of the L level, bit line equalize instruction signal BLEQ maintains the active state and, each of row decoder enable signal RDE and sense amplifier enable signal SAE maintains the inactive state. Since data is not written, write instruction signal WE is maintained at the L level.

When clock signal CLK falls to the L level, refresh word line timing signal RXTref is made active and responsively, word line enable signal WLEN is made active. In response to the activation of word line enable signal WLEN, bit line equalize control circuit 224 inactivates bit line equalize instruction signal BLEQ, and the bit line precharge/equalize operation is completed. Row decoder control circuit 212 activates row decoder enable signal RDE in response to activation of word line enable signal WLEN, an operation of decoding the refresh address is performed and according to the result of decoding, a word line corresponding to a refresh row is driven to a selected state by the row decoder.

After lapse of the predetermined period, sense amplifier control circuit 220 activates sense amplifier enable signal SAE, and sensing, amplification, and rewriting of data stored in a twin cell connected to the selected word line is executed.

When clock signal CLK rises to the H level, refresh word line timing signal RXTref falls to the L level. In response to the falling (inactivation) of refresh word line timing signal RXTref, word line enable signal WLEN from OR circuit 222 is made inactive and accordingly, row decoder control circuit 212 inactivates row decoder enable signal RDE. Consequently, the selected word line is driven to a non-selected state.

In response to inactivation of word line enable signal WLEN, after lapse of the predetermined period, sense amplifier control circuit 220 inactivates sense amplifier enable signal SAE. Subsequently, bit line equalize control circuit 224 drives bit line equalize instruction signal BLEQ again to an active state in response to inactivation of word line enable signal WLEN, and the bit line precharge/equalize operation is executed.

In the case of the configuration shown in FIG. 36, refresh word line timing signal RXTref is used as a signal for determining an internal row selection period of time upon refreshing. Therefore, it is unnecessary to significantly change the circuit configuration for data writing in a normal mode of operation, the refresh operation is always executed in the period in which clock signal CLK is at the L level, and a search operation efficiency can be prevented from being decreased.

Since the bit lines are maintained at the precharge voltage level during the search operation, transmission of a voltage change on the search line to the bit lines through capacitive coupling can be prevented and the bit line voltages can be therefore prevented from being changed. Consequently, while the bit lines are accurately maintained at the precharge voltage level, memory cell data can be read. Thus, a sense margin is assured and a sensing operation can be performed accurately.

According to refresh word line timing signal RXTref which is activated in each clock cycle while refresh enable signal REFen is active, an operation of selecting a refresh word line is performed. Therefore, also in a burst refresh in which refresh is executed successively, refresh can be performed over the time period of a predetermined number of clock cycles without stopping a search operation. In this case, as a circuit for generating refresh word line timing signal RXTref, a gate circuit receiving refresh enable signal REFen and clock signal CLK is utilized. Refresh enable signal REFen is maintained in an active state for a burst refresh period by using, for example, a counter which is activated in response to a refresh request, and count the clock signals when activated.

In the configuration of the word line selection control part shown in FIGS. 34 and 36, upon selecting a TCAM cell row, one word line may be driven to a selected state, or two word lines may be simultaneously selected.

In the configuration of controlling connection between a bit line and the sense amplifier by the bit line isolation instruction signal, the bit line isolation instruction signal can be generated by a gate circuit which receives a TCAM block designation signal designating a TCAM block and a bit line equalize instruction signal. TCAM block signal can be generated from the internal address signal.

Figure 38:
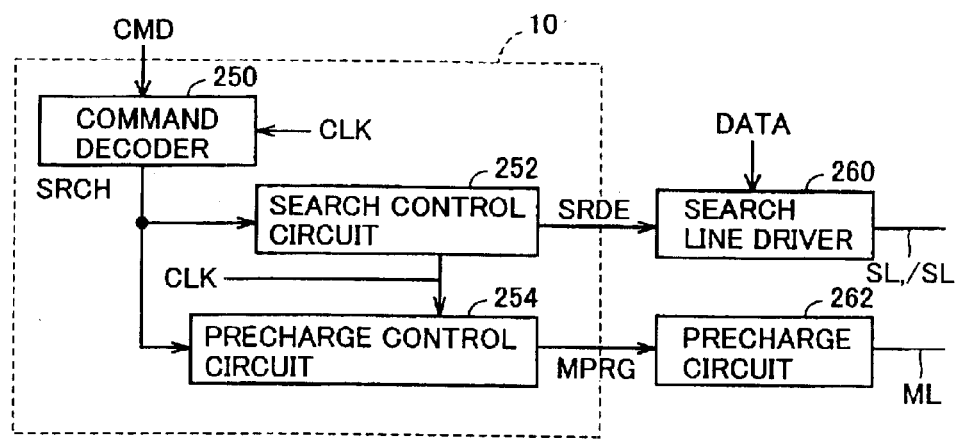
FIG. 38 is a diagram schematically showing the configuration of a part related to a search operation of the semiconductor memory device according to the sixth embodiment of the present invention.

FIG. 38 is a diagram schematically showing the configuration of a part related to the search operation of control circuit 10 shown in FIG. 6. In FIG. 38, for complementary search lines SL and /SL, a search line driver 260, when activated, driving search lines SL and /SL in accordance with search data DATA is provided. To match line ML, a precharge circuit 262 is provided for precharging match line ML to a predetermined voltage when precharge instruction signal MPRG is made active. Search line driver 260 is included in search line driver/write driver circuit 6 shown in FIG. 6 (further, refer to FIG. 14).

Control circuit 10 includes: a command decoder 250 taking in and decoding a command CMD synchronously with the rising of clock signal CLK; a search control circuit 252 for generating search driver enable signal SRDE synchronously with clock signal CLK when search instruction signal SRCH from command decoder 250 is activated; and a precharge control circuit 254 for driving precharge instruction signal MPRG to an inactive state synchronously with the rising of clock signal CLK when search instruction signal SRCH from command decoder 250 is made active.

Search control circuit 252 activates search driver enable signal SRDE in response to the rising of clock signal CLK when search instruction signal SRCH is activated, and inactivates search driver enable signal SRDE in response to the falling of clock signal CLK.

Precharge control circuit 254 inactivates precharge instruction signal MPRG in response to the rising of clock signal CLK when search instruction signal SRCH is active, and activates precharge instruction signal MPRG synchronously with the rising of clock signal CLK.

Figure 39:
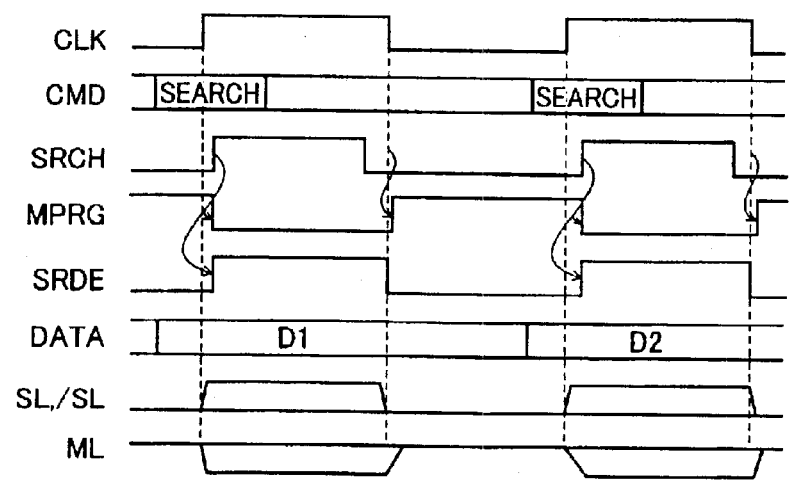
FIG. 39 is a timing chart representing an operation of the circuit shown in FIG. 38.
Figure 6:
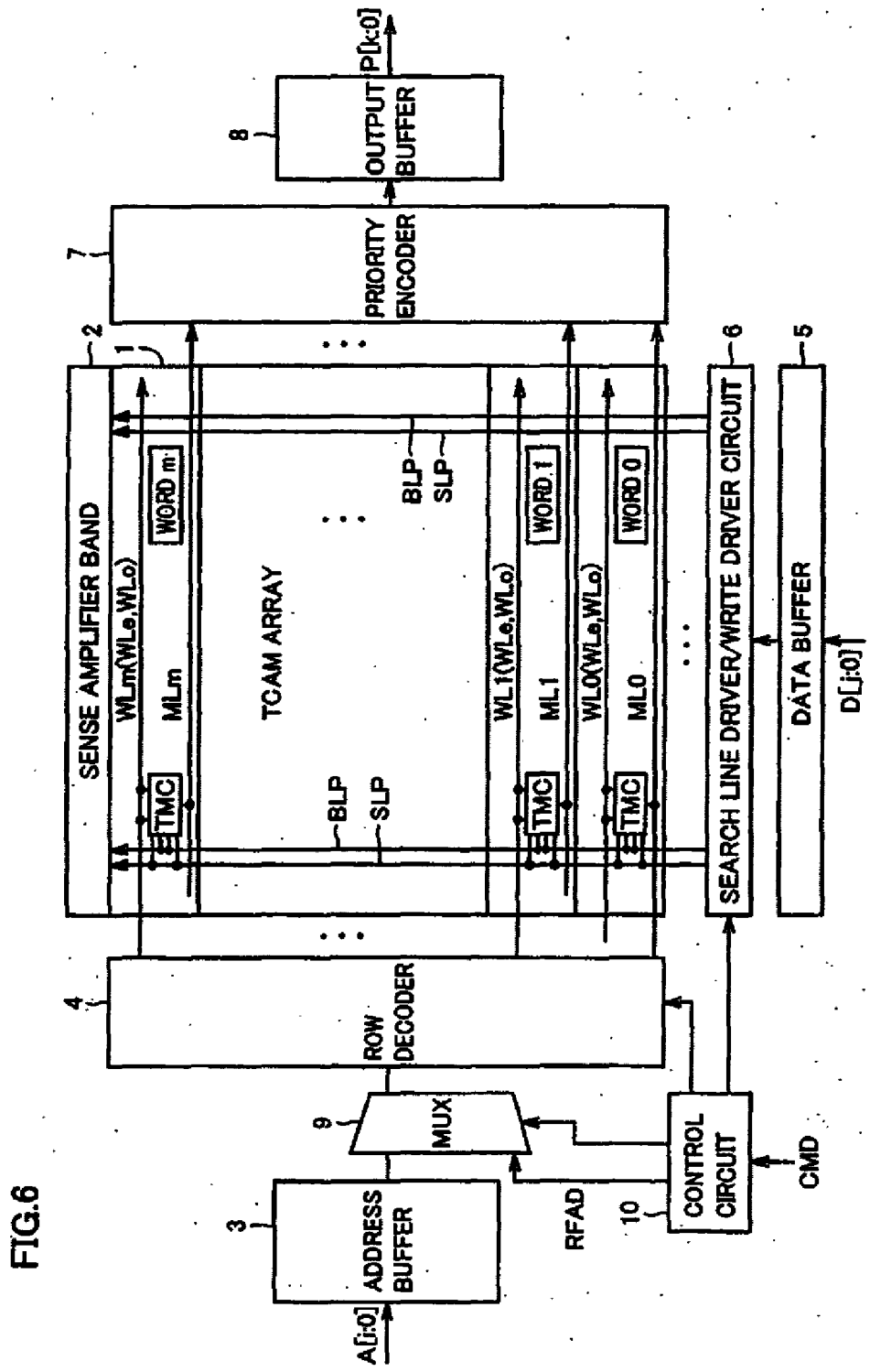

FIG. 39 is a timing chart representing an operation of the configuration shown in FIG. 39. With reference to FIG. 39, a search operation of the circuit shown in FIG. 38 will be briefly described below.

Synchronously with the rising edge of clock signal, command CMD is externally applied. When command CMD is a search command instructing a search operation, command decoder 250 maintains search instruction signal SRCH in the active state of the H level for a predetermined period in response to the rising of clock signal CLK. In response to activation of search instruction signal SRCH, precharge control circuit 254 inactivates precharge instruction signal MPRG and search control circuit 252 drives search driver enable signal SRDE to an active state.

In response to inactivation of precharge instruction signal MPRG, precharge circuit 262 completes a precharge operation of precharging match line ML to a predetermined voltage level. FIG. 39 shows, as an example, a case in which match line ML is precharged to the H level. On the other hand, search line driver 260 is enabled in accordance with activation of search driver enable signal SRDE and drives search lines SL and /SL in accordance with search data DATA. To search lines SL and /SL, complementary data are transmitted (refer to FIG. 14).

When clock signal CLK falls to the L level, search control circuit 252 drives search driver enable signal SRDE to an inactive state, search line driver 260 is made inactive, search lines SL and /SL are driven to the L level, and the search operation is completed. On the other hand, precharge control circuit 254 drives precharge instruction signal MPRG to an active state synchronously with the falling of clock signal CLK. Responsively, precharge circuit 262 drives match line ML to a predetermined precharge voltage level.

Therefore, by operating search control circuit 252 and precharge control circuit 254 synchronously with clock signal CLK, only in the period where clock signal CLK is at the H level, search driver enable signal SRDE is made active and precharge instruction signal MPRG can be maintained in an inactive state.

As the configuration of search control circuit 252 and precharge control circuit 250, for example, a configuration similar to that shown in FIG. 34 may be used. In the configuration, with refresh enable signal REFen used as a search enable signal, the refresh word line timing signal RXTref used as search driver enable signal SRDE and precharge instruction signal MPRG, and with gate circuit 173 replaced with an AND gate circuit, only in the period in which clock signal CLK is at the H level, search lines can be driven internally and a search result can be read to a match line.

According to the sixth embodiment of the present invention, when the refresh operation is executed, refresh is started in the second half clock cycle of a clock signal and the search operation is performed internally in the first half cycle of the clock signal. Thus, refresh can be performed internally without interrupting the search operation and search efficiency can be improved.

As to the configuration of performing the refresh operation in the sixth embodiment, the configuration of the TCAM cell and the array structure in any of the foregoing first to fifth embodiments may be appropriately combined and used.

As described above, according to the present invention, the TCAM cell data storing unit is constructed by using two twin cells each for storing complementary data with two dynamic cells. Thus, the chip area can be reduced as compared with a static TCAM cell constructed of SRAM cells, storage data can be reliably retained and the TCAM cell excellent in date retention characteristics can be implemented, as compared with a conventional dynamic TCAM.

By using a planar MIS capacitor as the memory cell capacitor, as compared with a conventional dynamic TCAM, the number of process steps and the number of masks can be reduced and write speed can be increased.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device for determining match between received search data with stored data, comprising:
   at least one memory cell circuit each for storing one bit of said stored data, said memory cell circuit including;
   a first twin cell including a first transistor, a first capacitive element for storing data received via said first transistor at a first storage node, a second transistor driven to a selected state concurrently with said first transistor, and a second capacitive element for storing data supplied via said second transistor at a second storage node, complementary data being stored at the first and second storage nodes,
   a second twin cell, provided separately from said first twin cell, including a third transistor, a third capacitive element for storing data supplied via said third transistor at a third storage node, a fourth transistor driven to a selected state concurrently with said third transistor, and a fourth capacitive element for storing data supplied via said fourth transistor at a fourth storage node, complementary data being stored at the third and fourth storage nodes, and
   a comparing circuit for comparing a pair of data stored in one of the first and second storage nodes and data stored in one of the third and fourth storage nodes with applied complementary search data, and selectively driving a match line in accordance with a result of comparison.

2. The semiconductor memory device according to claim 1, further comprising:
   a pair of bit lines disposed commonly to the first and second twin cells and transferring at least write data to the first and second twin cells;
   a first selection line disposed for said first twin cell, for transmitting a selection signal for driving the first and second transistors to a selected state;
   a second selection line disposed corresponding to said second twin cell and separately from said first selection line, for transmitting a selection signal for driving the third and fourth transistors to a selected state; and
   a pair of search data lines disposed commonly to the first and second twin cells, for transferring complementary data bits for said memory cell circuit.

3. The semiconductor memory device according to claim 1, further comprising:
   a first pair of bit lines disposed for said first twin cell, for transferring at least write data to said first twin cell;
   a second pair of bit lines disposed corresponding to said second twin cell, for transferring at least write data to said second twin cell; and
   a selection line disposed commonly to the first and second twin cells, for transmitting a selection signal commonly to the first to fourth transistors in the first and second twin cells.

4. The semiconductor memory device according to claim 1, wherein each of the first to fourth transistors is an insulated gate field effect transistor of a first conductive type, and
   each of the first to fourth capacitive elements is a planar type capacitive element constructed using an insulated gate field effect transistor of the first conductive type.

5. The semiconductor memory device according to claim 1, further comprising:
   a pair of bit lines disposed corresponding to said first twin cell and connected respectively to the first and second transistors;
   a word line disposed corresponding to said first twin cell, for driving the first and second transistors to a selected state; and
   a sense amplifier for amplifying a voltage difference of the pair of bit lines when activated.

6. The semiconductor memory device according to claim 1, wherein
   each of the first to fourth capacitive elements includes:
      a first impurity region of a first conductive type formed at a surface of a substrate region; and
      a first conductive line, disposed on the first impurity region facing said first impurity region through an insulation film, for transmitting a predetermined voltage,
   the first and second capacitive elements are disposed opposing the third and fourth capacitive elements with respect to a center portion,
   said comparing circuit includes:
      a second impurity region of the first conductive type disposed in said center portion;
      a first gate electrode disposed crossing said second impurity region and coupled to a first search data line of a search data line pair transferring said complementary search data;
      a second gate electrode disposed crossing said second impurity region and coupled to the first impurity region corresponding to said first storage node via a second conductive line disposed in a layer upper than said first conductive line;
      a third gate electrode disposed crossing said second impurity region and coupled to a second search data line of said search data line pair; and
      a fourth gate electrode disposed crossing said second impurity region and coupled to the first impurity region corresponding to said fourth storage node via a third conductive line disposed in a layer upper than said first conductive line, and
   said second impurity region is coupled to said match line in an area between a pair of the first and second gate electrodes and a pair of the third and fourth gate electrodes, and is coupled to a reference voltage node in each of an area outside the pair of the first and second gate electrodes and an area outside the pair of the third and fourth gate electrodes.

7. The semiconductor memory device according to claim 1, wherein
   each of the first to fourth transistors comprises a P-channel insulated gate field effect transistor.

8. The semiconductor memory device according to claim 1, further comprising:

a search control circuit for generating said complementary search data and transferring said complementary search data to said memory cell circuit synchronously with a first edge of a clock signal in response to a search instruction, said search control circuit resetting said complementary search data in response to a second edge of said clock signal;

a refresh request issuing circuit for issuing a refresh request instructing refreshing of data stored in said memory cell circuit;

a refresh control circuit for generating a control signal for reading data stored in said memory cell circuit synchronously with a second edge of said clock signal in response to the refresh request, said control signal being inactivated in response to said first edge of said clock signal; and at least one sense amplifier circuit disposed corresponding to said at least one memory cell circuit and activated in response to said control signal to amplify read data from said at least one memory cell circuit and to rewrite an amplified data to said at least one memory cell circuit.

9. The semiconductor memory device according to claim 8, wherein said at least one memory cell circuit comprises a plurality of memory cell circuits arranged in rows and columns, said semiconductor memory device further comprises a plurality of word lines, disposed corresponding to the rows of the memory cell circuits, each for reading data stored in a corresponding memory cell circuit when selected, and said control signal determines a period of time for which said word line is in a selected state.

10. The semiconductor memory device according to claim 8, wherein said at least one memory cell circuit comprises a plurality of memory cell circuits arranged in rows and columns, said semiconductor memory device further comprises:

a plurality of bit line pairs disposed corresponding to the columns of the memory cell circuits; and a plurality of bit line voltage maintaining circuits disposed in corresponding to the bit line pairs, and inactivated before reading of data stored in the memory cell circuits and activated in response to a first edge of said clock signal when the refresh request is issued, and maintaining corresponding bit line pairs at a predetermined voltage level when activated, and said at least one sense amplifier circuit comprises a plurality of sense amplifier circuits disposed, corresponding to the bit line pairs, activated in response to said control signal and inactivated in response to the first edge of said clock signal.

* * * * *

UNITED STATES PATENT AND TRADEMARK OFFICE
CERTIFICATE OF CORRECTION

PATENT NO.    : 6,807,077 B2
DATED         : October 19, 2004
INVENTOR(S)   : Hideyuki Noda et al.

It is certified that error appears in the above-identified patent and that said Letters Patent is hereby corrected as shown below:

Drawings,
Replace printed Fig. 6 with the attached Fig. 6

Signed and Sealed this

Twelfth Day of April, 2005

JON W. DUDAS
*Director of the United States Patent and Trademark Office*